United States Patent
Kon et al.

(10) Patent No.: US 9,758,630 B2
(45) Date of Patent: Sep. 12, 2017

(54) POLYMER SUBSTRATE WITH HARD COAT LAYER AND MANUFACTURING METHOD FOR SUCH POLYMER SUBSTRATE

(71) Applicants: TEIJIN LIMITED, Osaka (JP); TSUKISHIMA KIKAI CO., LTD., Tokyo (JP)

(72) Inventors: Tatsuichirou Kon, Osaka (JP); Tatsuya Ekinaka, Osaka (JP); Hiroshi Kishimoto, Osaka (JP); Yume Morita, Osaka (JP); Takehiro Suga, Osaka (JP); Satoshi Ogata, Tokyo (JP); Masato Nakagomi, Tokyo (JP)

(73) Assignees: TEIJIN LIMITED, Osaka (JP); TSUKISHIMA KIKAI CO., LTD., Tokyo (JP)

( * ) Notice: Subject to any disclaimer, the term of this patent is extended or adjusted under 35 U.S.C. 154(b) by 0 days.

(21) Appl. No.: 15/127,035

(22) PCT Filed: Mar. 27, 2015

(86) PCT No.: PCT/JP2015/059760
§ 371 (c)(1),
(2) Date: Sep. 19, 2016

(87) PCT Pub. No.: WO2015/147295
PCT Pub. Date: Oct. 1, 2015

(65) Prior Publication Data
US 2017/0107345 A1   Apr. 20, 2017

(30) Foreign Application Priority Data
Mar. 27, 2014   (JP) ................................ 2014-066915

(51) Int. Cl.
C08J 7/04      (2006.01)
C08J 7/12      (2006.01)
(Continued)

(52) U.S. Cl.
CPC ............ *C08J 7/045* (2013.01); *B05D 3/0254* (2013.01); *C08J 7/123* (2013.01);
(Continued)

(58) Field of Classification Search
None
See application file for complete search history.

(56) References Cited

U.S. PATENT DOCUMENTS 6,376,064 B1    4/2002  Gasworth et al.
2012/0263933 A1  10/2012  Higuchi et al.

FOREIGN PATENT DOCUMENTS

CN   103502333   1/2014
JP   2002-264271  9/2002
(Continued)

OTHER PUBLICATIONS

International Search Report issued Jun. 23, 2015 in International (PCT) Application No. PCT/JP2015/059760.

*Primary Examiner* — Tahseen N Khan
(74) *Attorney, Agent, or Firm* — Wenderoth, Lind & Ponack, L.L.P.

(57) ABSTRACT

The present invention realizes a polymer substrate with hard coating layer comprising a high level of environmental resistance and a high level of abrasion resistance.

A polymer substrate with hard coating layer is provided that comprises a polymer substrate (60) having a thickness of 1 mm to 20 mm and a hard coating layer (70,80) on the surface thereof. Here, in this polymer substrate with hard coating layer, the hard coating layer (70,80) is laminated on the surface of the polymer substrate, contains as a main component thereof a hydrolysis-condensation product of an organic silicon compound, has a thickness of 0.1 μm to 20 μm, makes direct contact with a cured underlayer on the opposite side of the polymer substrate, is formed from an organic silicon compound by PE-CVD, and satisfies all of
(Continued)

the following requirements (a) to (c): (a) film thickness of the silicon oxide layer is within the range of 3.5 μm to 9.0 μm, (b) maximum indentation depth of the surface of the silicon oxide layer as determined by measuring nanoindentation under conditions of a maximum load of 1 mN is 150 nm or less, and (c) the value of critical compression ratio K of the silicon oxide layer, as defined by formula (1) in a 3-point bending test of the polymer substrate with hard coating layer that imparts indentation displacement in which the surface laminated with the silicon oxide layer becomes concave, is 0.975 or less.

20 Claims, 7 Drawing Sheets

(51) Int. Cl.
  *B05D 3/02* (2006.01)
  *C23C 16/40* (2006.01)
  *C23C 16/50* (2006.01)
  *C23C 16/02* (2006.01)

(52) U.S. Cl.
  CPC ........ *C23C 16/0254* (2013.01); *C23C 16/401* (2013.01); *C23C 16/50* (2013.01); *C08J 2369/00* (2013.01); *C08J 2433/08* (2013.01); *C08J 2483/04* (2013.01)

(56) References Cited

FOREIGN PATENT DOCUMENTS

| | | |
|---|---|---|
| JP | 2004-237513 | 8/2004 |
| JP | 2010-253683 | 11/2010 |
| JP | 2012-224077 | 11/2012 |
| JP | 2012-232591 | 11/2012 |
| WO | 01/41541 | 6/2001 |
| WO | 2012/141708 | 10/2012 |

(a)

(b)

POLYMER SUBSTRATE WITH HARD COAT LAYER AND MANUFACTURING METHOD FOR SUCH POLYMER SUBSTRATE

TECHNICAL FIELD

The present invention relates to a polymer substrate having a hard coating layer and a method for producing that polymer substrate. More particularly, the present invention relates to a polymer substrate having a hard coating layer, which demonstrates superior abrasion resistance and can be used for a long period of time even in a harsh usage environment, and a Method for producing that polymer substrate. This polymer substrate having a hard coating layer can be used, for example, automobile window materials, construction members or surface protective plates of solar cells.

BACKGROUND ART

For example, since resin molding materials having high transparency such as polycarbonate resin or acrylic resin have superior light weight, impact resistance, processability, integration ability with surrounding components and design properties in comparison with inorganic glass, they are widely used in place of organic glass in various types of applications in order to take advantage of these merits.

However, since these resins are inferior to inorganic glass in terms of surface abrasion resistance and hardness, there are many cases in which they are used in the form of polymer substrates provided with a hard coating layer in which a polymer substrate is laminated with a hard coating layer for preventing damage to the polymer substrate.

In the case of polymer substrates having a hard coating layer used in automobile window materials in particular (typically referred to as resin glazing materials), a level of abrasion resistance comparable to that of inorganic glass is required to ensure mechanical strength required for use as a window material as well as visibility in terms of driving safety, while environmental performance is required so as to withstand outdoor exposure for long periods of time. With respect to environmental performance, it is necessary for these polymer substrates to demonstrate performance capable of passing various types of tests in anticipation of direct contact with moisture including inclement weather, use under both high humidity and dry conditions, use under both high temperature and low temperature conditions and exposure to high levels of ultraviolet rays. The previously proposed products can be said to be inadequate for use as resin glazing materials capable of stably realizing all of these required performance levels.

With respect to the abrasion resistance of inorganic glass and the like, when referring to standards such as the FMVSS205 safety standard applied in the U.S. or the ECE R43 safety standard applied in Europe, the required level of abrasion resistance with respect to windows used at sites requiring visibility during driving is defined as an increase in haze value ($\Delta H$) of less than 2% or 2% or less as determined with a Taber abrasion test carried out for 1000 revolutions as defined in ASTM D1044.

Although polymer substrates having a hard coating layer (see, for example, Patent Documents 1, 2 and 3), obtained by depositing an organic silicon-based oxide polymer on a resin substrate by plasma-enhanced chemical vapor deposition (PE-CVD) using an organic silicon compound (such as organosiloxane, organosilane or silazane) for the raw material, have been proposed for use as resin glazing materials for applications requiring both high abrasion resistance and outdoor weather resistance in this manner, typically in the case of providing a hard coating layer having high hardness formed by PE-CVD on an outermost surface, due to the generation of considerable interface stress between the high hardness hard coating layer and the underlayer on which that layer is laminated, it becomes difficult to ensure durability and reliability of the resulting hard coating layer. There are also many cases in which resistance to a boiling water test, which is an accelerated test relating to direct contact with moisture in the usage environment and long-term standing in high-humidity, high-temperature environment (to be referred to as boiling water resistance), as well as resistance to a high-temperature endurance test, which is an accelerated test relating to temperature change in an usage environment (to be referred to as heat resistance), are inadequate, frequently resulting in the observation of defective adhesion of the high hardness hard coating layer as well as other defects such as peeling phenomena or crack formation.

For example, the aforementioned Patent Document 1 proposes a plastic laminate obtained by sequentially laminating an acrylic resin heat-cured film, an organosiloxane-based resin heat-cured film, and PE-CVD film using an organic silicon compound as raw material on at least one side of a plastic substrate, wherein the PE-CVD film is composed of a gradient zone, in which the abundance ratio of oxygen atoms to silicon atoms (O/Si ratio) increases gradually from the interface with the heat-cured film of the aforementioned organosiloxane-based resin, and a subsequent flat zone, in which the aforementioned ratio is nearly constant, and Examples 1 and 2 therein disclose laminates that realize Taber abrasion resistance performance of 2.0% or less, which is an object of that invention, boiling water resistance as determined by a boiling water immersion test of 2 hours, and heat resistance of 1000 hours at 110° C.

Although these exemplified references were carried out by the present applicants, with respect to the method used to evaluate boiling water resistance, several problems were determined to occur during the course of examinations conducted by the present applicants after the exemplified patent documents were filed. Namely, although the duration of immersion in boiling water is indicated as being 2 hours, it was determined that making the duration of immersion in boiling water to be at least 3 hours and preferably 4 hours or more is preferable in terms of adequately ensuring long-term reliability such as water resistance or moisture resistance. In addition, with respect to the method used to evaluate an adhesion test after immersing in boiling water, it was determined that simply evaluating immediately after testing using the crosscut tape test is inadequate, and that it is necessary to evaluate and confirm results at least 7 days after carrying out the test. This is because it was determined that, since there are many cases in which internal stress (and frequently compressive force) generated during layer formation remains in the silicon oxide layer formed by PE-CVD, and due to the action thereof, there are cases observed in which layer separation occurs over time.

On the basis of these findings, it was decided to carry out evaluation of adhesion in the boiling water test of the present invention according to the procedure described below.

Namely, an adhesion test is carried out in accordance with a crosscut tape test in compliance with JIS K5400 after immersing a polymer substrate having a hard coating layer in boiling water at 100° C., removing the polymer substrate from the boiling water after retaining in the boiling water for 3 hours, removing any adhered moisture, and finally allowing to stand in a room temperature environment for 2 hours.

The crosscut tape test is carried out by forming 10×10 squares cut out at 1 mm intervals with a cutter knife in the form of a grid followed by affixing and adhering tape having a prescribed adhesive force (such as Nichiban Cellophane Tape™) and then peeling off the tape. The result for adhesion immediately after carrying out the crosscut tape test (state in which the layer is peeled or separated from the surface) was designated as the "initial result", while the result obtained after the passage of 7 days after carrying out the crosscut tape test was designated as the "elapsed result", and adhesive performance and the reliability thereof were judged to be favorable only in the case not only the "initial result", but also the "elapsed result" were favorable.

According to this evaluation method, when boiling water resistance of the laminate of the aforementioned Patent Document 1 was reevaluated, although the "initial result" was favorable (100/100), according to the "elapsed result", separation of the PE-CVD layer laminated according to the PE-CVD method occurred at sites where crosscuts were made. Namely, the result of evaluation in the case of Example 1 was 70/100 (layer separation occurred in 30 of the 100 squares), and the result of evaluation in the case of Example 2 was 0/100 (layer separation occurred in all 100 squares), with satisfactory results being unable to be obtained for both examples, thereby resulting in a need to improve performance.

In addition, in the aforementioned Patent Document 2, a laminate is proposed that has a plurality of coating layers comprising an outermost layer (I), obtained by plasma polymerization of an organic silicon compound, a lower layer (II), having a silicone coating composition containing a composite oxide fine particle dispersion, a silicone resin, a curing catalyst and a solvent, and a lower layer (III) consisting of an arbitrary acrylic resin, on an organic resin substrate, and in Examples 2, 4, 5 and 7, laminates are disclosed that have Taber abrasion resistance performance of 2.0% or less, which is an object of that invention. In addition, a correlation between individual properties of each layer that composes the laminates and performance is also disclosed.

However, in these examples, the haze values of the laminates are high at 2.7% to 3.0%, thereby resulting in the problem of images transmitted through the laminates being unclear, and since this makes their use in applications requiring visibility difficult, an object of present applicants in the form of a polymer substrate having a hard coating layer is not realized. Moreover, in these examples, although results for water resistance performance (using test conditions consisting of 3 days at 65° C.) and an accelerated weather resistance test are disclosed, there is no disclosure of boiling water resistance performance or heat resistance performance, and thus the object of the present applications in the form of a polymer substrate having a hard coating layer and a high level of weather resistance performance cannot be said to be realized.

In addition, in the aforementioned Patent Document 3, a multilayer product is proposed that is composed of a base material, a first layer obtained with a partial condensate of organosiloxane, and a second layer containing plasma-polymerized organic silicon and deposited at a power level of $10^6$ J/Kg to $10^6$ J/Kg in the presence of excess oxygen, results are disclosed in Example 2 indicating favorable appearance after an outdoor exposure test conducted for 1 year in Florida, U.S.A. (absence of microcracks) and favorable adhesion, and results indicating favorable appearance after an accelerated xenon weather resistance test at a cumulative radiation level of 6875 KJ/m² (absence of microcracks) and favorable adhesion are disclosed in Examples 4 and 5.

However, in these examples, although the results of an accelerated weather resistance test are disclosed, there is no disclosure of boiling water resistance performance or heat resistance performance, and an object of the present applicants in the form of a polymer substrate having a hard coating layer and a high level of weather resistance performance cannot be said to be realized.

PRIOR ART DOCUMENTS

Patent Documents

Patent Document 1: Japanese Unexamined Patent Publication No. 2010-253683
Patent Document 2: Japanese Unexamined Patent Publication No. 2012-224077
Patent Document 3: Japanese Unexamined Patent Publication No. 2012-232591

SUMMARY OF THE INVENTION

Problems to be Solved by the Invention

On the basis of these circumstances, the present invention relates to a polymer substrate with hard coating layer obtained by laminating a high hardness hard coating layer by plasma-enhanced chemical vapor deposition (PE-CVD) on a surface layer, and an object thereof is to obtain a composition capable of realizing the three characteristics consisting of a high level of abrasion resistance comparable to that of inorganic glass, superior boiling water resistance as a typical property of environmental resistance (including an "elapsed result" for adhesion), and superior heat resistance.

Means for Solving the Problems

As a result of conducting extensive studies, the inventors of the present invention found that the aforementioned problems can be solved by satisfying the requirements that film thickness of a silicon oxide film obtained by PE-CVD, nanoindentation depth and critical compression ratio be within prescribed ranges in a polymer substrate having a hard coating layer, thereby leading to completion of the present invention.

In order to satisfy the aforementioned requirements, in addition to the film thickness of a silicon oxide film obtained by PE-CVD, mechanical properties and chemical properties being within prescribed ranges, it is also necessary to increase as much as possible adhesive strength between the silicon oxide layer obtained by PE-CVD and a cured underlayer serving as the foundation thereof, and this is realized according to the means described below.

(1) The cured underlayer is a layer composed of inorganic oxide fine particles having a primary particle diameter of 1 nm to 200 nm and a hydrolysis-condensation product of a silicon compound, and the cured underlayer is formed after having adjusted the rate of progression (degree of aging) of the hydrolytic condensation reaction of a precursor material composition thereof to be within a proper range.

(2) Plasma bombardment treatment is performed prior to forming the silicon oxide layer by PE-CVD so that surface properties of the cured underlayer are within a prescribed range.

(3) The silicon oxide layer is formed by PE-CVD in the vicinity of the interface with the cured underlayer (initial growth process) within the range of a low deposition rate.

These three means make it possible to greatly improve interlayer adhesive strength between the silicon oxide layer obtained by PE-CVD and the cured underlayer as well as realize the objects of the invention of the present application in the form of abrasion resistance, environmental resistance (boiling water resistance (elapsed adhesion)) and heat resistance.

Namely, the present invention is as described below with respect to solving the aforementioned problems.

(1) A polymer substrate with hard coating layer comprising a polymer substrate having a thickness of 1 mm to 20 mm and a hard coating layer on the surface thereof; wherein, the hard coating layer comprises:

a cured underlayer laminated on the surface of the polymer substrate, containing as a main component thereof a hydrolysis-condensation product of an organic silicon compound, and having a thickness of 0.1 µm to 20 µm, and a silicon oxide layer that makes direct contact with the cured underlayer on the opposite side from the polymer substrate, is formed by PE-CVD using an organic silicon compound as raw material, and satisfies all of the following requirements (a) to (c):

(a) film thickness of the silicon oxide layer is within the range of 3.5 µm to 9.0 µm, (b) maximum indentation depth of the surface of the silicon oxide layer, as determined by measuring nanoindentation under conditions of a maximum load of 1 mN, is 150 nm or less, and (c) the value of critical compression ratio K of the silicon oxide layer, as defined by formula (1) in a 3-point bending test of the polymer substrate with hard coating layer that imparts indentation displacement in which the surface laminated with the silicon oxide layer becomes concave, is 0.975 or less:

$$K=(R-D/2)/R-(0.00215 \times d)$$

$$R=((G/2)^2-(\delta L)^2)/(2 \times \delta L) \quad \text{Formula (1)}$$

(wherein,

D represents the total thickness (mm) of the polymer substrate with hard coating layer, d represents the film thickness (µm) of the silicon oxide layer, G represents the distance (mm) between two end fulcrum points in a 3-point bending tester, δL represents indentation displacement (mm), measured when the silicon oxide layer begins to separate from a cut line (separation starting line) drawn in advance at the location of the central fulcrum point where a weight is applied in a 3-point bending test, and R represents the bend radius (mm) of the polymer substrate with hard coating layer, measured when the silicon oxide layer begins to separate from a cut line (separation starting line) drawn in advance at the location of the central fulcrum point where a weight is applied in a 3-point bending test).

(2) The polymer substrate with hard coating layer described in (1) above, wherein the ratio of infrared absorbance of the silicon oxide layer at a wave number of 930 cm$^{-1}$ to that at a wave number of 1020 cm$^{-1}$ ($\alpha_{930}/\alpha_{1020}$) is 0.30 or less.

(3) The polymer substrate with hard coating layer described in (1) or (2) above, wherein the ratio of infrared absorbance of the silicon oxide layer at a wave number of 1280 cm$^{-1}$ to that at a wave number of 1020 cm$^{-1}$ ($\alpha_{1280}/\alpha_{1020}$) is within the range of 0.002 to 0.020.

(4) The polymer substrate with hard coating layer described in any of (1) to (3) above, wherein indentation hardness of the surface of the silicon oxide layer as determined by measuring nanoindentation under conditions of a maximum load of 1 mN is 3 GPa or more.

(5) The polymer substrate with hard coating layer described in any of (1) to (4) above, wherein surface roughness (Ra) of the silicon oxide layer when measured using the dynamic force mode (DFM) of a scanning probe microscope under conditions of observing by 5.0 µm square is 5.0 nm or less.

(6) The polymer substrate with hard coating layer described in any of (1) to (5) above, wherein an adhesive layer containing an acrylic resin composition as a main component thereof and having a film thickness of 0.1 µm to 20 µm is interposed between the polymer substrate and the cured underlayer.

(7) A method for producing the polymer substrate with hard coating layer described in any of (1) to (6) above, comprising: forming the cured underlayer by coating a precursor material composition, in which the degree of aging (Ag) as represented by the following formula has a value within the range of 0.80 to 0.85, on the polymer substrate followed by drying and heat curing:

$$Ag=\{([X]+2\times[Y]+3\times[Z])/[S]\}/3$$

(wherein, with respect to the chemical shifts of silicon atoms of a hydrolysis-condensation product of the organic silicon compound, which is measured when a silicon atom of tetramethylsilane is assigned a value of 0 ppm after measuring the silicon nuclear magnetic resonance spectrum ($^{29}$Si-NMR) using heavy water for the solvent under conditions consisting of an observation frequency of 79 MHz, observation pulse of 6.0 µs, repetition time of 30 seconds and broadening factor of 5 Hz, the integration value of all peaks within the range of −45.0 ppm to −70.0 ppm is defined as [S], and, within that peak integration value, the peak integration value within the range of −45.0 ppm to −52.5 ppm is defined as [X], the peak integration value within the range of −52.5 ppm to −61.0 ppm is defined as [Y], and the peak integration value within the range of −61.0 ppm to −70.0 ppm is defined as [Z].

(8) A method for producing the polymer substrate with hard coating layer described in any of (1) to (6) above, comprising: adjusting the surface of the cured underlayer so that the ratio of infrared absorbance at a wave number 1065 cm$^{-1}$ to that at a wave number of 1020 cm$^{-1}$ ($\alpha_{1065}/\alpha_{1020}$) is within the range of 0.75 to 0.87, prior to laminating the silicon oxide layer by PE-CVD.

(9) A method for producing the polymer substrate with hard coating layer described in any of (1) to (6) above, comprising: adjusting the surface of the cured underlayer so that surface roughness (Ra) in the case of having measured with the dynamic force mode (DFM) of a scanning probe microscope under conditions of observing by 5 µm square is within the range of 0.7 nm to 10.0 nm, prior to laminating the silicon oxide layer by PE-CVD.

(10) The method for producing a polymer substrate with hard coating layer described in (8) or (9) above, wherein adjustment of the surface of the cured underlayer is carried out by plasma excitation or by colliding ionized inert gas with the surface of the cured underlayer.

(11) A method for producing the polymer substrate with hard coating layer described in any of (1) to (6) above, wherein the silicon oxide layer is formed at an average deposition rate (nm/sec) between the start of deposition and 30 seconds thereafter of deposition of 1 nm/sec or less.

Effects of the Invention

According to the present invention, since a polymer substrate with hard coating layer can be obtained that is provided with a high level of abrasion resistance comparable to that of inorganic glass and the like, the ability to withstand harsh environmental conditions corresponding to outdoor use (boiling water resistance (elapsed adhesion)) and heat resistance, it can be used in a wide range of applications as a high-performance resin glazing material for use in automobile window glass and the like.

DETAILED DESCRIPTION OF THE INVENTION

Although the polymer substrate with hard coating layer according to the present invention has for an essential requirement thereof the presence of a hard coating layer in which a cured underlayer and silicon oxide layer obtained by PE-CVD are laminated in that order on a polymer substrate, other layers can be laminated as necessary.

Figure 4:
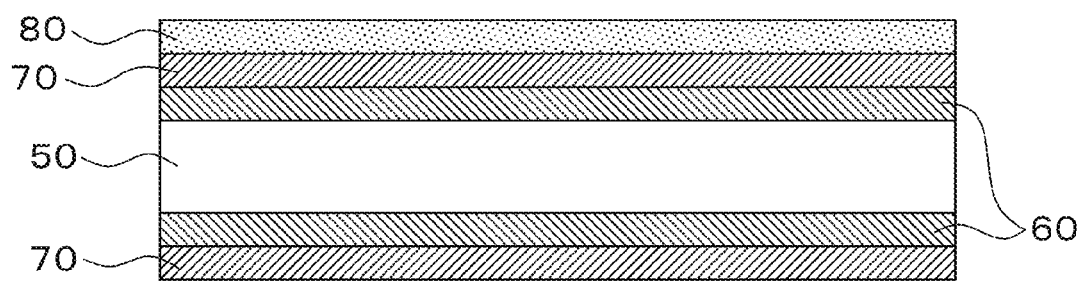
FIG. 4 is a cross-sectional schematic diagram of a polymer substrate with hard coating layer applied in one embodiment of the present invention.
Figure 5:
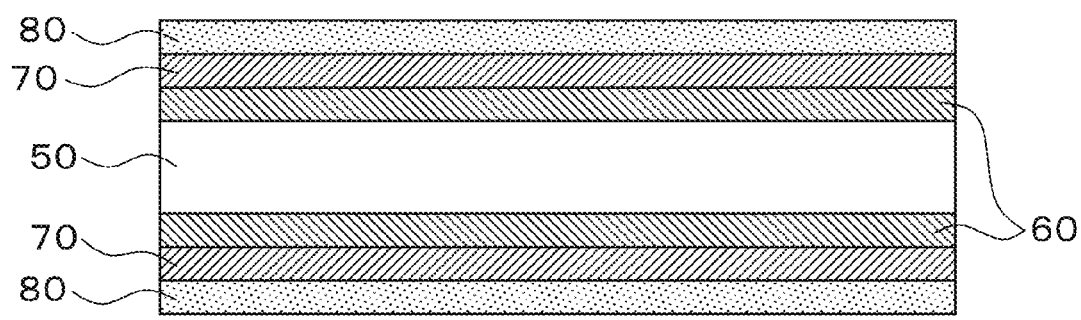
FIG. 5 is a cross-sectional schematic diagram of a polymer substrate with hard coating layer applied in another embodiment of the present invention.

In practical terms, a configuration is frequently used comprising interposing an adhesive layer between the polymer substrate and the cured underlayer. One example thereof is a polymer substrate with hard coating layer having a configuration in which an adhesive layer 60 and a cured underlayer 70 are laminated in that order on both sides of a polymer substrate 50, and a silicon oxide layer 80 obtained by PE-CVD is laminated in that order as shown in the cross-sectional schematic diagram of FIG. 4. In addition, another example thereof is a polymer substrate with hard coating layer having a configuration in which an adhesive layer 60, a cured underlayer 70 and a silicon oxide layer 80 obtained by PE-CVD are laminated in that order on both sides of a polymer substrate 50 as shown in the cross-sectional schematic diagram of FIG. 5. Furthermore, the laminar configuration of the polymer substrate with hard coating layer according to the present invention is not limited to these examples.

Furthermore, in the present invention, although it is an essential requirement that the cured underlayer 70 and the silicon oxide layer 80 obtained by PE-CVD be laminated in that order on at least one side of the polymer substrate 50, the adhesive layer 60 and laminated layers on the other side are not necessarily required, and a preferable configuration is selected corresponding to the application and need. For example, the lamination and formation of a layer other than the adhesive layer 60, the cured underlayer 70 and the silicon oxide layer 80 obtained by PE-CVD (such as an ultraviolet-curable resin layer) on the other side can also be selected.

The following provides a sequential detailed explanation of each component that composes the polymer substrate with hard coating layer according to the present invention and methods for adjusting each component.

<Polymer Substrate 50>

Examples of materials of the polymer substrate 50 include polycarbonate resin, acrylic resin such as polymethyl methacrylate, polyester resin such as polyethylene terephthalate, polybutylene terephthalate or poly(ethylene-2,6-naphthalate), polystyrene resin, polypropylene resin, polyarylate resin, polyethersulfone resin, ABS resin and polylactic acid resin. These resins can be used alone or two or more types can be used as a mixture. Among these, polycarbonate resin having superior transparency, heat resistance and impact resistance is particularly preferable in the case of considering use in automobile window applications.

Furthermore, with respect to resin heat resistance, the heat distortion temperature (HDT) is preferably 100° C. or higher, more preferably 120° C. or higher and even more preferably 130° C. or higher.

One example of a polycarbonate resin is a polycarbonate resin obtained by reacting a divalent phenol and a carbonate precursor by an interfacial polycondensation method or a fusion method. Typical examples of divalent phenols include 2,2-bis(4-hydroxyphenyl)propane (commonly referred to as bisphenol A), 2,2-bis(3-methyl-4-hydroxyphenyl)propane, 2,2-bis(3,5-dimethyl-4-hydroxyphenyl)propane, 1,1-bis(4-hydroxyphenyl)ethane, 1,1-bis(4-hydroxyphenyl)cyclohexane, 2,2-bis(4-hydroxyphenyl)butane, 2,2-bis(4-hydroxyphenyl)-3-methylbutane, 9,9-bis{(4-hydroxy-3-methyl)phenyl}fluorene, 2,2-bis(4-hydroxyphenyl)-3,3-dimethylbutane, 2,2-bis(4-hydroxyphenyl)-4-methylpentane, d1,1-bis(4-hydroxyphenyl)-3,3,5-trimethylcyclohexane and α,α-bis(4-hydroxyphenyl)-m-diisopropylbenzene, bis(4-hydroxyphenyl)sulfide and bis(4-hydroxyphenyl)sulfone, and among these, bisphenol A is preferable. These divalent phenols can be used alone or two or more types can be used as a mixture.

In addition, a carbonyl halide, carbonate ester or haloformate and the like is used for the carbonate precursor, and specific examples thereof include phosgene, diphenyl carbonate and dihaloformates of divalent phenols.

In the production of a polycarbonate resin by reacting a divalent phenol and carbonate precursor by an interfacial polycondensation method or fusion method, a catalyst, chain-end terminator or antioxidant of a divalent phenol may be used as necessary. In addition, the polycarbonate resin may be a branched polycarbonate resin obtained by copolymerizing a polyfunctional aromatic compound having three or more functional groups, or may be a mixture obtained by mixing two or more types of the resulting polycarbonate resins.

The molecular weight of the polycarbonate resin in terms of the viscosity-average molecular weight (M) is preferably 10,000 to 50,000 and more preferably 15,000 to 35,000. A polycarbonate resin having this viscosity-average molecular weight allows the obtaining of adequate strength and demonstrates favorable melt fluidity during molding, thereby making this preferable.

Viscosity-average molecular weight as referred to in the present invention is determined by substituting specific viscosity ($\eta_{sp}$), which is determined from a solution obtained by dissolving 0.7 g of polycarbonate resin in 100 ml of methylene chloride at 20° C., into the formula indicated below.

$\eta_{sp}/c=[\eta]+0.45\times[\eta]^2 c$ (where, [$\eta$] represents limiting viscosity)

$[\eta]=1.23\times10^{-4} M^{0.83}$ $c=0.7$

In addition, other preferable examples of polycarbonate resins include polycarbonate resin obtained by copolymerization of isosorbide and an aliphatic diol, and various types of copolymerized polycarbonates such as polycarbonate-polyorganosiloxane copolymers.

The polycarbonate resin can be used after adding and mixing therein a stabilizer such as a phosphite ester or phosphonate ester, a flame retardant such as tetrabromobisphenol A, a low molecular weight polycarbonate of tetrabromobisphenol A or decabromodiphenol, an organic ultraviolet absorber such as a benzotriazole, benzophenone, triazine or salicylate, an inorganic ultraviolet absorber such as titanium oxide, cerium oxide or zinc oxide, an ultraviolet shielding agent such as a cyanine-based compound, squarylium-based compound, thiol-nickel complex salt-based compound, phthalocyanine-based compound, triallylmethane-based compound, naphthoquinone-based compound, anthraquinone-based compound, carbon black, antimony oxide, tin oxide doped with indium oxide or lanthanum boride, a colorant or a lubricant as necessary.

Furthermore, the thickness of the polymer substrate is preferably within the range of 1 mm to 20 mm. If the thickness is less than 1 mm, it becomes difficult to retain mechanical strength required by an automobile window and the like, flexural deformation of the substrate increases accompanying lamination of the silicon oxide layer by PE-CVD, and there are many cases in which problems with dimensional stability and appearance occur, thereby making this undesirable. On the other hand, if the thickness exceeds 20 mm, it becomes difficult to retain surface smoothness necessary for a window material and obtain a molded substrate having a low level of optical distortion (such as perspective distortion) while also increasing the substrate weight, thereby making this undesirable.

The thickness of the polymer substrate is more preferably 2 mm to 10 mm and even more preferably 3 mm to 7 mm.

<Adhesive Layer 60>

An adhesive layer that fulfills the role of enhancing the adhesive strength of the polymer substrate and cured underlayer is preferably provided as necessary by interposing between the polymer substrate and the cured underlayer having as a main component thereof a hydrolysis-condensation product of an organic silicon compound.

Examples of methods used to form the adhesive layer include a method consisting of wet-coating onto the polymer substrate, a lamination method, insert molding, two-color molding, melt lamination and melt pressing.

Although various types of resins or resin compositions are used for the adhesive layer, it is particularly preferably a layer containing an acrylic resin composition as a main component thereof. Here, one type of a mixture of a plurality of types of acrylic resins among those represented by the following general formula (A), (A-1), (A-2), (A-3) or (A-4) and/or an acrylic copolymer resin containing 70 mol % or more of a plurality of repeating units of acrylic resins represented by (A-1), (A-2), (A-3) or (A-4) (to be collectively referred to as Component A) are used preferably. Moreover, a copolymer resin composed of 1 mol % to 98 mol % of unit (A-1), 1 mol % to 85 mol % of unit (A-2), 1 mol % to 15 mol % of unit (A-3) and 0 mol % to 15 mol % of unit (A-4) is preferably used for the acrylic copolymer resin, and other unit structures can also be introduced into the copolymer as necessary.

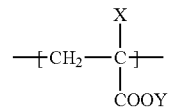
(A)

In the above formula, X represents a hydrogen atom or methyl group, the percentage of hydrogen atoms in X is 30 mol % or less, Y represents a methyl group, ethyl group, cycloalkyl group, hydroxyalkyl group having 2 to 5 carbon atoms or group containing an ultraviolet ray-absorbing moiety, the total percentage of methyl groups and ethyl groups in Y is within the range of 1 mol % to 98 mol %, the percentage of cycloalkyl groups is within the range of 0 mol % to 85 mol %, and the percentage of groups containing an ultraviolet ray-absorbing moiety is within the range of 0 mol % to 15 mol %.

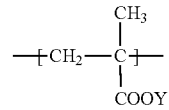
(A-1)

In the above formula, $Y^1$ represents a methyl group or ethyl group, there are no particular restrictions on the percentages of methyl groups and ethyl groups, and can be used at a molar ratio of 0:100 to 100:0.

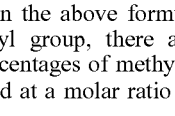
(A-2)

In the above formula, X1 represents a hydrogen atom or methyl group, $Y^2$ represents a cycloalkyl group, and the number of carbon atoms of the cycloalkyl group is preferably 5 to 12.

Unit (A-2) can be introduced by copolymerizing a monomer exemplified below. Examples of monomers include cyclohexyl acrylate, 4-methylcyclohexyl acrylate, 2,4-dimethylcyclohexyl acrylate, 2,4,6-trimethylcyclohexyl acrylate, 4-t-butylcyclohexyl acrylate, adamantyl acrylate, dicyclopentadienyl acrylate, cyclohexyl methacrylate, 4-methylcyclohexyl methacrylate, 2,4-dimethylcyclohexyl methacrylate, 2,4,6-trimethylcyclohexyl methacrylate, 4-t-butylcyclohexyl methacrylate, adamantyl methacrylate, dicyclopentadienyl methacrylate, cyclohexylmethyl methacrylate, 4-methylcyclohexylmethyl methacrylate, 2,4-dimethylcyclohexylmethyl methacrylate, 2,4,6-trimethylcyclohexylmethyl methacrylate and 4-t-butylcyclohexylmethyl methacrylate, and cyclohexyl methacrylate is used particularly preferably.

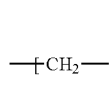

(A-3)

In the above formula, $X^2$ represents a hydrogen atom or methyl group, $Y^3$ represents an alkylene group having 2 to 5 carbon atoms, and examples of alkylene groups include an ethylene group, trimethylene group and tetramethylene group.

Unit (A-3) can be introduced by copolymerizing a monomer exemplified below. Examples of monomers include 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 4-hydroxybutyl acrylate, 4-hydroxybutyl methacrylate, 3-hydroxybutyl acrylate, 3-hydroxybutyl methacrylate, 2-hydroxybutyl acrylate and 2-hydroxybutyl methacrylate, and among these, 2-hydroxyethyl methacrylate is used preferably.

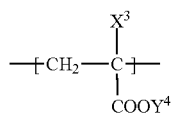

(A-4)

In the above formula, $X^3$ represents a hydrogen atom or methyl group, and $Y^4$ represents an ultraviolet absorber residue and preferably a triazine-based ultraviolet absorber residue. Unit (A-4) can be introduced by copolymerizing an acrylate or methacrylate monomer having an ultraviolet absorber residue. More specifically, a repeating unit derived from an acrylate monomer represented by the following formula (A-4-a) or formula (A-4-b) is preferably used as an acrylate or methacrylate monomer having an ultraviolet absorber residue.

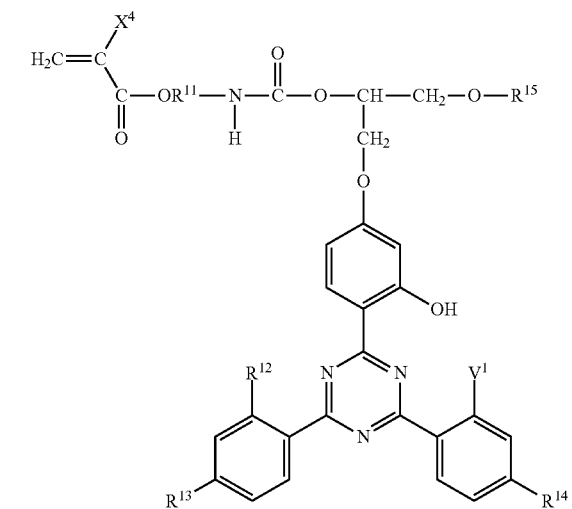

(A-4-a)

In the above formula, $R^{11}$ represents an alkylene group having 2 to 6 carbon atoms, $R^{12}$ represents a hydrogen atom, alkyl group having 1 to 18 carbon atoms or alkoxy group having 1 to 18 carbon atoms, $R^{13}$ and $R^{14}$ may be the same or mutually and independently represent a hydrogen atom, halogen atom, alkyl group having 1 to 18 carbon atoms, alkoxy group having 1 to 18 carbon atoms or phenyl group optionally substituted with an alkyl group having 1 to 18 carbon atoms or a halogen atom, $R^{15}$ represents an alkyl group having 1 to 18 carbon atoms, $X^4$ represents a hydrogen atom or methyl group, and $V^1$ represents a hydrogen atom, OH group or alkyl group having 1 to 12 carbon atoms.

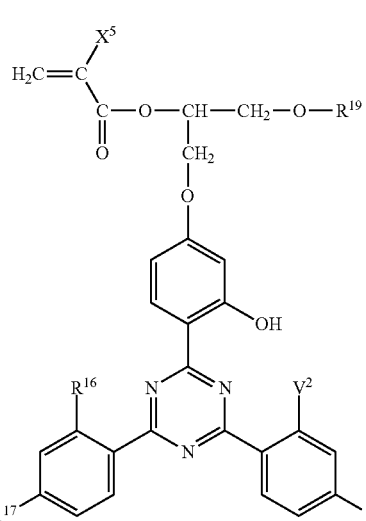

(A-4-b)

In the above formula, $R^{16}$ represents a hydrogen atom, alkyl group having 1 to 18 carbon atoms or alkoxy group having 1 to 18 carbon atoms, $R^{17}$ and $R^{18}$ are the same or mutually and independently represent a hydrogen atom, alkyl group having 1 to 18 carbon atoms, alkoxy group having 1 to 18 carbon atoms, or phenyl group optionally substituted with an alkyl group having 1 to 18 carbon atoms or a halogen atom, $R^{19}$ represents an alkyl group having 1 to 18 carbon atoms, $X^5$ represents a hydrogen atom or methyl group, and $V^2$ represents a hydrogen atom, OH group or alkyl group having 1 to 12 carbon atoms.

An ultraviolet absorber residue refers to a residue of an ultraviolet absorber that has ultraviolet absorption performance. For example, since a triazine-based ultraviolet absorber residue is missing a portion of the end of a triazine compound and is bound to an acrylic copolymer, strictly speaking, there is a difference in molecular weight between the residue and the triazine compound. However, since the amount that is missing is extremely small in comparison with the total, the weight of the residue and the weight of the triazine compound are considered to be equal for the sake of convenience in the present invention.

In the case of using as a copolymer, a repeating unit represented by the following formula (A-5) is preferably contained. Containing unit (A-5) makes it possible to improve weather resistance by imparting radical scavenging ability.

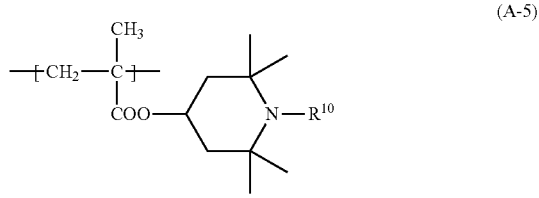

(A-5)

In the above formula, $R^{10}$ represents a hydrogen atom or alkyl or alkoxy group having 1 to 14 carbon atoms.

$R^{10}$ preferably represents an alkyl group or alkoxy group having 1 to 8 carbon atoms. Specific examples thereof include a methyl group, ethyl group, propyl group, butyl group, methoxy group, ethoxy group, propoxy group and butoxy group.

The percentage at which unit (A-5) is contained is preferably 1 mol % to 15 mol %, more preferably 0.1 mol % to 10 mol % and even more preferably 1 mol % to 8 mol % based on a value of 100 mol % for all repeating units of the acrylic copolymer.

(Other Repeating Units)

In the case of using a copolymer, other repeating units may also be contained for the purpose of improving adhesion, weather resistance and heat resistance or imparting functionality and the like. The amount of the other repeating unit is 30 mol % or less, preferably 20 mol % or less and particularly preferably 10 mol % or less based on a value of 100 mol % for all repeating units of the acrylic copolymer.

Other repeating units can be introduced by copolymerizing a vinyl monomer capable of copolymerizing with an acrylate or methacrylate monomer. Examples of other vinyl monomers include acrylic acid, methacrylic acid, methacrylamide, methyl acrylate, ethyl acrylate, propyl acrylate, propyl methacrylate, butyl acrylate, butyl methacrylate, 2-ethylhexyl acrylate, 2-ethylhexyl methacrylate, dodecyl acrylate, dodecyl methacrylate, 2-(2'-hydroxy-5'-acryloxyethylphenyl)benzotriazole, 2-(2'-hydroxy-5'-acryloxyethoxyphenyl)benzotriazole, 2-(2'-hydroxy-5'-acryloxypropylphenyl)benzotriazole, 2-(2'-hydroxy-5'-acryloxypropoxyphenyl)benzotriazole, 2-(2'-hydroxy-5'-acryloxyethylhenyl)-5-chlorobenzotriazole, 2-(2'-hydroxy-3'-acryloxyethyl-5'-t-butylphenyl)benzotriazole,2-(2'-hydroxy-3'-acryloxyethyl-5'-b-butylphenyl)-5-chlorobenzotriazole, 2-hydroxy-4-(acryloxyethoxy)benzophenone, 2-hydroxy-4-(acryloxypropoxy) benzophenone, 2,2'-dihydroxy-4-(acryloxyethoxy)benzophenone, 2-hydroxy-4-(acryloyloxyethyl)benzophenone, 2-(2'-hydroxy-5'-methacryloxyethylphenyl)benzotriazole, 2-(2'-hydroxy-5'-methacryloxyethoxyphenyl)benzotriazole, 2-(2'-hydroxy-5'-methacryloxypropylphenyl)benzotriazole, 2-(2'-hydroxy-5'-methacryloxypropoxyphenyl)benzotriazole, 2-(2'-hydroxy-5'-methacryloxyethylphenyl)-5-chlorobenzotriazole, 2-(2'-hydroxy-3'-methacryloxyethyl-5'-t-butylphenyl)benzotriazole, 2-(2'-hydroxy-3'-methacryloxyethyl-5'-t-butylphenyl)-5-chlorobenzotriazole, 2-hydroxy-4-(methacryloxyethoxy)benzophenone, 2-hydroxy-4-(methacryloxypropoxy)benzophenone, 2,2'-dihydroxy-4-(methacryloxyethoxy)benzophenone and 2-hydroxy-4-(methacryloyloxyethyl)benzophenone.

In addition, an acrylic resin having an organic silicon compound (such as various types of alkoxysilanes and partial hydrolysates thereof) within its structure (such as within a side chain) can also be used (examples of which include acryloxypropyl trimethoxysilane or methacryloxypropyl trimethoxysilane). These can be used alone or two or more types can be used as a mixture.

Furthermore, the molecular weight of acrylic resin having the aforementioned examples of structures and components, or copolymer resin thereof, in terms of weight average molecular weight is preferably within the range of 20,000 to 10,000,000, more preferably 50,000 to 10,000,000, even more preferably 50,000 to 1,000,000 and most preferably 50,000 to 500,000.

In addition, the acrylic resin composition preferably contains a crosslinking agent (to be referred to as Component B) as necessary. A crosslinking agent has the effect of enhancing thermal stability (heat resistance) and water/moisture stability (water resistance, moisture resistance) by enhancing the crosslink density of the adhesive layer.

A blocked polyisocyanate compound (to be referred to as a blocked isocyanate) is preferably used for the crosslinking agent. Blocked isocyanates have hardly any free isocyanate groups as a result of allowing a blocking agent to react with the isocyanate groups, thereby eliminating their reactivity, and by separating the blocking agent by heating, the isocyanate groups can be restored resulting in a compound that has reactivity. Specific examples of blocked isocyanate compounds include those obtained by adding a blocking agent represented by an oxime such as acetoxime or methyl ethyl ketoxime, an active methylene compound such as dimethyl malonate, diethyl malonate, methyl acetoacetate, ethyl acetoacetate or acetylacetone, an alcohol such as methanol, ethanol, 2-propanol, n-butanol, sec-butanol or 2-ethyl-1-hexanol, or a phenol such as phenol, cresol or ethyl phenol to an isocyanate group of a polyisocyanate compound.

Examples of blocked isocyanates include polyisocyanate, adducts of polyisocyanate and polyvalent alcohol, cyclic polymers of polyisocyanates and isocyanate biuret forms. Examples of polyisocyanates include tolylene diisocyanate, 4,4-diphenylmethane diisocyanate, 1,5-naphthalene diisocyanate, triphenylmethane triisocyanate, tolidine diisocyanate, xylene diisocyanate, lysine diisocyanate, trimethylhexamethylene diisocyanate, dimer acid diisocyanate, hexamethylene diisocyanate, dicyclohexylmethane diisocyanate and isophorone diisocyanate.

Since blocked polyisocyanates only form isocyanate groups after undergoing a heat curing reaction, the coating composition has superior storage stability, and since few of the isocyanate groups are consumed by side reactions with moisture in the coating composition or air or by alcohol-based solvents used in solvent coating compositions, they are resistant to the effects of the coating environment and allow the formation of a cured coated film having stable properties. These blocked isocyanates can be used alone or two or types can be used as a mixture.

Among these blocked isocyanates, blocked aliphatic and/or alicyclic polyisocyanate compounds have particularly superior weather resistance, thereby making them preferable. Preferable examples of blocked aliphatic and/or alicyclic polyisocyanate compounds include (i) adduct-type polyisocyanate compounds, in which an adduct-type polyisocyanate compound is blocked with a blocking agent, obtained by reacting a hydroxyl compound having 2 to 4 hydroxyl groups with an aliphatic and/or alicyclic diisocyanate compound, and (ii) isocyanurate-type polyisocyanate compounds derived from aliphatic and/or alicyclic diisocyanate compounds, in which an isocyanurate-type polyisocyanate compound has been blocked with a blocking agent. Among these, the number of carbons of the aliphatic diisocyanate compound and/or alicyclic diisocyanate compound is preferably 4 to 20 and more preferably 4 to 15. Making the number of carbon atoms of the isocyanate compound to be within this range results in the formation of a coated film having superior durability.

The converted isocyanate group ratio is the value representing the percentage of the weight of formed isocyanate groups to the total weight of Component (B) in the case of having heated the blocked isocyanate and separated the blocking agent.

The blocked isocyanate has a converted isocyanate group ratio of 5.5% by weight to 50% by weight, preferably 6.0% by weight to 40% by weight and most preferably 6.5% by weight to 30% by weight. If the isocyanate group ratio is less than 5.5% by weight, the incorporated amount of blocked polyisocyanate compound becomes large relative to the acrylic resin, thereby resulting in a lack of adhesion with the base material. In addition, if the isocyanate group ratio exceeds 50% by weight, layer flexibility decreases resulting in increased incidences of crack formation or decreased environmental resistance, thereby making this undesirable. The isocyanate group ratio (wt %) is determined by a method consisting of reducing the isocyanate groups to urea with a known amount of amine followed by titrating the excess amine with acid.

The blocked isocyanate content is preferably 0.8 equivalents to 1.5 equivalents of isocyanate groups to 1 equivalent of hydroxyl groups present in Component (A), and as a result of the hydroxyl groups and isocyanate groups forming crosslinks with urethane bonds, mechanical strength, heat resistance, moisture resistance and solvent resistance of the adhesive layer are improved.

Since crosslinking becomes inadequate if the amount of isocyanate groups is less than 0.8 equivalents, durability in a high-temperature environment becomes inadequate, and since unreacted hydroxyl groups demonstrate high affinity for water molecules, moisture is absorbed resulting in poor water resistance and moisture resistance. If the amount of isocyanate groups exceeds 1.5 equivalents, the crosslink density of the adhesive layer becomes extremely high accompanying allophanate bonding, the layer becomes hard and brittle, layer adhesion decreases and there is increased susceptibility to cracking and other defects, thereby making this undesirable.

Furthermore, the amount of isocyanate groups based on 1 equivalent of hydroxyl groups is more preferably 0.8 equivalents to 1.3 equivalents and most preferably 0.9 equivalents to 1.2 equivalents.

In addition, a curing catalyst (to be referred to as Component C) is preferably used in combination in order to promote dissociation of blocking agent present in the blocked isocyanate, or promote an urethanation reaction between isocyanate groups formed as a result of dissociation and hydroxyl groups present in Component (A).

The curing catalyst is preferably at least one type of compound selected from the group consisting of organic tin compounds, organic titanium compounds, organic zirconium compounds, tertiary amine compounds and quaternary ammonium salt compounds.

Among these curing catalysts, organic tin compounds are used preferably, and organic tin compounds represented by the following formula (C) are used particularly preferably.

$$R^{20}{}_m Sn(OCOR^{21})_{4-m} \qquad (C)$$

Here, $R^{20}$ represents a hydrocarbon group having 1 to 8 carbon atoms, preferably an alkyl group having 1 to 8 carbon atoms and more preferably an alkyl group having 4 to 8 carbon atoms. $R^{21}$ represents a substituted or unsubstituted hydrocarbon group having 1 to 17 carbon atoms and preferably a substituted or unsubstituted alkyl group having 1 to 17 carbon atoms. An alkyl group having 1 to 4 carbon atoms is preferable as a substituent. m represents an integer of 0 to 3.

Typical examples of these curing catalysts include organic tin compounds such as monobutyltin tris(2-ethylhexanoate), dimethyltin dineodecanoate, dibutyltin bis(2-ethylhexanoate), monobutyltin tris(n-butylpropionate), dibutyltin dilaurate, monohexyltin trioctanoate, dihexyltin dioctanoate, trihexyltin monooctanoate, monohexyltin tris(methylmaleate), dioctyltin diacetate, trioctyltin monoacetate, dioctyltin bis(methylmaleate), monooctyltin tris(methylpropionate), dioctyltin dipropionate, trioctyltin monopropionate, monooctyltin trioctanoate, dioctyltin dioctanoate or trioctyltin monooctanoate. These are used alone or two or more types are used as a mixture.

Typical examples of organic titanium compounds include alkoxy titanium compounds such as tetraisopropyl titanate, tetrabutoxytitanate or tetraoctyltitanate, and titanium chelate compounds such as titanium acetyl acetonate-based compounds or titanium ethyl acetoacetate-based compounds. These are used alone or two or more types are used as a mixture.

Typical examples of organic zirconium compounds include alkoxy zirconium compounds such as tetraisopropoxyzirconium, tetrabutoxyzirconium or tetraoctoxyzirconium, and zirconium chelate compounds such as zirconium tetraacetyl acetonate, zirconium tetraethyl acetoacetonate or zirconium tributoxyacetyl acetonate. These are used alone or two or more types are used as a mixture.

Typical examples of tertiary amine compounds include dimethylethanolamine, triethylenediamine, methyl hydroxyethylpiperazine and dimethyl aminoethoxyethanolamine. These are used alone or two or more types are used as a mixture.

Typical examples of quaternary ammonium salt compounds include 2-hydroxyethyl-tri-n-butylammonium-2,2-dimethylpropionate, 2-hydroxyethyl-tri-n-butylammonium-2,2-dimethylbutanoate, 2-hydroxypropyl-tri-n-butylammonium-2,2-dimethylpropionate and 2-hydroxypropyl-tri-n-butylammonium-2,2-dimethylbutanoate. These are used alone or two or more types are used as a mixture.

The content of Component (C) is 0.001 parts by weight to 0.4 parts by weight and preferably 0.002 parts by weight to 0.3 parts by weight based on a value of 100 parts by weight for the total amount of Component (A) and Component (B). If the content of Component (C) is less than 0.001 parts by weight, an action that promotes the crosslinking reaction is not obtained, while if the content of Component (C) exceeds 0.4 parts by weight, decreases in stability of the system are observed caused by reaction acceleration over time, thereby making this undesirable.

In addition, an ultraviolet absorber (to be referred to as Component D) may be mixed into the acrylic resin composition as necessary. Addition of an ultraviolet absorber blocks the entrance of external solar ultraviolet light into the polymer substrate in conjunction with copolymerization and introduction into Component A, and is carried out for the purpose of inhibiting ultraviolet degradation of the polymer substrate.

Although various types or organic and inorganic ultraviolet absorbers can be used for the ultraviolet absorber, among these, triazine-based ultraviolet absorbers represented by the following formula (D) are used particularly preferably. Furthermore, in terms of enhancing dispersibility of ultraviolet absorber into the layer, there are many cases in which it is preferable that the acrylic resin and/or acrylic copolymer of Component (A) have a cycloalkyl group.

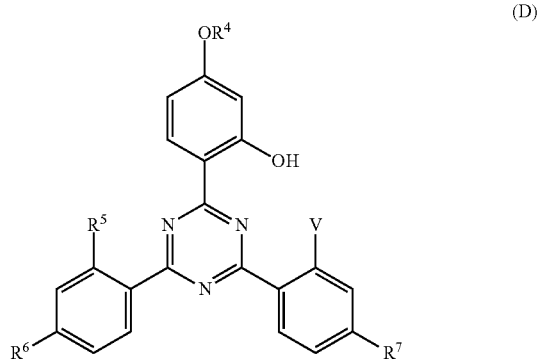

(D)

In the above formula, $R^4$ represents an alkyl group having 1 to 18 carbon atoms, preferably 3 to 16 carbon atoms and more preferably 4 to 8 carbon atoms, a substituent represented by —$CH_2CH(OH)CH_2O$—$R^8$ or a substituent represented by —$CH(CH_3)C(O)O$—$R^9$. $R^8$ represents an alkyl group having 1 to 18 carbon atoms, preferably 3 to 16 carbon atoms and more preferably 6 to 14 carbon atoms. $R^9$ represents an alkyl group having 1 to 18 carbon atoms, preferably 3 to 16 carbon atoms and more preferably 6 to 10 carbon atoms. Examples of alkyl groups of $R^4$, $R^8$ and $R^9$ include an ethyl group, propyl group, butyl group, pentyl group and hexyl group.

$R^5$ represents a hydrogen atom, alkyl group having 1 to 18 carbon atoms or alkoxy group having 1 to 18 carbon atoms. The number of carbon atoms of the alkyl group is preferably 1 to 8 and more preferably 1 to 4. Examples of alkyl groups include a methyl group, ethyl group, propyl group, butyl group, pentyl group and hexyl group. The number of carbon atoms of the alkoxy group is preferably 1 to 8 and more preferably 1 to 4. Examples of alkoxy groups include a methoxy group, ethoxy group, propoxy group and butoxy group.

$R^6$ and $R^7$ respectively and independently represent a hydrogen atom, alkyl group having 1 to 18 carbon atoms, alkoxy group having 1 to 18 carbon atoms, or phenyl group optionally substituted with an alkyl group having 1 to 18 carbon atoms or a halogen atom.

The number of carbon atoms of the alkyl group is preferably 1 to 8 and more preferably 1 to 4. Examples of alkyl groups include a methyl group, ethyl group, propyl group, butyl group, pentyl group and hexyl group. The number of carbon atoms of the alkoxy group is preferably 1 to 8 and more preferably 1 to 4. Examples of alkoxy groups include an ethoxy group, propoxy group and butoxy group. The number of carbon atoms of an alkyl group substituted in a phenyl group is preferably 3 to 16 and more preferably 4 to 8. Examples of these alkyl groups include an ethyl group, propyl group, butyl group, pentyl group and hexyl group. Examples of halogen atoms include a fluorine atom, chlorine atom and bromine atom.

V represents a hydrogen atom or alkyl group having 1 to 12 carbon atoms. The number of carbon atoms of the alkyl group is preferably 1 to 8 and more preferably 1 to 4. Examples of alkyl groups include an ethyl group, propyl group, butyl group, pentyl group and hexyl group.

Specific examples of triazine-based ultraviolet absorbers represented by formula (D) include the following ultraviolet absorbers manufactured by Ciba Specialty Chemicals Inc.

(1) Tinuvin 1577 ($R^4$ represents a hexyl group and $R^5$, $R^6$, $R^7$ and V represent hydrogen atoms)

(2) Tinuvin 400 ($R^4$ represents —$CH_2CH(OH)CH_2O$—$R^8$ (wherein, $R^8$ represents a dodecyl group and tridecyl group), and $R^5$, $R^6$, $R^7$ and V represent hydrogen atoms)

(3) Tinuvin 405 ($R^4$ represents —$CH_2CH(OH)CH_2O$—$R^8$ (wherein, $R^8$ represents an octyl group), and $R^5$, $R^6$, $R^7$ and V represent methyl groups)

(4) Tinuvin 460 ($R^4$ represents a butyl group, $R^5$, $R^6$ and $R^7$ represent butyloxy groups and V represents an OH group)

(5) Tinuvin 479 ($R^4$ represents —$CH(CH_3)C(O)O$—$R^9$ (wherein, $R^9$ represents an octyl group), $R^5$ represents a hydrogen atom, $R^6$ and $R^7$ represent phenyl groups, and V represents a hydrogen atom)

In the case of using an inorganic ultraviolet absorber either in combination with these organic ultraviolet absorbers or alone, specific examples of typical inorganic ultraviolet absorbers include fine particles of titanium oxide, zinc oxide, zirconium oxide or cerium oxide. These inorganic ultraviolet absorbers may contain a second component composed of another metal element or the chemical composite ratio of oxygen may be adjusted in order to adjust the wavelength region of ultraviolet absorption. In addition, an inorganic ultraviolet absorber coated with a surface treatment layer having the function of enhancing dispersibility or inhibiting a photocatalytic function on the surface of the fine particles is used preferably.

These inorganic ultraviolet absorbers can be used alone or two or more types can be used as a mixture. Preferably, by using a mixture of two or more types of inorganic ultraviolet absorbers having different maximal absorption wavelengths, ultraviolet rays can be absorbed over a wider ultraviolet wavelength range, and by allowing ultraviolet rays of a wavelength region of weak absorption of one ultraviolet absorber to be absorbed by another ultraviolet absorber, durability of the ultraviolet absorber per se to ultraviolet rays can be improved, thereby making this desirable.

Furthermore, with respect to the preferable amount of ultraviolet absorber or ultraviolet-absorbing component mixed into the adhesive layer, the total content of triazine-based ultraviolet absorber residue in the aforementioned unit (A-4) and the ultraviolet absorber of Component (D) based on 100 parts by weight of the adhesive layer is preferably within the range of 1% by weight to 40% by weight, more preferably 2% by weight to 30% by weight and even more preferably 3% by weight to 20% by weight.

However, in the case of using the polymer substrate with hard coating layer of the present invention in an application in which it is mainly used outdoors such as in a window, ultraviolet transmittance of the adhesive layer over the entire ultraviolet wavelength range of 300 nm to 360 nm is preferably less than 1% from the viewpoint of ensuring long-term durability of the polymer substrate. Ultraviolet transmittance is more preferably less than 0.05% and even more preferably less than 0.01%.

Here, in the case of adjusting ultraviolet transmittance, the product (vol %·μm) of multiplying the volume percentage of the amount of ultraviolet absorber mixed into the adhesive layer (vol %) by the thickness of the adhesive layer (μm) can be used as an indicator thereof, and although the preferable range varies according to the target application, it is at least 20 (vol %·μm) or more, more preferably 40 (vol %·μm) or more, even more preferably 70 (vol %·μm) or more and most preferably 100 (vol %·μm) or more.

Furthermore, in the case of forming the adhesive layer by wet coating, the film thickness of the adhesive layer is preferably 1 μm to 20 μm, more preferably 2 μm to 15 μm and even more preferably 3 μm to 12 μm. If the film thickness is less than 1 μm, there are cases in which the effect of enhancing adhesion with the cured underlayer is unstable, thereby making this undesirable. In addition, if the film thickness exceeds 20 μm, problems occur such as it becoming difficult to obtain an appearance of the coated film having high smoothness, thereby making this undesirable in many cases. Furthermore, as was previously described, there are many cases in which the preferable range of the film thickness of the adhesive layer varies somewhat when forming the adhesive layer by another method.

In addition, the ultraviolet absorption wavelength is preferably adjusted using a combination of ultraviolet absorbers having different absorption ranges, and is preferably adjusted by adjusting the mixed amounts of the triazine-based ultraviolet absorber residue in the aforementioned unit (A-4), the ultraviolet absorber of Component (D) and other ultraviolet absorbers (organic ultraviolet absorbers and inorganic ultraviolet absorbers).

In addition, a silane coupling agent and/or hydrolysis-condensation product of a silane coupling agent can be contained as another component in the acrylic resin composition as necessary. As a result of containing the silane coupling agent and/or hydrolysis-condensation product of a silane coupling agent, adhesion is improved between the polymer substrate and the adhesive layer and/or between the adhesive layer and the cured underlayer, thereby making it possible to sustain the adhesion thereof over a long period of time.

Examples of the silane coupling agent include 3-aminopropyltrimethoxysilane, 3-aminopropyltriethoxysilane, γ-(2-aminoethyl)aminopropyltrimethoxysilane, γ-(2-aminoethyl)aminopropyltriethoxysilane, γ-(2-aminoethyl)aminopropylmethyldimethoxysilane, γ-(2-aminoethyl)aminopropylmethyldiethoxysilane, γ-methacryloxypropyltrimethoxysilane, N-β-(N-vinylbenzylaminoethyl)-γ-aminopropyltrimethoxysilane hydrochloride, N-β-(N-vinylbenzylaminoethyl)-γ-aminopropyltriethoxysilane hydrochloride, γ-glycidoxypropyltrimethoxysilane, γ-glycidoxypropyltriethoxysilane, γ-mercaptopropyltrimethoxysilane, γ-mercaptopropyltriethoxysilane, vinyltriacetoxysilane, γ-anilinopropyltrimethoxysilane, γ-anilinopropyltriethoxysilane, vinyltrimethoxysilane, vinyltriethoxysilane, octadecyldimethyl[3-(trimethoxysilyl)propyl]ammonium chloride, octadecyldimethyl[3-(triethoxysilyl)propyl]ammonium chloride, γ-ureidopropyltrimethoxysilane, γ-ureidopropyltriethoxysilane, 3-isocyanatopropyltrimethoxysilane and 3-isocyanatopropyltriethoxysilane. The silane coupling agent and/or hydrolysis-condensation product of the silane coupling agent may be used alone or two or more types may be used in combination.

The content thereof is preferably 0.1 parts by weight to 10 parts by weight and more preferably 0.2 parts by weight to 8 parts by weight based on a total of 100 parts by weight of Component (A) and Component (B).

In addition, other components such as a photostabilizer (such as HALS, graphene, graphene oxide or single-wall carbon nanotubes) or inorganic fine particles (such as silicon oxide, aluminum oxide, talc or calcium carbonate) may be suitably mixed into the acrylic resin composition as necessary.

In addition, a known leveling agent can be incorporated for the purpose of improving coatability or smoothness of the resulting layer, and examples of these leveling agents include silicone compounds SH200-100cs, SH28PA, SH29PA, SH30PA, ST83PA, ST80PA, ST97PA, ST86PA or SH21PA manufactured by Toray-Dow Corning Silicone Co., Ltd., silicone compounds KP321, KP322, KP323, KP324, KP326, KP340 or KP341 manufactured by Shin-Etsu Chemical Co., Ltd., and fluorine-based surfactants F-179, F-812A or F-815 manufactured by DIC Corp. These leveling agents may be used alone or two or more types may be used in combination, and are preferably used at 0.0001 parts by weight to 2.0 parts by weight and more preferably 0.0005 parts by weight to 1.0 part by weight based on a value of 100 parts by weight for the total solid content.

In addition to the aforementioned Components (A) to (D) and other components, the acrylic resin composition preferably contains a solvent in consideration of forming the adhesive layer by wet coating.

Examples of solvents include ketones such as acetone, methyl ethyl ketone, methyl isobutyl ketone or cyclohexanone, ethers such as tetrahydrofuran, 1,4-dioxane or 1,2-dimethoxyethane, esters such as ethyl acetate or ethyl ethoxyacetate, alcohols such as methanol, ethanol, 1-propanol, 2-propanol, 1-butanol, 2-butanol, 2-methyl-1-propanol, 2-methyl-2-propanol, 2-ethoxyethanol, 1-methoxy-2-propanol or 2-butoxyethanol, hydrocarbons such as n-hexane, n-heptane, isooctane, benzene, toluene, xylene, gasoline, light oil or kerosene, acetonitrile, nitromethane and water, and these may be used alone or two or more types may be used as a mixture.

Furthermore, in order to enhance coatability, the solid content concentration as determined by solvent dilution is preferably adjusted to 1% by weight to 50% by weight and more preferably to 3% by weight to 30% by weight.

The method used to coat the coating material onto the base material can be suitably selected corresponding to the shape of the base material to be coated, and examples thereof include bar coating, dip coating, flow coating, spray coating, spin coating and roller coating. The base material coated with the acrylic resin composition is normally heat-cured by drying and removing the solvent at a temperature ranging from normal temperature to the heat distortion temperature of the base material.

Carrying out heat curing at a high temperature within a range that does not cause problems with heat resistance of the base material is preferable since it allows curing to be completed quickly. Furthermore, at normal temperatures, heat curing does not proceed completely, thereby preventing the obtaining of a coating layer having sufficient crosslink density required by the adhesive layer. During the course of this heat curing, crosslinking groups in the heat-curable acrylic resin composition react resulting in an increase in crosslink density of the coating layer and yielding a coating layer having superior adhesion, boiling water resistance and durability in high-temperature environments.

The heat curing temperature is preferably 80° C. to 160° C., more preferably 100° C. to 140° C. and even more preferably 110° C. to 130° C. Heat curing time is preferably 10 minutes to 3 hours and more preferably 20 minutes to 2 hours. Heating causes crosslinking groups to crosslink, thereby allowing the obtaining of a laminate in which an acrylic resin layer is laminated as an adhesive. If heat curing time is 10 minutes or less, the crosslinking reaction does not proceed adequately, resulting in a first layer that lacks durability in a high-temperature environment and weather resistance. In addition, it is sufficient for heat curing time to be within 3 hours in terms of performance of the acrylic resin composition.

Adhesion between the cured underlayer and/or base material becomes favorable as a result of forming an adhesive layer by heat-curing the acrylic resin composition, thereby making it possible to obtain a laminate having superior abrasion resistance and weather resistance.

Furthermore, although the preceding explanation has described the formation of an adhesive layer by wet coating, the adhesive layer can also be formed by another method such as by laminating an adhesive layer resin on the polymer substrate, insert molding, two-color molding, melt lamination or melt pressing. The aforementioned Component A, an acrylic resin having enhanced heat resistance by further copolymerizing various types of components with Component A, or a wide range of other resins can be used for the resin of the adhesive layer. Furthermore, in the case of forming the adhesive layer according to these methods, the preferable range of thickness of the adhesive layer varies somewhat from the case of the aforementioned wet coating, and thickness is preferably generally adjusted to a range of 10 μm to 200 μm.

<Cured Underlayer 70>

The cured underlayer 70 is preferably a layer obtained by crosslinking and curing a precursor compound (to be referred to as the precursor compound) having as a main component thereof a hydrolysis-condensation product of an organic silicon compound (to be referred to as Component E).

The precursor compound contains inorganic oxide fine particles in the form of silica particles having a primary particle diameter of 1 nm to 200 nm (to be referred to as Component F), and contains metal oxide fine particles (to be referred to as Component G) or other components as necessary.

The hydrolysis-condensation product of an organic silicon compound of Component E, which is a main component of the cured underlayer, is preferably obtained by hydrolytically condensing all or a portion of the organic silicon compound represented by the following formula (E) by a sol-gel reaction at a reaction progression rate within a suitable range.

$$R^1_m R^2_n Si(OR^3)_{4-m-n} \quad (E)$$

In the above formula, $R^1$ and $R^2$ respectively and independently represent an alkyl group having 1 to 4 carbon atoms, a vinyl group or an alkyl group having 1 to 3 carbon atoms substituted with one or more groups selected from the group consisting of a methacryloxy group, amino group, glycidoxy group and 3,4-epoxycyclohexyl group, and $R^1$ and $R^2$ respectively and independently preferably represent an alkyl group having 1 to 4 carbon atoms and particularly preferably a methyl group.

$R^3$ represents an alkyl group having 1 to 4 carbon atoms or a vinyl group. $R^3$ preferably represents an alkyl group having 1 to 3 carbon atoms and particularly preferably a methyl group or ethyl group. m and n respectively and independently represent an integer of 0, 1 or 2 and m+n represents an integer of 0, 1 or 2. and n each preferably represent 0 or 1 and m+n is preferably 1.

Examples of organic silicon compounds include alkoxysilanes such as tetramethoxysilane, tetraethoxysilane, tetra-n-propoxysilane, tetraisopropoxysilane, tetra-n-butoxysilane, tetraisobutoxysilane, methyltrimethoxysilane, methyltriethoxysilane, ethyltrimethoxysilane, isobutyltrimethoxysilane, vinyltrimethoxysilane, vinyltriethoxysilane, γ-methacryloxypropyltrimethoxysilane, β-(3,4-epoxycyclohexyl)ethyltrimethoxysilane, γ-glycidoxypropyltrimethoxysilane, γ-aminopropyltrimethoxysilane, γ-aminopropyltriethoxysilane, N-β-(aminoethyl)-γ-aminopropyltrimethoxysilane, N-β-(aminoethyl)-γ-aminopropyltriethoxysilane, dimethyldimethoxysilane, dimethyldiethoxysilane, vinylmethyldimethoxysilane, 3-methacryloxypropylmethyldimethoxysilane, 3-glycidoxypropylmethyldimethoxysilane and 3-aminopropylmethyldiethoxysilane, and among these, alkyltrialkoxysilanes are preferable from the viewpoint of being able to control reactivity.

In addition, organic silicon compounds in which the location of the alkoxy group in the aforementioned alkoxysilanes is substituted with a chloro group, Br group or fluorine group can also be used as necessary.

Although these organic silicon compounds can be used alone or as a mixture corresponding to the application and purpose of use, in terms of forming a cured underlayer having superior mechanical strength and coated film appearance, 50% by weight to 90% by weight of the organic silicon compound is preferably methyltrialkoxysilane and/or methyltriethoxysilane. Furthermore, a bifunctional alkoxysilane can also be mixed in and used as necessary in order to impart flexibility to the cured film corresponding to the application.

Although water is required to be present during hydrolytic condensation of the organic silicon compound, there are many cases in which water is normally added to the organic silicon compound at 1 equivalent to 10 equivalents and preferably 1.5 equivalents to 7 equivalents based on 1 equivalent of the organic silicon compound. Furthermore, as will be subsequently described, in the case of using Component (F) in the form of a water-dispersible colloidal silica liquid dispersion, water is further added as necessary since water is supplied from this liquid dispersion.

The hydrolytic condensation reaction is required to be carried out under acidic conditions, and acidity is preferably controlled to a suitable range by using pH value as an indicator. The pH of the precursor composition of the cured underlayer is preferably adjusted to 3.0 to 6.5 and more preferably to 4.5 to 6.0. As a result of adjusting pH to be within these ranges, the progression of gelling of the precursor composition at normal temperatures can be inhibited, thereby increasing storage stability.

pH can be controlled (to acidic conditions) by adjusting the amount of acid added and the amount of curing catalyst contained to be subsequently described.

An acid preliminarily added to the colloidal silica dispersion of Component (F) to be subsequently described can be used for the acid. In addition, the acid is preferably added at certain times as the hydrolytic condensation reaction progresses from the viewpoint of controlling the reaction.

Examples of these acids include inorganic acids such as hydrochloric acid, sulfuric acid, nitric acid, phosphoric acid, nitrous acid, perchloric acid or sulfamic acid, and organic acids such as formic acid, acetic acid, propionic acid, butyric acid, oxalic acid, succinic acid, maleic acid, malonic acid, lactic acid or para-toluenesulfonic acid, and an organic acid such as formic acid, acetic acid, propionic acid, butyric acid, oxalic acid, succinic acid, malonic acid or maleic acid is preferable from the viewpoint of ease of controlling pH.

Here, in the case of using an inorganic acid, the inorganic acid is preferably used in the form of having been dissolved in water at a concentration of preferably 0.0001 N to 2 N and more preferably 0.001 N to 0.1 N. The amount of water used to dissolve the inorganic acid that is mixed in is in accordance with the aforementioned preferable range.

In addition, in the case of using an organic acid, the organic acid is preferably used within a range of preferably 0.1 parts by weight to 50 parts by weight and more preferably 1 part by weight to 30 parts by weight based on 100 parts by weight of the organic silicon compound.

Although conditions of the hydrolytic condensation reaction cannot be unconditionally defined since they vary according to the type of organic silicon compound used, the type and amount of the colloidal silica of Component F to be subsequently described present in the system and other added components, normally the temperature of the reaction system is 20° C. to 70° C. and the reaction time is 1 hour to several days. According to these methods, there is no formation of precipitate and a cured underlayer can be obtained that demonstrates superior mechanical strength and coated film appearance.

However, in the present invention, there are cases in which it is necessary to control the reaction progression rate of hydrolytic condensation of the organic silicon compound in the precursor composition of the cured underlayer from the viewpoint of improving interfacial adhesive strength between the cured underlayer and the silicon oxide layer obtained by PE-CVD. For example, if the progression of the hydrolytic condensation reaction is inadequate in comparison with a suitable range, the cure shrinkage rate of the cured underlayer becomes excessively large, and there are many cases in which defects such as the formation of cracks occur in the cured layer. Conversely, in the case the hydrolytic condensation reaction proceeds excessively in comparison with a suitable range, particle diameter in the sol becomes excessively large, chemical crosslink density and mechanical strength of the surface layer of the cured underlayer decrease, and phenomena such as considerable increases in surface roughness and surface area ratio (as determined by DFM observation as previously described) of the cured underlayer are observed accompanying plasma bombardment treatment, and these factors cause a decrease in adhesion with the PE-CVD layer.

As a result, the cured underlayer is preferably formed using a precursor material composition for which progression has been adjusted to a suitable range based on an analysis of progression rate of the hydrolytic condensation reaction by liquid phase Si-NMR.

Namely, a precursor material composition, for which the value of the degree of aging (Ag) represented by the formula indicated below is preferably within the range of 0.80 to 0.85 and more preferably within the range of 0.81 to 0.84, is preferably coated onto the polymer substrate followed by drying and heat-curing to form the cured underlayer:

$$Ag=\{([X]+2\times[Y]+3\times[Z])/[S]\}/3$$

(wherein, with respect to the chemical shifts of silicon atoms of the hydrolysis-condensation product of the organic silicon compound, which is measured when a silicon atom of tetramethylsilane is assigned a value of 0 ppm after measuring the silicon nuclear magnetic resonance spectrum ($^{29}$Si-NMR) using heavy water (D$_2$O) for the solvent under conditions consisting of an observation frequency of 79 MHz, observation pulse of 6.0 μs, repetition time of 30 seconds and broadening factor of 5 Hz, the integration value of all peaks within the range of −45.0 ppm to −70.0 ppm is defined as [S], and within that peak integration value, the peak integration value within the range of −45.0 ppm to −52.5 ppm (and peaks appear within this range in the case there is one adjacent silicon atom interposed between oxygen atoms) is defined as [X], the peak integration value within the range of −52.5 ppm to −61.0 ppm (and peaks appear within this range in the case there are two adjacent silicon atoms interposed between oxygen atoms) is defined as [Y], and the peak integration value within the range of −61.0 ppm to −70.0 ppm (and peaks appear within this range in the case there are three adjacent silicon atoms interposed between oxygen atoms) is defined as [Z].

With respect to the surface of the cured underlayer of the present invention on the side where the silicon oxide layer is formed by PE-CVD, the ratio of ultraviolet absorbance at a wave number 1065 cm$^{-1}$ to that at a wave number of 1020 cm$^{-1}$ ($\alpha1065/\alpha1020$) is preferably within the range of 0.75 to 0.87. However, infrared absorbance $\alpha_K$ of each wave number is corrected by subtracting the following baseline values $\alpha_B$ from the value on this absorbance spectrum from 650 cm$^{-1}$ to 1500 cm$^{-1}$.

Baseline $\alpha_{B1020}$ at a wave number of 1020 cm$^{-1}$ =

$$\alpha_{1330} + (\alpha_{1330} - \alpha_{1430})/100 \times (1330 - 1020) =$$

$$\alpha_{1330} + (\alpha_{1330} - \alpha_{1430}) \times 3.1$$

Baseline $\alpha_{B1065}$ at a wave number of 1065 cm$^{-1}$ =

$$\alpha_{1330} + (\alpha_{1330} - \alpha_{1430})/100 \times (1330 - 1065) =$$

$$\alpha_{1330} + (\alpha_{1330} - \alpha_{1430}) \times 2.65$$

Here, since the silicon oxide layer obtained by PE-CVD is formed using a decomposition and condensation reaction within the plasma space of the organic silicon compound, in the case of arranging the cured underlayer containing a hydrolysis-condensation product of the organic silicon compound as a main component thereof as the foundation thereof (in the sense of being formed in contact with the interface with the silicon oxide layer), since both have the basic structure of an organic silicon system and essentially have high chemical affinity, by carrying out a prescribed plasma bombardment to be subsequently described and making the deposition rate in the initial growth process of the silicon oxide layer obtained by PE-CVD to be within a prescribed range, Si—O—Si chemical bonds can be introduced between both layers, thereby making it possible to anticipate increased interlayer adhesive strength.

The aforementioned ratio of infrared absorbance at a wave number of 1065 cm$^{-1}$ to that at a wave number of 1020 cm$^{-1}$ ($\alpha_{1065}/\alpha_{1020}$) is thought to reflect the formation density and crosslink density of a Si—O—Si network structure on the surface of the cured underlayer containing a hydrolysis-condensation product of an organic silicon compound as a main component thereof, and the density of the Si—O—Si network structure increases as this ratio becomes smaller.

Here, if this ratio ($\alpha_{1065}/\alpha_{1020}$) is within the range of 0.75 to 0.87, adhesive strength with the silicon oxide layer obtained by PE-CVD increases and contributes to improvement of boiling water performance, thereby making this preferable. In contrast, if this ratio ($\alpha_{1065}/\alpha_{1020}$) is less than 0.75, permeation of the PE-CVD decomposition product into the high-density Si—O—Si structure is inhibited, thereby making it difficult to improve adhesive strength. In addition, if this ratio ($\alpha_{1065}/\alpha_{1020}$) exceeds 0.87, the degree of the decrease in mechanical strength of the Si—O—Si network structure becomes remarkable and there is increased likelihood of the occurrence of destruction at the adhesion interface, thereby making this undesirable.

Furthermore, in order to control this ratio ($\alpha_{1065}/\alpha_{1020}$) to be within the preferable range of 0.75 to 0.87, it is preferable to control the chemical composition, adjustment method and degree of curing of the cured underlayer containing a hydrolysis-condensation product of an organic silicon compound as a main component thereof, and control the conditions of plasma bombardment treatment carried out on the cured underlayer prior to the start of forming the silicon oxide layer by PE-CVD.

Moreover, in terms of obtaining superior environmental resistance or boiling water performance, the surface roughness (Ra) of the surface of the cured underlayer, containing a hydrolysis-condensation product of an organic silicon compound as a main component thereof, in the case of measuring in the DFM mode under conditions of observing by 5.0 μm square is preferably within the range of 0.7 nm to 10.0 nm. Since there are many cases in which the cured underlayer containing a hydrolysis-condensation product of an organic silicon compound as a main component thereof is electrically insulated, the DFM mode is effective for observing the surface thereof as was previously described.

Here, although surface roughness as measured in the DFM mode reflects surface smoothness of the surface of the cured underlayer at the nano-level, in terms of enhancing adhesive strength with the silicon oxide layer obtained by PE-CVD, suitable surface irregularities defined by a preferable range of surface roughness are preferably present. Surface irregularities refer to those observed in the DFM mode in the form of independent or mutually connected holes and/or projections, and the presence of these surface irregularities is thought to enhance anchoring effects relating to improvement of adhesive strength.

If surface roughness (Ra) of the surface of the cured underlayer of the present invention is less than 0.7 nm, it becomes difficult to obtain an effect that improves adhesive strength, while if surface roughness (Ra) exceeds 10.0 nm, mechanical strength of the surface of the cured underlayer decreases, and there are cases in which this leads to a decrease in adhesive strength as a result thereof, thereby making this undesirable. More preferably, surface roughness (Ra) of the surface of the cured underlayer is within the range of 1.0 nm to 5.0 nm.

Furthermore, in the same manner as previously described, measurement using the DFM mode is preferably carried out under conditions of an observation area of 5 μm square using 256×256 measuring points, and measurements are preferably made in a plurality of regions followed by using the average value thereof.

Component (F) in the form of silica fine particles are preferably mixed in while having as a main component thereof inorganic oxide fine particles having a primary particle diameter of 1 nm to 200 nm and more preferably a primary particle diameter of 5 nm to 40 nm, and are preferably fine particles consisting of silicon oxide or silicon oxide having organic groups or Si—OH groups in a portion thereof. In general, although silica fine particles are categorized as precipitated silica, gelled silica, dry silica or colloidal silica and the like according to the production method used, that classified as colloidal silica (to be referred to as colloidal silica) is used preferably in the present invention.

Colloidal silica is produced by a method that uses water glass as raw material, a method that uses metallic silicon powder as raw material, a vapor phase synthesis method or a sol-gel method (hydrolytic condensation of an organic silicon compound).

Colloidal silica obtained by dispersing silica in a colloidal state in water or an organic solvent is preferably used for the colloidal silica, and specific examples thereof include products obtained by dispersing in an aqueous acidic solution such as Snowtex 0 manufactured by Nissan Chemical Industries, Ltd. or Cataloid SN30 manufactured by Catalysts and Chemicals Industry Co., Ltd., products obtained by dispersing in an aqueous basic solution such as Snowtex 30 or Snowtex 40 manufactured by Nissan Chemical Industries, Ltd. or Cataloid S30 or Cataloid S40 manufactured by Catalysts and Chemicals Industry Co., Ltd., and products obtained by dispersing in an organic solvent such as MA-ST, IPA-ST, NBA-ST, IBA-ST, EG-ST, XBA-ST, NPC-ST or DMAC-ST manufactured by Nissan Chemical Industries, Ltd.

Although the colloidal silica can be of the water-dispersible type or organic solvent-dispersible type, a water-dispersible type is used preferably. In the case of using water-dispersible colloidal silica, since a large number of hydroxyl groups are present on the surface of the silica fine particles, these hydroxyl groups strongly bind with the hydrolysis-condensation product of the organic silicon compound of Component E, thereby allowing the obtaining of a cured underlayer having a high level of mechanical strength. In addition, although the water-dispersible colloidal silica may be that dispersed in an acidic aqueous solution or basic aqueous solution, colloidal silica dispersed in an acidic aqueous solution is used preferably from the viewpoints of increased diversity when selecting a curing catalyst and the realization of suitable hydrolysis and condensed state of the trialkoxysilane.

Since the mixing ratio of Component (E) and Component (F) in the precursor composition of the cured underlayer has a preferable range according to such factors as mechanical strength of the resulting cured underlayer, appearance of the coated film, coefficient of thermal expansion and shrinkage rate of the layer during crosslinking and curing, in general, in contrast to Component (E) preferably being mixed at a ratio of 50% by weight to 90% by weight as converted to $R^1_m R^2_n SiO_{(4-m-n)/2}$, Component (F) is preferably mixed at a ratio of 10% by weight to 50% by weight. More preferably, in contrast to Component (E) being mixed at a ratio of 55% by weight to 85% by weight as converted to $R^1_m R^2_n SiO_{(4-m-n)/2}$, Component (F) is mixed at a ratio of 15% by weight to 45% by weight, and most preferably, in contrast to Component (E) being mixed at a ratio of 60% by weight to 80% by weight as converted to $R^1_m R^2_n SiO_{(4-m-n)/2}$, Component (F) is mixed at a ratio of 20% by weight to 40% by weight.

The precursor composition of the cured underlayer preferably contains metal oxide fine particles (to be referred to as Component G) as necessary as an accessory component of the inorganic oxide fine particles having a primary particle diameter of 1 nm to 200 nm. Component (G) preferably demonstrates ultraviolet absorption, and as a result thereof, is able to further enhance resistance to ultraviolet light such as sunlight entering the polymer substrate with hard coating layer from the outside.

More specifically, examples of Component (G) include titanium oxide, zinc oxide, cerium oxide, tin oxide, tungsten oxide and zirconium oxide, and one type and/or a plurality of types of these metal oxide fine particles are used preferably. The primary particle diameter of the fine particles is roughly 1 nm to 200 nm and more preferably 3 nm to 50 nm, and those that have preliminarily undergone surface coating of the particle surface for the purpose of enhancing dispersibility in the reaction system and/or inhibiting photocatalytic activity are used preferably. Furthermore, particle size distribution of the metal oxide fine particles when the particle diameter at 50% in the cumulative distribution and particle diameter at 90% in the cumulative distribution are defined as D50 and D90, respectively, is such that D90 is preferably 100 nm or less and D90/D50 is preferably 20 or more.

The content of Component (G) is preferably 1 part by weight to 15 parts by weight and more preferably 0.5 parts by weight to 5.0 parts by weight based on 100 parts by weight for the total amount of Component E and Component F.

The precursor composition of the cured underlayer preferably further contains a curing catalyst (to be referred to as Component I). Examples of this curing catalyst include lithium salts of aliphatic carboxylic acids such as formic acid, acetic acid, propionic acid, butyric acid, lactic acid, tartaric acid or succinic acid, alkaline metal salts such as sodium salts or potassium salts, quaternary ammonium salts such as benzyltrimethylammonium salts, choline salts, tetramethylammonium salts or tetraethylammonium salts, and metal acetylacetonates such as aluminum acetylacetonate, titanium acetylacetonate, nickel acetylacetonate or cobalt acetylacetone, and more specifically, sodium acetate, potassium acetate, choline acetate and benzyltrimethylammonium acetate are used preferably. The content of Component (I) is preferably 0.01 parts by weight to 10 parts by weight and more preferably 0.1 parts by weight to 5 parts by weight based on 100 parts by weight for the total amount of Component (E) and Component (F).

Since the precursor composition of the cured underlayer is mainly formed by wet coating, a solvent is preferably contained in terms of enhancing coatability. However, in the case water present in the colloidal silica not involved in the hydrolysis reaction, lower alcohols generated accompanying hydrolysis of the organic silicon compound or organic solvent-dispersible colloidal silica are used in the precursor composition, and since organic solvent of the dispersion medium and acid added for the purpose of adjusting pH as related to controlling progression of the hydrolytic condensation reaction of the organic silicon compound are inherently contained therein, it is necessary to determine the solvent composition and mixed amount of the overall precursor composition while maintaining balance therewith.

The solvent preferably stably dissolves Component (E), Component (F) and other solid components of the precursor composition of the cured underlayer, and at least 20% by weight or more, and preferably 50% by weight or more, of all solvent is preferably an alcohol-based solvent.

Specific examples of alcohol-based solvents include methanol, ethanol, 1-propanol, 2-propanol, 1-butanol, 2-butanol, 2-methyl-1-propanol, 2-ethoxyethanol, 4-methyl-2-pentanol and 2-butoxyethanol. Among these, low boiling point alcohols having 1 to 4 carbon atoms are preferable, and 1-butanol and 2-propanol are particularly preferably from the viewpoints of solubility, stability and coatability.

Other solvents that can be used are required to be miscible with water/alcohol, and examples thereof include ketones such as acetone, methyl ethyl ketone or methyl isobutyl ketone, ethers such as tetrahydrofuran, 1,4-dioxane or 1,2-dimethoxyethane, and esters such as ethyl acetate, n-butyl acetate, isobutyl acetate and ethoxyethyl acetate.

The content of solvent is preferably 50 parts by weight to 2000 parts by weight and more preferably 150 parts by weight to 1400 parts by weight based on 100 parts by weight for the total amount of Component (E) and Component (F). The solid content concentration is preferably 5% by weight to 70% by weight and more preferably 7% by weight to 40% by weight.

A known leveling agent can be incorporated in the precursor composition of the cured underlayer for the purpose of improving coatability and smoothness of the resulting layer.

Examples of leveling agents include silicone compounds SH200-100cs, SH28PA, SH29PA, SH30PA, ST83PA, ST80PA, ST97PA, ST86PA or SH21PA manufactured by Toray-Dow Corning Silicone Co., Ltd., silicone compounds KP321, KP322, KP323, KP324, KP326, KP340 or KP341 manufactured by Shin-Etsu Chemical Co., Ltd., and fluorine-based surfactants F-179, F-812A or F-815 manufactured by DIC Corp. These leveling agents may be used alone or two or more types may be used in combination, and are used at preferably 0.0001 parts by weight to 2.0 parts by weight and more preferably 0.0005 parts by weight to 1.0 part by weight based on 100 parts by weight for the total solid content of the precursor composition.

In addition, an ultraviolet absorber may also be added to the precursor composition of the cured underlayer as necessary. Examples of the ultraviolet absorber include cyanine-based compounds, squarylium-based compounds, thiol-nickel complex salt-based compounds, phthalocyanine-based compounds, triallylmethane-based compounds, naphthoquinone-based compounds, anthraquinone-based compounds, carbon black, antimony oxide, tin oxide doped with indium oxide and lanthanum boride.

Furthermore, the method used to coat the precursor composition of the cured underlayer can be suitably selected corresponding to the shape of the base material to be coated, and examples thereof include bar coating, dip coating, flow coating, spray coating, spin coating and roller coating. After coating the precursor composition, the solvent is normally dried and removed at a temperature ranging from normal temperature to a temperature equal to or lower than the heat distortion temperature of the base material, followed by heat curing. Carrying out heat curing at a high temperature within a range that does not cause a problem with respect to the heat resistance of the base material enables curing to be completed more quickly, thereby making this preferable in many cases.

The heat curing temperature is dependent on the heat resistance of the polymer substrate and is preferably a temperature that is 10° C. or more lower than the heat distortion temperature. In addition, although heat curing time is suitably adjusted corresponding to the heat curing temperature, the chemical composition of the cured underlayer and the like, it is generally about 30 minutes to 2 hours at 120° C. or higher and typically about 1 hour to 4 hours at 110° C. or lower.

Furthermore, in case layer curing is inadequate, it is undesirable to allow curing and shrinkage of the layer to proceed due to heat during or after lamination of the silicon oxide layer by PE-CVD since there are cases in which interfacial stress between the cured underlayer and PE-CVD layer increases and environmental resistance is impaired. In addition, if curing of the layer proceeds excessively and the Si—O—Si network structure of the layer becomes excessively rigid, the introduction rate of Si—O—Si bonds between the silicon oxide layer obtained by PE-CVD and the cured underlayer is not sufficiently high, which may cause a decrease in adhesive strength between both layers, thereby making this undesirable.

The thickness of the cured underlayer is preferably within the range of 0.1 μm to 20 μm, more preferably 1 μm to 10 μm, even more preferably 2 μm to 8 μm and most preferably 3 μm to 6 μm. If the thickness is less than 0.1 μm, abrasion resistance after laminating the silicon oxide layer by PE-CVD may be inadequate, thereby making this undesirable. In addition, if the thickness exceeds 20 μm, cracks may form in the layer or adhesion with the underlayer may be decrease due to stress accompanying layer shrinkage and thermal stress accompanying changes in temperature, thereby making this undesirable.

In the present invention, the surface status of the cured underlayer is preferably controlled and adjusted to a preferable range prior to starting to form the silicon oxide layer by PE-CVD.

Namely, examples of preferable methods for accomplishing this includes a method for adjusting the surface of the underlayer immediately so that the ratio of infrared absorbance at a wave number of 1065 cm$^{-1}$ to that at a wave number of 1020 cm$^{-1}$ ($\alpha_{1065}/\alpha_{1020}$) is within the range of 0.45 to 0.65, before laminating the silicon oxide layer by PE-CVD, and/or a method for adjusting the surface of the underlayer immediately, before laminating the silicon oxide layer by PE-CVD, so that surface roughness (Ra) in the case of having measured with the dynamic force mode (DFM) of an atomic force microscope under conditions of observing by 5 μm square is 0.5 nm to 5 nm and the surface area ratio is 1.001 to 1.01, and a specific example thereof consists of carrying out plasma bombardment treatment on the surface of the cured underlayer immediately before laminating the silicon oxide layer by PE-CVD.

Plasma bombardment treatment refers to a treatment consisting of colliding a gaseous species and electrons imparted with a high level of kinetic energy by plasma excitation with the surface of the cured underlayer, and consists of activation of the surface of the cured underlayer (appearance of active groups due to severing of chemical bonds and crosslinking structure) and aging treatment at those portions where crosslink density of the surface layer is low.

An example of a specific method consists of evacuating the inside of a chamber by drawing a vacuum with a substrate placed on one of the electrodes using a capacitive coupling type of plasma device that uses parallel plate electrodes, followed by allowing a treatment gas to flow in and applying a high-frequency magnetic field (such as that at a frequency of 13.56 MHz) to generate plasma.

The main control parameters of plasma bombardment treatment include the type of gas, gas pressure or flow rate (and directly, the gas concentration in the vicinity of the substrate), the applied power of the high-frequency magnetic field (to be referred to as high-frequency applied power), distance between electrodes and treatment time, and these parameters can be used to control treatment intensity.

Although both an inert gas such as argon, helium or krypton, as well as an active gas such as oxygen, nitrogen, water or carbon dioxide in the case of incorporating in a chemically bonded state in the treatment target depending on the plasma excitation conditions, can be used for the gaseous species, in consideration of the object of the present invention, a gas mainly composed of an inert gas is preferable due to the ease of controlling the surface of the cured underlayer, and argon gas is used particularly preferably due to its superior controllability.

Although it is difficult to universally specify preferable ranges for the gas flow rate, high-frequency applied power and distance between electrodes since they are dependent on the surface area of the substrate and electrodes, the volume of the vacuum chamber, the shape of the substrate and the like, in the case of a flat substrate and converting to a surface area in square meters, the gas flow rate is generally within the range of about 1000 sccm to 5000 sccm, and the high-frequency applied power is preferably controlled to within a range of about 2 KW to 7 KW and more preferably 3 KW to 5 KW.

Treatment time is preferably generally within the range of about 1 minute to 20 minutes, more preferably about 2 minutes to 15 minutes and even more preferably about 3 minutes to 10 minutes.

As a result of controlling these treatment parameters, the surface status of the cured underlayer is preferably controlled and adjusted to a preferable range prior to starting to form the silicon oxide layer by PE-CVD.

Furthermore, plasma bombardment treatment can also be carried out with a device other than a capacitive coupling type of CVD device that uses parallel plate electrodes as described above, and examples thereof include an inductively coupled CVD device that generates plasma around a substrate by generating a high-frequency magnetic field with a magnetic field coil arranged around the substrate, and a method consisting of allowing gas particles imparted with high energy from a plasma field primarily using an inductively coupled plasma gun to accelerate and collide with a substrate surface by injection pressure or an electromagnetic field.

<Silicon Oxide Layer 80>

With respect to the polymer substrate with hard coating layer of the present invention, examples of configuration requirements required of the silicon oxide layer obtained by PE-CVD in order to realize the three characteristics of a high level of abrasion resistance comparable to that of inorganic glass, boiling water resistance (including adhesion) and heat resistance include film thickness of the silicon oxide layer, mechanical properties (elastic modulus, hardness) and a high degree of compactness with respect to the microstructure of the silicon oxide layer.

(Film Thickness)

The film thickness of the silicon oxide layer obtained by PE-CVD of the present invention is 3.5 μm to 9.0 μm.

In a Taber abrasion test, a thicker film thickness tends to be more favorable, and if the film thickness is less than 3.5 μm, there are many cases in which the increase in haze value (ΔH) under the aforementioned test conditions exceeds 2%, thereby making this undesirable. In terms of obtaining better performance (smaller haze value), film thickness is preferably 4 μm or more and more preferably 4.5 μm or more. On the other hand, accompanying an increase in film thickness or accompanying increases in deposition time of the silicon oxide layer (as related to production cost) and increases in layer internal stress (generated due to differences in the coefficient of thermal expansion between layers or reaction shrinkage of the silicon oxide layer), since these act as negative elements of the reaction system, the upper limit of film thickness is preferably about 9.0 μm.

(Maximum Indentation Depth as Determined by Nanoindentation)

The maximum indentation depth of the silicon oxide layer obtained by PE-CVD as determined by measuring nanoindentation under conditions of a maximum test load of 1 mN in order obtain favorable Taber abrasion resistance is 150 nm or less. This is because, if the maximum indentation depth is greater than 150 nm, the indentation depth of the surface of the silicon oxide layer by abrasive particles demonstrates a relative increase during contact abrasion between the silicon oxide layer obtained by PE-CVD and the abrasive particles, and as a result thereof, the depth of scratches (concave portions formed by abrasion) increases and layer destruction proceeds.

Furthermore, the maximum indentation depth as determined by measuring nanoindentation under these conditions is more preferably 130 nm or less, even more preferably 110 nm or less and most preferably 100 nm or less. Furthermore, in the case of measuring maximum indentation of the surface of a commercially available silicon wafer under these conditions, the resulting value of maximum indentation is about 55 nm, while that in the case of measuring the surface of a commercially available fused quartz plate is about 75 nm to 80 nm.

(Critical Compression Ratio K in 3-Point Bending Test)

The value of critical compression ratio K of the silicon oxide layer obtained by PE-CVD as defined in the following formula (1) in a 3-point bending test, which imparts indentation displacement in which the surface laminated with the silicon oxide layer becomes concave, is 0.975 or less.

$$K=(R-D/2)/R-(0.00215 \times d)$$

$$R=((G/2)^2-(\delta L)^2)/(2 \times \delta L) \quad \text{Formula (1)}$$

Figure 6:
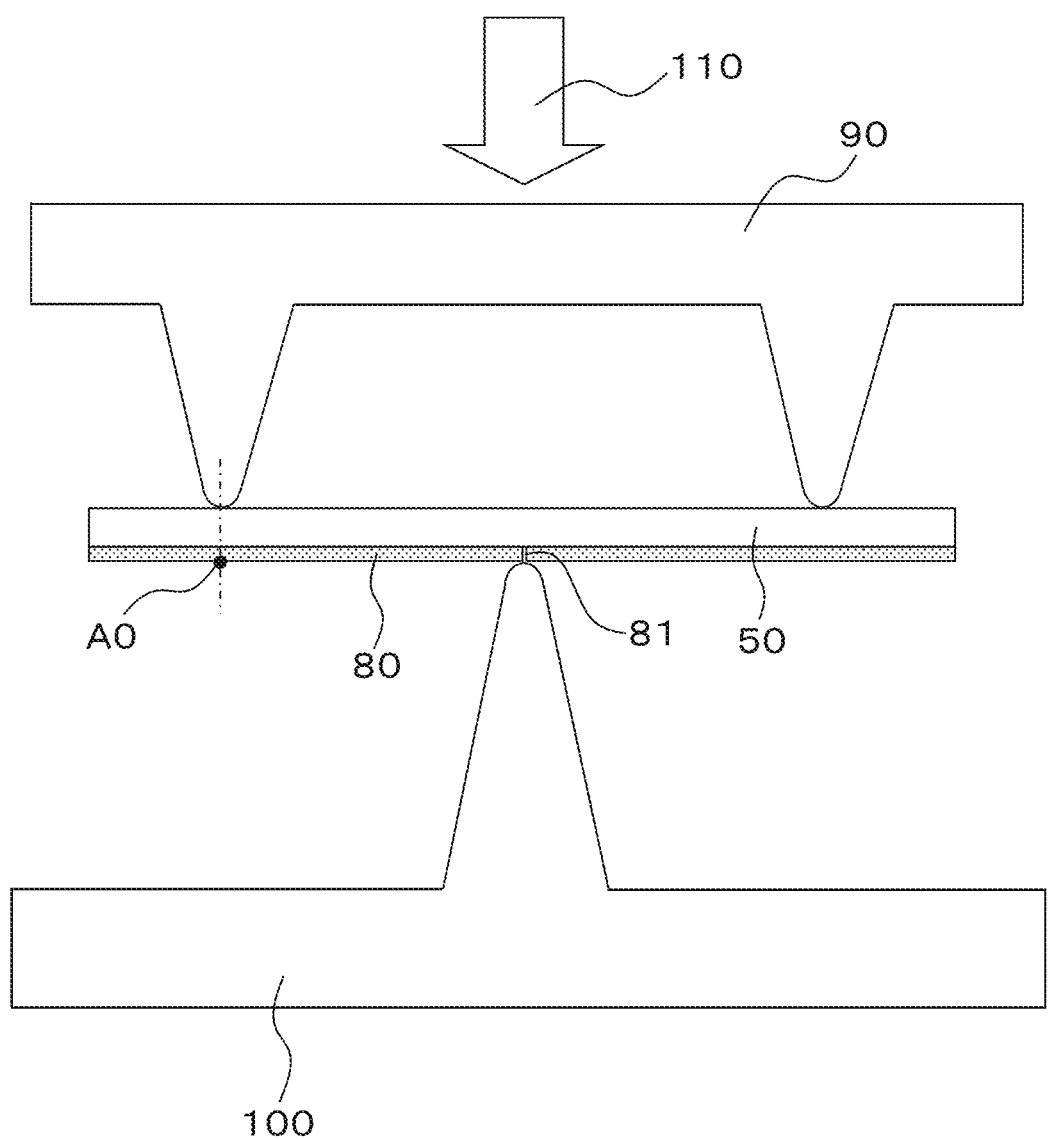
FIG. 6 is a schematic diagram of a 3-point bending test (sample placement stage, prior to generation of bending displacement) carried out on the polymer substrate with hard coating layer of the present invention.
Figure 7:
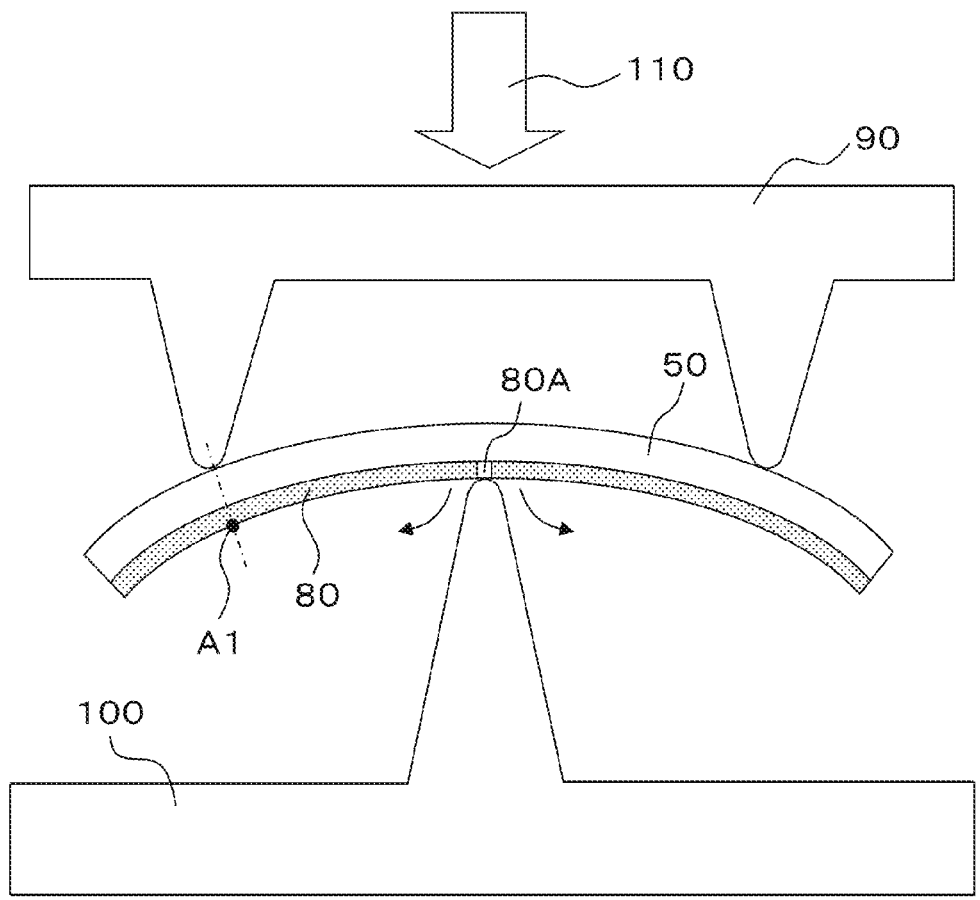
FIG. 7 is a schematic diagram of a 3-point bending test (test in progress, during generation of bending displacement) carried out on the polymer substrate with hard coating layer of the present invention.

Here, as indicated in the schematic diagram of a 3-point bending test exemplified in FIGS. 6 and 7, D represents the total thickness (mm) of the polymer substrate with hard coating layer, d represents the film thickness (μm) of the silicon oxide layer, G represents the distance (mm) between two end fulcrum points in a 3-point bending tester, $\delta L$ and R respectively represent indentation displacement (mm), measured when the silicon oxide layer begins to separate from a cut line (separation starting line) drawn in advance at the location of the central fulcrum point, and the bend radius (mm) of the polymer substrate with hard coating layer when subjected to 3-point bending deformation during a 3-point bending test.

Figure 9:
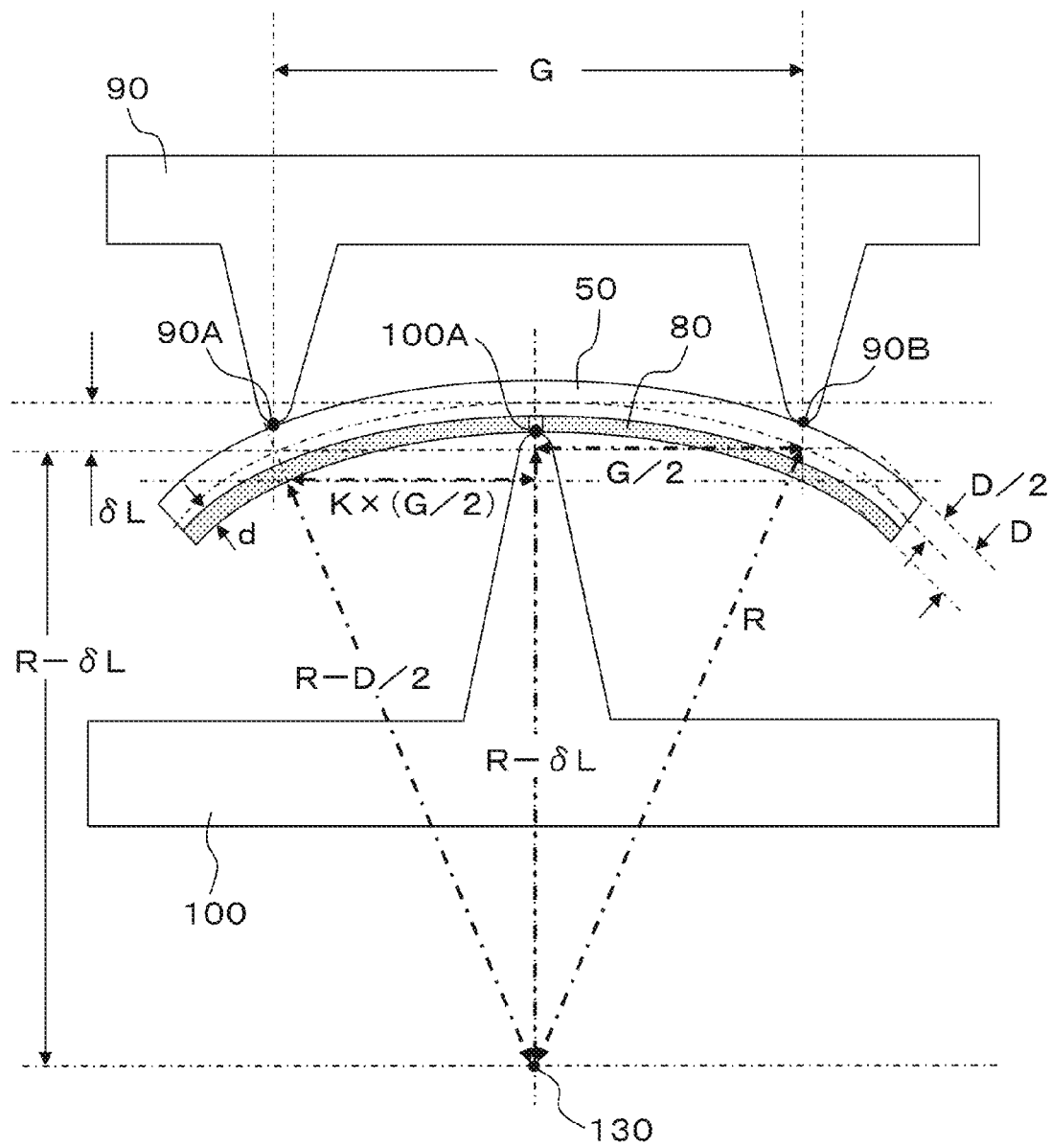
FIG. 9 is an explanatory drawing relating to calculation of critical compression ratio from the results of a 3-point bending test.

This critical compression ratio is a value that indicates resistance of the silicon oxide layer to compressive stress, and in the case of causing bending deformation in a direction in which the surface on which the silicon oxide layer is laminated becomes concave using the 3-point bending tester exemplified in FIGS. 6, 7 and 9 followed by increasing that amount of deformation over time, is defined as the value obtained by subtracting a correction term (0.00215×d) relating to the thickness of the silicon oxide layer based on dimensional compression ratio (dimension at start of separation in the lengthwise direction/ratio of initial dimension) when the silicon oxide layer is unable to withstand compressive deformation causing the silicon oxide layer alone to undergo spontaneous separation at the interface with the underlayer. Furthermore, this critical compression ratio has been originally defined and introduced by the inventors of the present invention for the purpose of representing and defining the novel characteristics relating to the materials and physical properties of the polymer substrate with hard coating layer of the present invention.

Figure 8:
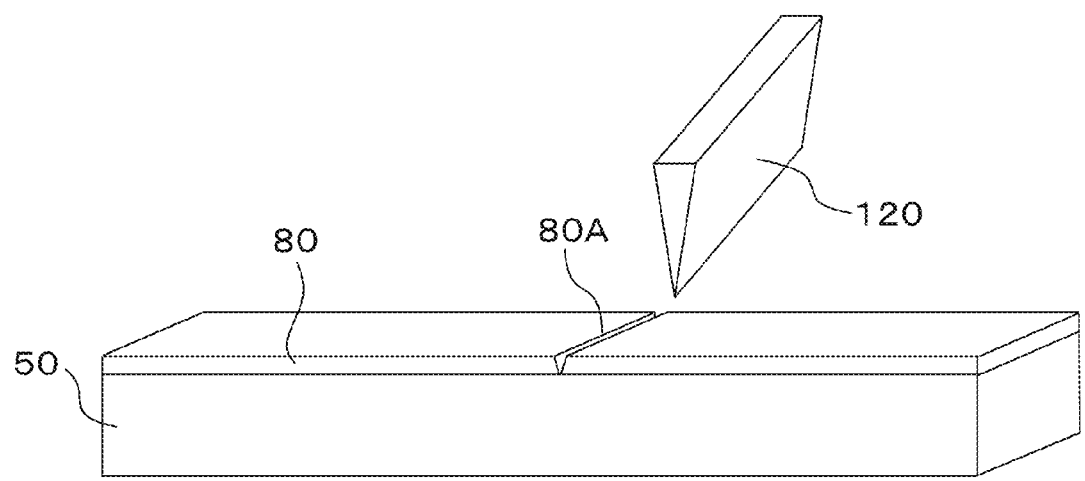
FIG. 8 is a diagram for explaining a cut line (separation starting line) of a 3-point bending test.

More specifically, indentation displacement ($\delta L$) at the start of separation is measured followed by calculating critical compression ratio according to formula (1). Furthermore, a cut line serving as the origin for the start of destruction is preliminarily made with a cutter knife in the silicon oxide layer to ensure stable measured values as shown in FIG. 8.

Furthermore, although the total thickness (D) of the polymer substrate with hard coating layer and the thickness (d) of the silicon oxide layer are included in formula (1), this is because the indentation displacement ($\delta L$) serving as the primary measurement value of this test is dependent on these two elements. Conversely, in the case of measuring using constant values for D and d, a favorable performance correlation can be obtained with a relative value of $\delta L$ only.

Namely, the inventors of the present invention found that, if this value of critical compression ratio K is 0.975 or less, superior performance is demonstrated in a boiling water test used as a representative test of environmental resistance of a polymer substrate with hard coating layer laminated with the silicon oxide layer obtained by PE-CVD. In the case the value of critical compression ratio K exceeds 0.975, there are many cases in which exacerbation of boiling water performance (consisting mainly of the occurrence of peeling and lifting of the silicon oxide layer) is observed, thereby making this undesirable. Furthermore, the value of critical compression ratio K is more preferably 0.973 or less and even more preferably 0.972 or less.

(Ratio of Infrared Absorbance)

In addition, the ratio of infrared absorbance at a wave number of 930 cm$^{-1}$ to that at a wave number of 1020 cm$^{-1}$ ($\alpha_{930}/\alpha_{1020}$) of the silicon oxide layer obtained by PE-CVD is preferably 0.30 or less. Here, infrared absorbance α is represented by α=−Log T/100 (wherein, T represents the infrared transmittance of the sample).

With respect to calculating absorbance, absorption spectrum is preferably measured by ATR for the surface on which is formed the silicon oxide layer of the polymer substrate with hard coating layer over a wave number range from 650 cm$^{-1}$ to 1500 cm$^{-1}$. However, infrared absorbance $\alpha_K$ of each wave number is corrected by subtracting the following baseline values $\alpha_B$ from the value on this absorbance spectrum from 650 mm$^{-1}$ to 1500 cm$^{-1}$.

Baseline $\alpha_{B930}$ at a wave number of 930 cm$^{-1}$ =

$$\alpha_{B930} = \alpha_{1330} + (\alpha_{1330} - \alpha_{1430})/100 \times (1330 - 930) =$$

$$\alpha_{1330} + (\alpha_{1330} - \alpha_{1430}) \times 4$$

Baseline $\alpha_{B1020}$ at a wave number of 1020 cm$^{-1}$ =

$$\alpha_{1330} + (\alpha_{1330} - \alpha_{1430})/100 \times (1330 - 1020) =$$

$$\alpha_{1330} + (\alpha_{1330} - \alpha_{1430}) \times 3.1$$

Here, the infrared absorbance at a wave number of 930 cm$^{-1}$ reflects the relative content of Si—OH groups, and as this value becomes larger following the formation of Si—OH groups by oxidative degradation of the raw material organic silicon compound during PE-CVD deposition, the dehydration condensation reaction thereof and the progression of crosslinking to the formation of a three-dimensional Si—O—Si network structure become inadequate, resulting in a relative decrease in thermal stability.

If the infrared absorbance ratio at a wave number of 930 cm$^{-1}$ to that at a wave number of 1020 cm$^{-1}$ ($\alpha_{930}/\alpha_{1020}$), as determined by measuring the infrared absorption spectrum of the silicon oxide layer obtained by PE-CVD, is 0.30 or less, superior heat resistance (as determined by a heat resistance test conducted by allowing to stand at a high temperature) is demonstrated, thereby making this preferable. In contrast, in the case this ratio ($\alpha_{930}/\alpha_{1020}$) exceeds 0.30, a decrease in heat resistance is observed and thermal stability becomes low, thereby making this undesirable. In addition, there is no particular lower limit value of the preferable range. Furthermore, in actuality, the preferred ratio ($\alpha_{930}/\alpha_{1020}$) varies somewhat according to the required level of heat resistance (as determined under the conditions for carrying out a heat resistance test) of each type of application of the polymer substrate with hard coating layer of the present invention, and in order to be able to withstand even higher levels, this ratio ($\alpha_{930}/\alpha_{1020}$) is more preferably 0.28 or less, even more preferably 0.26 or less and most preferably 0.24 or less.

The ratio of infrared absorbance at a wave number of 1280 cm$^{-1}$ to that at a wave number of 1020 cm$^{-1}$ ($\alpha_{1280}/\alpha_{1020}$) of the silicon oxide layer obtained by PE-CVD of the present invention based on measurement of the infrared absorption spectrum of that layer is preferably within the range of 0.002 to 0.020. Here, infrared absorbance at a wave number of 1020 cm$^{-1}$ indicates the degree of formation of a three-dimensional Si—O—Si network structure, while the infrared absorbance at a wave number of 1280 cm$^{-1}$ reflects the relative content of Si—CH$_3$ groups in the silicon oxide layer obtained by PE-CVD.

Here, infrared absorbance $\alpha$ is represented by $\alpha=-\mathrm{Log}\, T/100$ (wherein, T represents the infrared transmittance of the sample).

With respect to calculating absorbance, absorption spectrum is preferably measured by ATR for the surface on which is formed the PE-CVD layer of the polymer substrate with hard coating layer over a wave number range from 650 cm$^{-1}$ to 1500 cm$^{-1}$. However, infrared absorbance $\alpha_K$ of each wave number is corrected by subtracting the following baseline values $\alpha_B$ equal from the value on this absorbance spectrum from 650 cm$^{-1}$ to 1500 cm$^{-1}$ $$\text{Baseline } \alpha_{B1020} \text{ at a wave number of } 1020 \text{ cm}^{-1} =$$
$$\alpha_{1330} + (\alpha_{1330} - \alpha_{1430})/100 \times (1330 - 1020) =$$
$$\alpha_{1330} + (\alpha_{1330} - \alpha_{1430}) \times 3.1$$
$$\text{Baseline } \alpha_{B1280} \text{ at a wave number of } 1280 \text{ cm}^{-1} = (\alpha_{1260} + \alpha_{1300})/2$$

The reason for favorable boiling water performance within the aforementioned range is presumed to be, since the silicon oxide layer obtained by PE-CVD contains a small amount of Si—CH$_3$ groups therein, it demonstrates suitable flexibility, thereby demonstrating the effect of inhibiting concentration of stress in the layer. In the case the ratio of infrared absorbance at a wave number of 1280 cm$^{-1}$ to that at a wave number of 1020 cm$^{-1}$ ($\alpha_{1280}/\alpha_{1020}$) is less than 0.002, boiling water performance decreases, thereby making this undesirable, while in the case this ratio ($\alpha_{1280}/\alpha_{1020}$) exceeds 0.020, there are cases in which a decrease in abrasion resistance and the like is observed, thereby making this undesirable. Furthermore, this ratio ($\alpha_{1280}/\alpha_{1020}$) is more preferably 0.003 to 0.016, even more preferably 0.004 to 0.014 and most preferably within the range of 0.005 to 0.012.

(Maximum Indentation Depth as Determined by Nanoindentation)

With respect to the hardness (abrasion resistance) of the silicon dioxide layer obtained by PE-CVD of the present invention, the silicon oxide layer obtained by PE-CVD preferably has high hardness in terms of obtaining superior Taber abrasion resistance, and indentation depth as determined by measuring nanoindentation under conditions of a maximum test load of 1 mN is preferably 3 GPa or more. This is because, in the case this layer has high hardness, the size of scratches caused by abrasive particles and the like can be reduced.

In addition, similar to measurement of maximum indentation hardness as previously described, measurement of nanoindentation is preferably carried out using the ENT-2100 Nanoindentation Hardness Tester manufactured by Elionix Inc. Furthermore, indentation hardness as determined by measuring nanoindentation under these conditions is more preferably 4 GPa or more and most preferably 5 GPa or more.

(Surface Roughness (Ra))

With respect to the compactness of the silicon oxide layer obtained by PE-CVD of the present invention and in terms of obtaining superior Taber abrasion resistance, the silicon oxide layer obtained by PE-CVD preferably has a compact fine structure, and surface roughness (Ra), as determined by measuring the surface of the silicon oxide layer in the dynamic force mode (to be abbreviated as DFM) of a scanning probe microscope under conditions of observing by 5.0 µm square is preferably 5.0 nm or less.

DFM is a measuring method that uses a scanning probe microscope that carries out measurement in a vibrational mode (dynamic force mode), and since it causes little abrasion with a sample surface and there is little effect of surface charging on measurements, it is effective for observing the surface of the silicon oxide layer obtained by PE-CVD which is frequently electrically insulated.

According to observing a surface by DFM, the silicon oxide layer obtained by PE-CVD undergoes vapor phase growth in the form of nanometer-sized fine particles, and a layer is formed of a form in which these fine particles accumulate on each other. Although surface roughness and surface area ratio of a layer surface are dependent on PE-CVD deposition conditions, a silicon oxide layer in which surface roughness measured under conditions of observing by 5 µm square is 5.0 nm or less demonstrates high layer compactness, is structurally stable, and is highly resistance to surface abrasion. If surface roughness exceeds 5.0 nm, fine particles undergoing vapor phase growth increase in size and layer compactness decreases resulting in a relatively sparse structure, thereby resulting in a decrease in resistance to surface abrasion, while there are also many cases in which an increase in haze value ($\Delta H$) according to the conditions of the aforementioned Taber abrasion test exceeds 2%, thereby making this undesirable. In order to obtain even greater abrasion resistance, surface roughness is more preferably 4.0 nm or less and even more preferably 3.0 nm or less.

Furthermore, with respect to measuring surface roughness (Ra) and surface area ratio by DFM, since there are cases in which discrepancies occur attributable to the measuring device, cantilever used and measurement conditions, the SPI3800N scanning probe microscope manufactured by Hitachi High-Tech Science Corp. is preferably used for the measuring device, the NSG10 manufactured by NT-MDT Corp. is preferably used for the cantilever, and measurement is preferably carried out under conditions of an observation area of a square measuring 5 μm on a side and measuring 256×256 measurement points. Measurements are preferably made in a plurality of regions followed by using the average value thereof, and in the present invention, measurements are carried out at 10 or more points.

(Average Deposition Rate)

The silicon oxide layer obtained by PE-CVD is preferably formed at an average deposition rate (nm/sec) between the start of deposition and 30 seconds thereafter of deposition of 1 nm/sec or less.

As a result of making this deposition rate to be 1 nm/sec or less, the particle size of the silicon oxide layer obtained by PE-CVD formed (during initial deposition) in the vicinity of the interface with the cured underlayer can be reduced, and as a result thereof, a layer of high compactness is obtained. In addition, it is also possible to obtain time for the reaction degradation products of PE-CVD to permeate into the cured underlayer, thereby enhancing the introduction rate of Si—O—Si bonds between layers and allowing the obtaining of an anchoring effect as previously described.

If this deposition rate exceeds 1 nm/sec, the particle size of the silicon oxide layer obtained by PE-CVD becomes relatively large, layer compactness decreases and adhesive strength with the cured underlayer tends to decrease, thereby making this undesirable. This deposition rate is more preferably 0.8 nm/sec or less and even more preferably 0.6 nm/sec or less.

Furthermore, the amount of time required to deposit the layer at a deposition rate of 1 nm/sec or less is preferably within the range of 30 seconds to 180 seconds after the start of deposition. This is because, due to the high compactness and high flexibility of this layer, interfacial stress with the cured underlayer increases accompanying an increase in deposition time, namely an increase in layer thickness, thereby resulting in cases in which adhesive strength decreases. Deposition time is more preferably within the range of 30 seconds to 120 seconds and even more preferably within the range of 30 seconds to 90 seconds.

(Plasma Generation Method)

In the PE-CVD method of the present invention, examples of methods used to generate plasma using excitation of decomposition and condensation reactions of the raw material silicon oxide compound include a method using a capacitive coupling type of plasma device that generates plasma in the space between parallel plates using opposing parallel plate electrodes, a method using an inductively coupled plasma device that generates plasma in the space within a coil using an electromagnetic coil, and a device that collides gas particles imparted with high energy by a plasma field onto a substrate surface by accelerating with injection pressure of an electromagnetic field by primarily using an inductively coupled plasma gun (and this includes atmospheric pressure plasma devices of this type).

Among these, a method using a capacitive coupling type of plasma device enabling superior stability and uniform control of plasma density is preferable. In particular, a device having a cooling mechanism provided with water or other coolant pipes within the electrodes and in which the electrode that holds and immobilizes the substrate is also provided with a heat sink function is preferable, and is preferably able to effectively carry out cooling (heat dissipation) of the substrate, which undergoes a rise in temperature as a result an influx of heat and so forth from the contact surface with high energy plasma, by holding and immobilizing the polymer substrate in a state in which it makes surface contact with one of the parallel plate electrodes.

In addition, in the case the polymer substrate has a three-dimensional or two-dimensional shape or a curved shape, the electrode having the aforementioned heat sink function is preferably preliminarily processed into a shape that matches the shape of the polymer substrate so as to afford surface contact therewith. In addition, metal attachments having various shapes corresponding to the shape of each substrate are processed and prepared so as to be able to adapt to numerous types of substrate shapes, and can preferably be attached and removed corresponding to substrate shape.

Furthermore, a material that is resistant to corrosion and degenerative corrosion attributable to plasma is preferable for the material of the metal used for the electrodes, and examples thereof include stainless steel (SUS) and aluminum.

In a capacitive coupling type of plasma device, an external electrode type, in which high-frequency electrodes are installed outside the vacuum chamber (reaction vessel), or an internal electrode type, in which high-frequency electrodes are installed inside the vacuum chamber (reaction vessel), can be used.

Although a high-frequency power supply is used to input high-frequency electrical power, the frequency thereof is a frequency designated as an industrial frequency band according to the Radio Act, and although examples thereof include frequencies of 13.56 MHz, 27.12 MHz, 40.68 MHz, 85 MHz. 2.45 GHz, 5.8 GHz and 22.125 GHz, that having a frequency of 13.56 MHz can be used most commonly.

Although the applied power during input of high-frequency electrical power (to be referred to as high-frequency applied power) varies according to the type of raw material used and size of the PE-CVD device (size of the substrate), it is generally about 50 W to 10000 W. However, since many commercially available, commonly used power supplies have an applied power of 5000 W or less, input electrical power is preferably controlled to 5000 W or less.

Furthermore, although the high-frequency applied power is preferably applied continuously, a portion thereof may also be applied in the form of intermittent pulses as necessary.

The degree of vacuum of the vacuum chamber (reaction vessel) in terms of the ultimate vacuum of the vacuum chamber (reaction vessel) prior to carrying out each step is preferably $10^{-2}$ Pa or less and more preferably $10^{-3}$ Pa or less. In addition, the degree of vacuum when forming the silicon oxide layer by PE-CVD or during plasma bombardment treatment is preferably 20 Pa or less and more preferably 10 Pa or less from the viewpoints of stable continuation of plasma and ensuring uniformity, and is preferably typically $1 \times 10^{-2}$ Pa or more.

(Deposition Raw Materials and Conditions)

Organic silicon compounds containing a carbon atom or organic silicon compounds containing a carbon atom, oxygen atom or nitrogen atom are preferable for the raw material organic silicon compound used during formation of the silicon oxide layer by PE-CVD, and more specifically, an organosiloxane, organosilane or (organo)silazane and the like can be used preferably.

Specific examples of organic silicon compounds that can be used include tetramethoxysilane, vinyltrimethoxysilane, octamethylcyclotetrasiloxane, tetraethoxysilane, hexamethylcyclotrisiloxane, octamethyltrisiloxane, hexamethyldisiloxane, hexaethyldisiloxane, hexaethylcyclotrisiloxane, tetramethylsilane, 1,1,3,3-tetramethyldisiloxane, 1,1,3,3-tetramethyldisilazane, pentamethyldisiloxane, hexamethyldisilazane, heptamethyldisilazane, 1,3-dimethoxytetramethyldisiloxane, 1,3-diethoxytetramethyldisiloxane, hexamethylcyclotrisilazane, 1,1,3,3,5,5-hexamethyltrisiloxane, 1,1,1,3,5,5,5-heptamethyltrisiloxane, 1,3,5,7-tetramethylcyclotetrasiloxane, 1,1,1,3,5,7,7,7-octamethyltetrasiloxane, 1,1,3,3,5,5,7,7-octamethylcyclotetrasilazane, 1,3,5,7-tetramethylcyclotetrasiloxane, tris(trimethylsiloxy)silane and tetramethyltetrasiloxane.

One type of these organic silicon compounds can be used alone or two more types can be used in combination. In addition, a gas such as oxygen, nitrogen, argon, helium or hydrogen (to be referred to as carrier gas) is preferably used in combination for the purpose of promoting decomposition and condensation of these organic silicon compounds in a gaseous plasma composition or control the chemical composition of the silicon oxide layer formed (represented by SiOxCyHz). The organic silicon compound and carrier gas can be preliminarily mixed and then supplied to the vacuum reaction vessel of the plasma polymerization device, or can be separately supplied to this vacuum reaction vessel and then mutually mixed therein.

In the case of using oxygen for the carrier gas, although the ratio of oxygen to organic silicon compound cannot be universally defined since it varies according to the type of organic silicon compound used and desired chemical composition and film thickness of the silicon oxide layer, it is suitably selected from a range of about 5 times to 500 times, and more preferably about 10 times to 100 times, the volume of a water vapor of the organic silicon compound.

Although it is difficult to universally define a preferable range for the gas flow rate, high-frequency applied power and distance between electrodes during deposition since they are dependent on such factors as the areas of the substrate and electrodes, volume of the vacuum chamber and shape of the substrate, in the case of, for example, a flat substrate and converting to a substrate area in square meters, the total gas flow rate combining the raw material organic silicon compound and the carrier gas is generally within the range of about 1000 sccm to 5000 sccm, the high-frequency applied power is preferably controlled to within a range of about 2 KW to 7 KW and more preferably 3 KW to 5 KW, and the distance between electrodes is preferably controlled to about 80 mm to 300 mm.

Deposition time of the silicon oxide layer is preferably within the range of about 1 minute to 30 minutes, more preferably about 2 minutes to 20 minutes, and even more preferably about 3 minutes to 10 minutes. Furthermore, deposition can be divided into separate deposition times as necessary, mutually partitioned with a partition wall, or deposition may be carried out separately in a plurality of vacuum chambers capable of being interconnected by an inline system and the like.

In addition, in the silicon oxide layer deposition step, the flow rates of the raw material organic silicon compound and carrier gas and/or the high-frequency applied power and frequency and the like are preferably changed over time as necessary. Each flow rate, high-frequency applied power and frequency may be changed independently or simultaneously.

Figure 1:
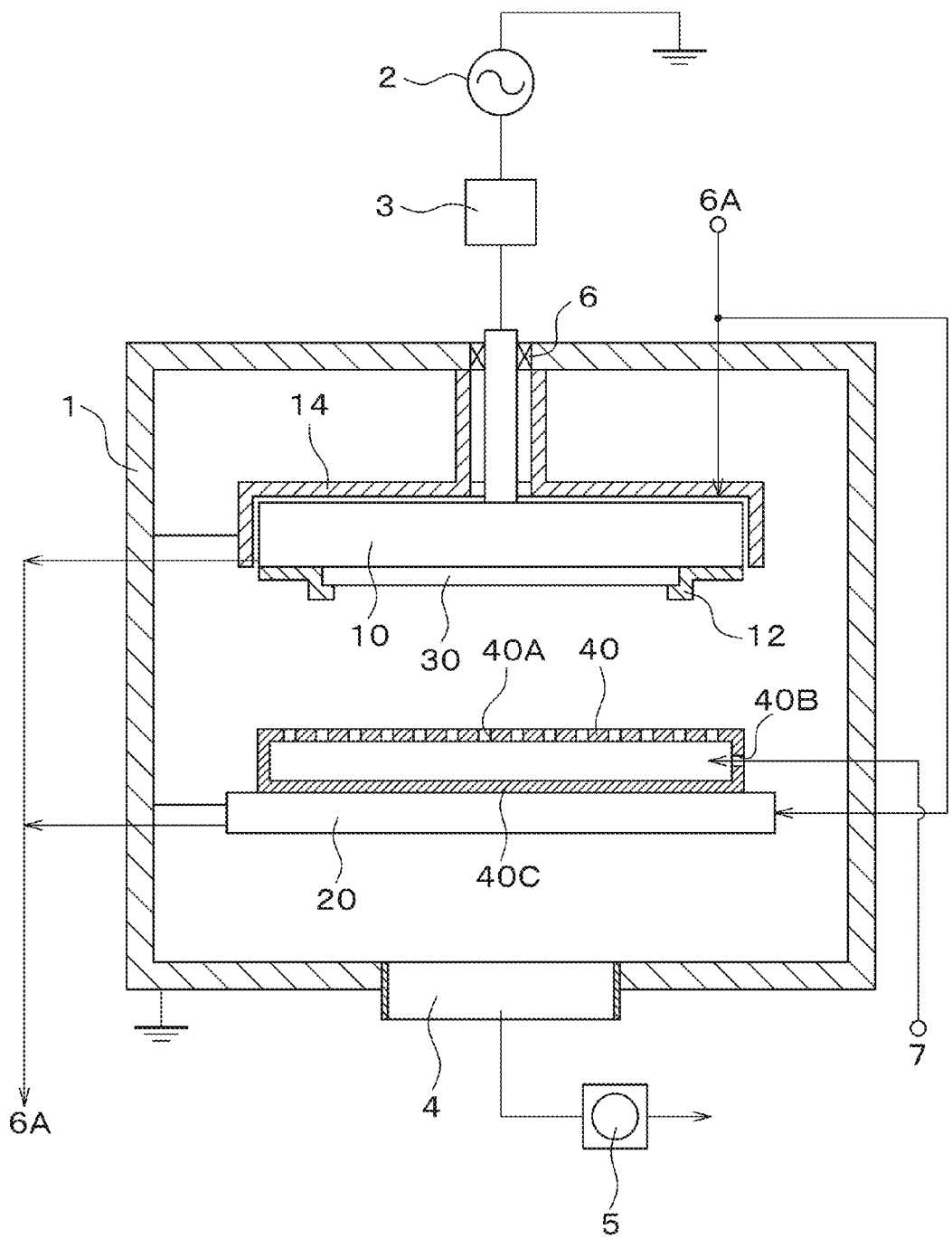
FIG. 1 is a schematic diagram of one example of a capacitive coupling type of PE-CVD device able to be used to form the silicon oxide layer of the present invention by PE-CVD.

FIG. 1 shows one example of a capacitive coupled type of CVD device able to be preferably used to form the polymer substrate with hard coating layer of the present invention. Furthermore, in this drawing, although a first electrode 10, a second electrode 20, a treated substrate 30 and an introducing head 40 are arranged in the vertical direction, they can also be arranged in a row in the horizontal direction.

In the example shown in this drawing, the first electrode (cathode electrode) 10 and the second electrode (anode electrode) 20 are arranged in mutual opposition within a vacuum vessel. A treated substrate in the form of a polymer substrate 30 is arranged on the surface of the first electrode 10 and supported by a holder 12. The inside of the vacuum vessel 1 is reduced in pressure by a vacuum pump 5 through an exhaust port 4, and while reaction gas 7 is introduced into the vacuum vessel 1 though the introducing head 40 from the outside, plasma of the reaction gas is formed between the first electrode (cathode electrode) 10 and the second electrode (anode electrode) 20.

The first electrode (cathode electrode) 10 is connected to a power supply 2 through a matching box 3. The first electrode 10 is insulated from the vacuum vessel 1 by an insulating seal 6. In addition, although not in detail in the drawing, a cooling medium 6A flows through the first electrode (cathode electrode) 10, and the polymer substrate 30 is cooled by cooling and dissipating heat through the interface between the first electrode 10 and the polymer substrate 30. Moreover, a shielding component 14 is provided at a slight interval on the outer periphery of the first electrode (cathode electrode) 10 with the exception of the surface opposing the second electrode (anode electrode) 20. In addition, the second electrode (anode electrode) 20 is grounded.

Figure 3:
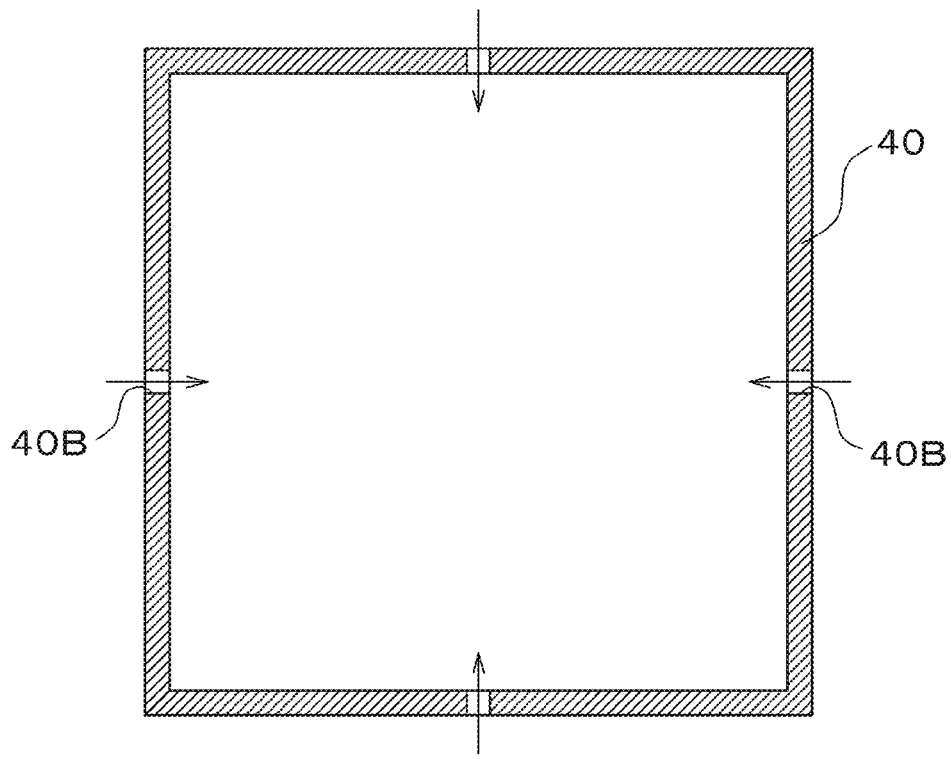
FIG. 3 shows an example of a reactive gas introducing head provided on an electrode in a capacitive coupling type of PE-CVD device able to form the silicon oxide layer of the present invention by PE-CVD, with (a) depicting a horizontal cross-sectional view and (b) indicating the arrangement (example) of a large number of gas blowout holes provided in a surface on the side opposing a treated substrate.
Figure 3:
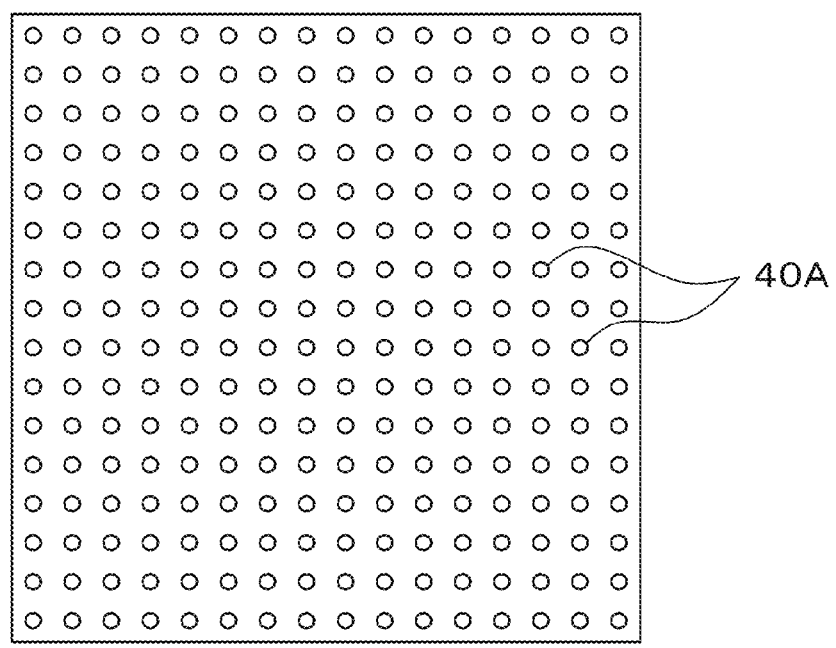

In the example shown in this drawing, a box-shaped introducing head 40 for introducing the reaction gas 7 is provided between the treated substrate in the form of the polymer substrate 30 and the second electrode (anode electrode) 20. As indicated with one example of the shape thereof in FIG. 3, the introducing head 40 has a large number of gas blowout holes 40A in the wall surface on the side opposing the first electrode (cathode electrode) 10, and the reaction gas 7 is introduced into the introducing head 40 through inlets 40B. The introducing head 40 is configured so that the reaction gas 7 that has been introduced into the introducing head 40 is blown out from the blowout holes 40A onto a side of the first electrode (cathode electrode) 10, namely towards the polymer substrate 30 held on the surface of the first electrode (cathode electrode) 10.

Although the introducing box is preferably in the shape of a flat box, the specifications thereof are not limited to those shown in the drawing, but rather the shape of the box and the shape, size, formation density, interval or distribution and the like of the blowout holes 40A can be adjusted as desired according to the shape and dimensions of the treated substrate in the form of the polymer substrate 30. However, in the case of a large number of the blowout holes 40A, the introducing head is preferably circular having a diameter of about 2 mm to 7 mm, and the interval between holes (pitch) is preferably about 4 mm to 20 mm.

In the case the polymer substrate has a two-dimensional, three-dimensional or curved shape, the space between the polymer substrate and the electrode on which the polymer substrate is held and immobilized preferably ensures surface adhesion whenever possible, and a gap is preferably prevented from being formed between the two. This is due to the need for cooling the polymer substrate, plasma uniformity and stability, and if a prominent gap is present, there are many cases in which problems such as a significant rise in the temperature of the polymer substrate or the occurrence of abnormal discharge in the plasma space are actualized, thereby making this undesirable. Thus, at least the shape of the electrode on the side on which the polymer substrate is held and immobilized preferably matches the shape of the polymer substrate and is formed to a similar shape.

Figure 2:
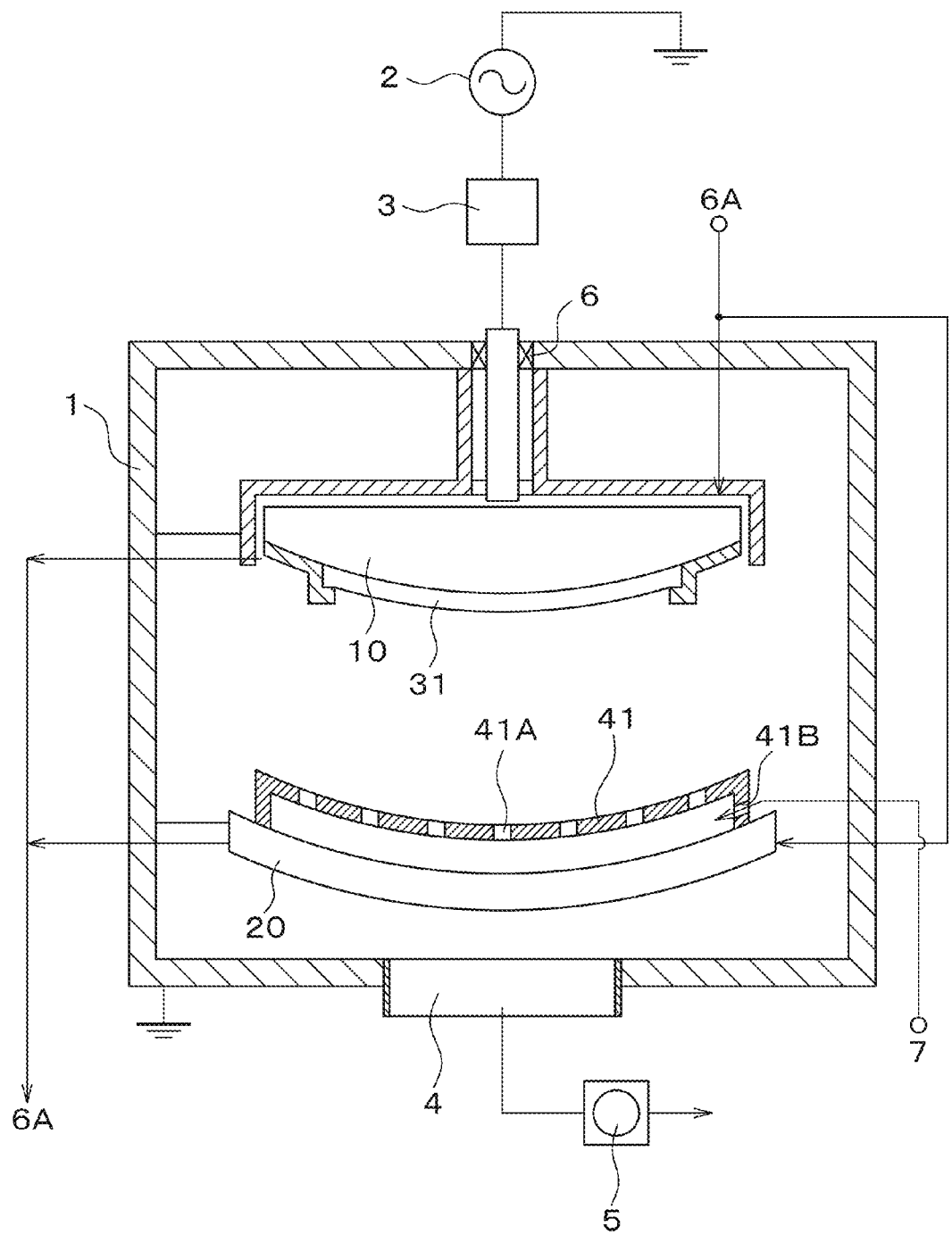
FIG. 2 is a schematic diagram of another example of a capacitive coupling type of PE-CVD device able to be used to form the silicon oxide layer of the present invention by PE-CVD.

FIG. 2 shows another example of a capacitive coupled type of CVD device that can be preferably used to form the polymer substrate with hard coating layer of the present invention, and indicates an example of the specifications of a preferable device in the case the treated substrate in the form of the polymer substrate 30 has a curved shape.

In the example shown in this drawing, the first electrode (cathode electrode) 10, the second electrode (anode electrode) 20 and an introducing head 41 each have a curved shape similar to the curved shape of a polymer substrate 31. In the case of adopting such a configuration, the density distribution of the reaction gas 7 and the uniformity of the distribution of high-frequency electrical power (spatial electrical field, spatial current) are enhanced in the plasma reaction space interposed between the polymer substrate 30 on the first electrode (cathode electrode) 10 and the introducing head 41 on the second electrode (anode electrode) 20, thereby making this preferable.

<Lamination of Functional Layers>

In the polymer substrate with hard coating layer of the present invention, a functional layer such as fouling prevention layer or antistatic layer may be further laminated on a surface layer, electrically conductive layer or silicon oxide layer obtained by PE-CVD formed on an infrared absorbing/reflecting layer on one side or both sides thereof as necessary.

A fouling prevention layer is a layer having a function that inhibits the adhesion of fingerprints or dirt to the silicon oxide layer obtained by PE-CVD or the formation of scale based on long-term use in an outdoor environment, and is a layer having an effect that continuously enhances surface water repellency, oil repellency, hydrophilicity or lipophilicity over a long period of time according to the particular objective. This layer is preferably formed into a thin film having a thickness of several nanometers to several hundred nanometers, and specific examples of the effects thereof include water repellency and/or oil repellency demonstrated by a layer obtained by decomposing and condensing a silicon compound having a fluoroalkyl group, and hydrophilicity and/or lipophilicity demonstrated by a titanium oxide layer, zinc oxide layer, niobium oxide layer or cerium oxide layer. With respect to the latter hydrophilic and/or lipophilic layer in particular, in the case of a layer having a photocatalytic function that acts as an oxidation-reduction catalyst when excited by ultraviolet light or light in the visible light region, a self-cleaning effect is obtained that enables dirt adhered to the outermost surface to be degraded and washed off due to the combined actions of sunlight and rain in an outdoor environment, thereby making this preferable.

In addition, examples of an antistatic layer (layer having electrical conductivity) include transparent electrically conductive layers (such as ITO or IZO) composed of metal oxides having indium oxide, tin oxide or zinc oxide and the like as a main component thereof, and transparent electrically conductive layers obtained by dispersing an electrically conductive material such as a metal, metal oxide or carbon in a layer obtained by hydrolytic condensation of an organic silicon compound.

In addition, examples of an electrically conductive layer include a layer obtained by printing the aforementioned transparent electrically conductive layer, an electrically conducive paste obtained by dispersing silver, copper or other metal fine particles having superior electrical conductivity in a resin binder, and a layer formed by mechanically punching out a metal thin plate or metal foil or forming an electrically conductive pattern by chemical etching, and can also be used as a heating layer based on the application of current to the electrically conductive layer (in order to remove fogging or frost caused by water vapor having condensed on a laminate surface) or as an antenna for transmitting and receiving radio waves or as an electromagnetic wave shielding layer.

Furthermore, the antistatic layer or electrically conductive layer are not necessarily required to be formed on the outermost surface, but rather may be formed on the polymer substrate, adhesive layer or cured underlayer and the like, and the adhesive layer and/or cured underlayer and/or silicon oxide layer obtained by PE-CVD may be further laminated following the formation thereof. In addition, the electrically conductive layer may be integrally formed with the polymer substrate when molding the polymer substrate by a method such as insert molding or in-mold transfer.

<Annealing of Polymer Substrate with Hard Coating Layer>

The polymer substrate with hard coating layer of the present invention may be further subjected to thermal annealing as necessary for the purpose of relieving internal strain and further promoting crosslinking and curing of each laminated layer after the silicon oxide layer obtained by PE-CVD has been laminated as necessary. Although annealing treatment may be carried out at vacuum pressure or normal pressure, it is generally preferably carried out within the range of 60° C. to 130° C. Although varying according to the treatment temperature, treatment time is preferably roughly 10 minutes to 48 hours.

<Method for Preparing Polymer Substrate with Hard Coating Layer>

In the polymer substrate with hard coating layer of the present invention, according to the target application as previously described, a silicon oxide layer is formed on a surface layer on one or both sides using PE-CVD capable of forming a hard coating layer having high hardness similar to that of inorganic glass so that the increase in haze value ($\Delta H$) on a surface laminated with the hard coating layer is 2% or less in a Taber abrasion test using a CS-10F abrading wheel at a load of 4.9 N and test rotating speed of 1000 revolutions.

<Haze Value of Polymer Substrate with Hard Coating Layer>

The initial haze value (referring to prior to carrying out an abrasion resistance test or environmental resistance test and the like) of the polymer substrate with hard coating layer of the present invention is preferably 1.0% or less, more preferably 0.8% or less and even more preferably 0.6% or less in the case of using in an application requiring a high level of visibility such as an automobile window. This is because, if the haze value exceeds 1.0%, images seen there through become indistinct resulting in cases in which this presents a problem in terms of driving (safety standards for automobile window materials may require a haze value of 1.0% or less depending on the country).

<Visible Light Transmittance of Polymer Substrate with Hard Coating Layer>

Visible light transmittance of the polymer substrate with hard coating layer of the present invention is preferably 70.0% or more in the case of using in an application requiring a high level of visibility such as an automobile window. Here, visible light transmittance refers to the transmittance of all light in the visible wavelength range with respect to a C light source or C65 light source, and although varying according to the application, is generally more preferably 75% or more, even more preferably 80% or more and most preferably 85% or more.

Furthermore, the polymer substrate with hard coating layer of the present invention may also be colored as necessary, and can be colored green, gray or various other colors. Although this coloring is typically carried out by suitably mixing pigments or dyes, these pigments or dyes may be mixed into the polymer substrate or mixed into a coating layer laminated on the polymer substrate.

<Accelerated Weather Resistance of Polymer Substrate with Hard Coating Layer>

The polymer substrate with hard coating layer of the present invention preferably demonstrates a prescribed level of performance or better in an accelerated weather resistance test as related to resistance to the external environment (such as with respect to ultraviolet light, temperature changes or humidity changes and the like) over a long period of time. More specifically, in the case of carrying out an exposure test for 8000 hours under conditions consisting of UV irradiation intensity of 180 W/m$^2$, black panel temperature of 63° C. and rainfall for 18 of 120 minutes using the SX-75 Suga Xenon Weather Meter manufactured by Suga Test Instruments Co., Ltd., there are no decreases in appearance or adhesion observed, and the duration is more preferably 10000 hours or more.

<Abrasion Resistance of Polymer Substrate with Hard Coating Layer>

With respect to abrasion resistance comparable to that of inorganic glass, required abrasion resistance for windows used at sites requiring visibility during driving with reference to, for example, U.S. safety standard FMVSS205 or European safety standard ECE R43 is an increase in haze value (ΔH) of less than 2% and/or 2% or less as determined by a Taber abrasion test carried out for 1000 revolutions in accordance with ASTM D1044.

<Boiling Water Resistance and Adhesion of Polymer Substrate with Hard Coating Layer>

An adhesion test was carried out according to the crosscut tape method in compliance with JIS K5400 after immersing the polymer substrate with hard coating in boiling water at 100° C. and retaining in the boiling water for 3 hours followed by removing from the boiling water, removing any adhered moisture, and allowing to stand in a room temperature environment for 2 hours. The crosscut tape test is carried out by forming 10×10 squares cut out at 1 mm intervals with a cutter knife in the form of a grid followed by affixing and adhering tape having a prescribed adhesive force (such as Nichiban Cellophane Taper™) and then peeling off the tape. The result for adhesion immediately after carrying out the crosscut tape test (state in which the layer is peeled or separated from the surface) was designated as the "initial result", while the result obtained after the passage of 7 days after carrying out the crosscut tape test was designated as the "elapsed result", and adhesive performance and the reliability thereof were judged to be favorable only in the case not only the "initial result", but also the "elapsed result" was favorable.

This is because there are many cases in which internal stress (and frequently compressive force) generated during layer formation remains in the silicon oxide layer obtained by PE-CVD, and due to the action thereof, there are cases observed in which layer separation is observed to occur over time. On the basis thereof, in terms of ensuring long-term reliability of environmental resistance of the polymer substrate with hard coating layer of the present invention, both a favorable "initial result" and a favorable "elapsed result" are required.

EXAMPLES

The following clarifies the effects of the present invention while indicating examples and comparative examples thereof.

Furthermore, although examples of the silicon oxide layer obtained by PE-CVD being laminated only on one side of the surface layer are indicated in the present examples and comparative examples, a configuration in which the silicon oxide layer is laminated on both sides may also be preferably carried out without incident.

[Evaluation Methods]

Various evaluations in the examples and comparative examples were carried out according to the methods indicated below.

<Measurement of Maximum Indentation Depth, Indentation Hardness and Depression Elastic Modulus by Nanoindentation>

Maximum indentation depth ($h_{max}$), indentation hardness ($H_{IT}$) and indentation elastic modulus ($E_{IT}$) were determined by measuring a loading and unloading curve (force curve) under conditions of a maximum load of 1 mN, load steps of 4 μN, 250 step divisions, loading time of 20 sec, unloading time of 20 sec and maximum load retention time of 0.4 sec using the ENT-2100 Nanoindentation Hardness Tester manufactured by Elionix Inc. and a triangular pyramidal indenter having an apex angle of 65 degrees (crest interval: 115 degrees), followed by calculating in compliance with ISO14577-1 2002-10-01 Part 1 (using device internal software). Furthermore, measurements were carried out at 10 different locations followed by taking the average value thereof.

Furthermore, since the shape of the end of the triangular pyramidal indenter changes due to variations in the processing thereof and wear caused by use thereby resulting in variations and uncertainty in measured values, confirmatory work or corrective work is preferably carried out prior to measuring samples.

Confirmatory work is carried out by measuring a commercially available silicon wafer under the aforementioned test conditions, confirming that maximum indentation depth is within the range of 55±3 nm, and replacing the triangular pyramidal indenter with a new one in the case of outside that range (this method is employed in the case of measuring using the ENT-1100 tester manufactured by Elionix Inc.).

In addition, corrective work can be carried out by measuring a fused quartz plate as a reference sample and calculating the value with internal software of the aforementioned tester (due to the configuration of the software, this method can only be used in the of measuring using the ENT-2100 tester manufactured by Elionix Inc.).

<Measurement of Surface Roughness (Ra) and Specific Surface Area Using Scanning Probe Microscope with Dynamic Force Mode (DFM)>

Surface roughness (Ra) and surface area ratio were determined by measuring using the SPI3800N scanning probe microscope manufactured by SII Nanotechnology Inc. (and distributed by Hitachi High-Tech Science Corp.) and the NSG10 silicon cantilever (equipped with a tip having a radius of curvature of about 10 nm) for the cantilever under conditions of a measuring range of 5 μm×5 μm in the vertical and horizontal directions, measuring 256×256 measurement points and a scanning frequency of 1 KHz followed by calculating the results with device internal software. Furthermore, measurements were carried out at 10 different locations followed by taking the average value thereof.

Here, surface roughness (average surface roughness, Ra) is a value obtained by averaging the absolute value of the difference of height from a reference surface to a designated surface (Z coordinate). Here, the reference surface is a surface containing the average value of the Z coordinates of all measurement points, while the designated surface is a surface that connects the Z coordinates of all measurement points (having for a unit surface thereof a triangle formed by connecting the closest 3 points).

In addition, surface area ratio is the ratio of the area of the designated surface (measurement surface) to the area of the reference surface (flat surface where Z coordinates are constant).

<Measurement of Infrared Absorbance>

Infrared absorbance was measured based on the ATR mode for each of the wave numbers at 930 cm$^{-1}$, 1020 cm$^{-1}$, 1065 cm$^{-1}$ and 1280 cm$^{-1}$ by measuring within a range of 650 cm$^{-1}$ to 1500 cm$^{-1}$ with the ATR mode (ATR attachment, Ge crystal) of a Fourier transform infrared spectrometer manufactured by Thermo Fisher Scientific Inc.

Here, infrared absorbance $\alpha$ is represented by $\alpha=-\text{Log } T/100$ (wherein, T represents the infrared transmittance of the sample). However, infrared absorbance $\alpha_K$ of each wave number is corrected by subtracting the following baseline values $\alpha_B$ from the value on this absorbance spectrum from 650 cm$^{-1}$ to 1500 cm$^{-1}$.

Baseline $\alpha_{B930}$ at a wave number of 930 cm$^{-1}$ =

$$\alpha_{1330} + (\alpha_{1330} - \alpha_{1430})/100 \times (1330 - 930) = \alpha_{1330} + (\alpha_{1330} - \alpha_{1430}) \times 4$$

Baseline $\alpha_{B1020}$ at a wave number of 1020 cm$^{-1}$ =

$$\alpha_{1330} + (\alpha_{1330} - \alpha_{1430})/100 \times (1330 - 1020) =$$
$$\alpha_{1330} + (\alpha_{1330} - \alpha_{1430}) \times 3.1$$

Baseline $\alpha_{B1065}$ at a wave number of 1065 cm$^{-1}$ =

$$\alpha_{1330} + (\alpha_{1330} - \alpha_{1430})/100 \times (1330 - 1065) =$$
$$\alpha_{1330} + (\alpha_{1330} - \alpha_{1430}) \times 2.65$$

Baseline $\alpha_{B1280}$ at a wave number of 1280 cm$^{-1}$ = $(\alpha_{1260} + \alpha_{1300})/2$ <Measurement of Film Thickness>

The film thickness of each layer is preferably measured by according to a known optical interference method based on the optical interference pattern appearing in the transmission spectrum or reflection spectrum measured over a wavelength range of, for example, 450 nm to 650 nm and the refractive index of each layer. However, in the case of an absence of any difference in the refractive index of each layer or in the case the optical interference pattern is ambiguous due to the presence of disturbances (surface irregularities) in a layer interface thereby making measurement difficult, an alternative measurement method may be employed that is based on observing the cross-section of the polymer substrate with hard coating layer with a scanning electron microscope. In either case, measurements are carried out at 5 different locations followed by taking the average value thereof. Furthermore, the refractive index of each layer is measured with an Abbe refractometer and the like.

<Measurement of Critical Compression Ratio>

The value of critical compression ratio K of the silicon oxide layer as defined in the following formula (1) is determined in a 3-point bending test that imparts indentation displacement in which the surface laminated with the silicon oxide layer becomes concave.

$$K=(R-D/2)/R-(0.00215 \times d)$$

$$R=((G/2)^2-(\delta L)^2)/(2 \times \delta L) \quad \text{Formula (1)}$$

In the schematic diagram of a 3-point bending test indicated in FIGS. 6, 7 and 9, D represents the total thickness (mm) of the polymer substrate with hard coating layer, d represents the film thickness (μm) of the silicon oxide layer, G represents the distance (mm) between two end fulcrum points in a 3-point bending tester, $\delta L$ and R respectively represent indentation displacement (mm) measured when the silicon oxide layer begins to separate from a cut line (separation starting line) drawn with a cutter knife in advance at the location of the central fulcrum point, and the bend radius (mm) of the polymer substrate with hard coating layer when subjected to 3-point bending deformation during a 3-point bending test.

With respect to the test dimensions, although a preferable example thereof consists of a test piece size measuring 25 mm on the short side and 130 mm on the long side and the distance between the two end fulcrum points of the 3-point bending tester being 100 mm, test dimensions are not limited thereto.

A cut line is formed in the direction perpendicular to the long side at a location nearly in the center relative to the long side in the surface laminated with the silicon oxide layer obtained by PE-CVD according to the procedure indicated in FIG. 8 prior to carrying out the 3-point bending test.

According to the 3-point bending test, the position of a test piece is adjusted so as to face in the direction in which compressive force is externally applied (increased) on the silicon oxide layer obtained by PE-CVD and so that the aforementioned cut line aligns with the central fulcrum point of 3-point bending, followed by placing the test piece on the 3-point bending tester.

With the central fulcrum point immobilized, external force is applied to the two end fulcrum points and the test piece is pushed down at a constant speed to carry out a 3-point bending test on the test piece. When the test piece has been pushed down to a certain point (when compression ratio has reached a certain value), separation of the silicon oxide layer obtained by PE-CVD begins with the aforementioned cut line as the starting line of separation. Furthermore, in the present example, the size of the test piece measured 25 mm on the short side and 130 mm on the long side, the distance between the two endpoints of the 3-point bending tester was 100 mm, and the pressing speed resulting from applying external force to the two endpoints was 0.5 mm/sec.

The value of critical compression ratio K is determined by calculating using formula (1) based on indentation displacement ($\delta L$) at the start of separation as previously described. A schematic diagram for explaining the calculation method is shown in FIG. 9.

In the case point A0 prior to bending displacement moves to point A1 following bending displacement after having applied an indentation load, the distance between the central fulcrum point and point A0 is G/2, the distance between the central fulcrum point and point A1 can be approximated as $K \times G/2$, and based on the correlation of the two triangles shown in FIG. 9, $G/2 : K \times G/2 = R-D/2$. As a result, critical compression ratio K is represented by $K=(R-D/2)/R$.

On the other hand, according to the Pythagorean theorem, since $R^2=(G/2)^2+(R-\delta L)^2$, R is represented by $R=((G/2)^2+(\delta L)^2)/(2 \times \delta L)$.

Furthermore, in formula (1), $(0.00215 \times d)$ is a correction term relating to film thickness of the silicon oxide layer obtained by PE-CVD.

Measurement of indentation depression ($\delta L$) is carried out with five or more test pieces having the same thickness as the silicon oxide layer obtained by PE-CVD sampled from different locations followed by taking the average value thereof.

<Appearance Evaluation>

The surface of the polymer substrate with hard coating layer having a silicon oxide layer obtained by PE-CVD was observed visually to confirm the presence or absence of cracks.

<Adhesion>

100 crosscuts were made at an interval of 1 mm with a cutter knife in the surface of the polymer substrate with hard coating layer having a silicon oxide layer obtained by PE-CVD followed by repeating three times a procedure consisting of adhering Nichiban adhesive tape thereto and forcibly peeling off the tape while pulling in the perpendicular direction and then evaluating adhesion in terms of the number of squares remaining on the substrate (in compliance with JIS K5400).

<Measurement of Total Light Transmittance and Haze Value>

Haze value was measured using the NDH2000 Haze Meter manufactured by Nippon Denshoku Industries Co., Ltd. Furthermore, haze value (H) is represented by H=Td/Tt×100 (Td: diffuse light transmittance, Tt: total light transmittance).

<Abrasion Resistance 1>

The surface of the polymer substrate with hard coating layer having a silicon oxide layer obtained by PE-CVD was evaluated using the CS-10F abrading wheel manufactured by Taber Industries Inc. by abrading the surface of the abrading wheel for 25 revolutions with S-11 sandpaper manufactured by Taber Industries Inc. prior to testing, followed by carrying out a Taber abrasion test for 1000 revolutions at a load of 500 g and measuring the change in haze value ($\Delta H$) before and after the Taber abrasion test (in compliance with ASTM D1044).

Measurements were carried out on three test pieces having the same specifications, and the average value thereof was used as the performance value of the sample. Furthermore, the abrasion test was carried out after confirming that the abrading wheel used in the test demonstrated a change in haze value ($\Delta H$) within the range of 0.6% to 1.0% in the case of having carried out the Taber abrasion test for 1000 revolutions by the same method on commercially available float glass (plate glass), and abrading wheels that were outside this range were not used in testing.

(Abrasion Resistance 2)

The surface of the polymer substrate with hard coating layer having a silicon oxide layer obtained by PE-CVD was evaluated by abrading the surface of an abrading wheel using the CS-10F abrading wheel manufactured by Taber Industries Inc. for 25 revolutions with the ST-11 grindstone manufactured by Taber Industries Inc. prior to testing, followed by carrying out a Taber abrasion test for 1000 revolutions at a load of 500 g and measuring the change in haze value ($\Delta H$) before and after the Taber abrasion test (in compliance with ASTM D1044).

Measurements were carried out on three test pieces having the same specifications, and the average value thereof was used as the performance value of the sample. Furthermore, the abrasion test was carried out after confirming that the abrading wheel used in the test demonstrated a change in haze value ($\Delta H$) within the range of 0.6% to 1.0% in the case of having carried out the Taber abrasion test for 1000 revolutions by the same method on commercially available float glass (plate glass), and abrading wheels that were outside this range were not used in testing.

<Boiling Water Resistance>

A test piece of the polymer substrate with hard coating layer cut to a size of 60 mm×120 mm was immersed in boiling water at 100° C. followed by removing from the boiling water after holding therein for 3 hours, removing any adhered moisture, and allowing to stand in a room temperature environment for 2 hours followed by confirming any appearance changes and testing adhesion of the surface of the polymer substrate with hard coating layer having a silicon oxide layer obtained by PE-CVD.

Appearance was evaluated by confirming layer separation, formation of cracks, color tone and the presence or absence of changes in haze value.

Adhesion was evaluated by carrying out a crosscut tape test in compliance with JIS K5400, and after having formed 10×10 squares cut out at 1 mm intervals with a cutter knife in the form of a grid, tape having a prescribed adhesive force (such as Nichiban Cellophane Tape™) was affixed and adhered and then peeled off.

Furthermore, the result for adhesion immediately after carrying out the crosscut tape test (state in which the layer is peeled or separated from the surface) was designated as the "initial result", while the result obtained after the passage of 7 days after carrying out the crosscut tape test was designated as the "elapsed result". The polymer substrate with hard coating layer of the present invention is required to both have a favorable "initial result" and "elapsed result". Furthermore, adhesion can also be evaluated using a test piece of a size different from that indicated above.

<Water Resistance>

A test piece of the polymer substrate with hard coating layer cut to a size of 60 mm×120 mm was continuously immersed in a constant temperature water tank at 50° C., and after removing any adhered moisture and allowing to stand in a room temperature environment for 12 hours, confirmation of any changes in appearance and an adhesion test were carried out on the surface of the polymer substrate with hard coating layer having a silicon oxide layer obtained by PE-CVD.

Appearance and adhesion were evaluated in the same manner as the aforementioned boiling water resistance. The polymer substrate with hard coating layer of the present invention is required to both have a favorable "initial result" and "elapsed result".

<Heat Resistance>

A test piece of the polymer substrate with hard coating layer cut to a size of 60 mm×120 mm was held in a constant temperature tank at 110° C. followed by evaluating appearance changes and adhesion of the polymer substrate with hard coating layer having a silicon oxide layer obtained by PE-CVD 1000 hours later.

<Accelerated Weather Resistance>

An exposure test was carried out for 8000 hours under conditions consisting of UV irradiation intensity of 180 W/m$^2$, black panel temperature of 63° C. and rainfall for 18 of 120 minutes using the SX-75 Suga Xenon Weather Meter manufactured by Suga Test Instruments Co., Ltd., and after removing the test piece and gently scrubbing the surface of the polymer substrate with hard coating layer having a silicon oxide layer obtained by PE-CVD with a sponge soaked with a neutral detergent, the test piece was evaluated for appearance, adhesion, and changes in color ($\Delta E$) and haze value ($\Delta H$) before and after testing.

Furthermore, during the exposure test, the test piece was removed every 1000 hours and the surface was gently scrubbed with a sponge soaked with a neutral detergent. Measurement of color difference ($\Delta E$) was carried out using the SE-2000 Spectral Colorimeter manufactured by Nippon Denshoku Industries Co., Ltd.

[Preparation of Precursor Materials for Preparing Polymer Substrate with Hard Coating Layer]

<Preparation of Precursor Material Solution of Adhesive Layer>

79.9 parts by weight of ethyl methacrylate (EMA), 33.6 parts by weight of cyclohexyl methacrylate (CHMA), 13.0 parts by weight of 2-hydroxyethyl methacrylate (HEMA), 126.6 parts by weight of methyl isobutyl ketone (MIBK) and 63.3 parts by weight of 2-butanol (2-BuOH) were added to and mixed in a flask provided with a reflux condenser and stirring device in which the internal atmosphere had been replaced with nitrogen. After deoxygenating the flask by passing nitrogen gas through the mixture for 15 minutes, the mixture was heated to 70° C. in the presence of flowing nitrogen gas followed by the addition of 0.33 parts by weight of azobisisobutyronitrile (AIBN) and allowing to react for 5 hours at 70° C. while stirring in the presence of flowing nitrogen gas. Moreover, 0.08 parts by weight of AIBN were further added followed by heating to 80° C. and reacting for 3 hours to obtain an acrylic copolymer solution having a non-volatile content concentration of 39.6% by weight. The weight average molecular weight of the acrylic copolymer as measured by GPC (column: Shodex GPCA-804, eluent: chloroform) was 125,000 as polystyrene.

Continuing, 43.2 parts by weight of MIBK, 21.6 parts by weight of 2-BuOH and 83.5 parts by weight of 1-methoxy-2-propanol were added to and mixed with 100 parts by weight of the aforementioned acrylic copolymer solution followed by adding 5.3 parts by weight of Tinuvin 400 (triazine-based ultraviolet absorber manufactured by Ciba Specialty Chemicals Inc.) and 10.6 parts by weight of Vestanat B1358/100 (polyisocyanate compound precursor manufactured by Degussa Japan Co., Ltd.) so that the amount of isocyanate groups was 1.0 equivalents based on 1 equivalent of hydroxyl groups of the acrylic polymer in the acrylic resin solution, and further adding 0.015 parts by weight of dimethyldineodecanoate (DMDNT) and stirring for 1 hour at 25° C. to prepare a precursor material solution of the adhesive layer having an acrylic copolymer resin as the main component thereof.

<Preparation of Precursor Material Solution of Cured Underlayer>

Preparation Example 1

80 parts by weight of a water-dispersible colloidal silicon liquid dispersion (Cataloid SN-30, particle diameter: approx. 17 nm, solid content concentration: 30% by weight, manufactured by Catalysts and Chemicals Industry Co., Ltd.) were added to 127 parts by weight of methyltrimethoxysilane while cooling in an ice bath. After stirring this mixture for 1 hour at 25° C., the reaction solution was cooled with ice water after stirring for 4 hours at 60° C. followed by mixing in 24 parts by weight of acetic acid and 2 parts by weight of a curing catalyst in the form of sodium acetate while cooling with ice water to obtain a precursor material composition (1) for forming the cured underlayer. Furthermore, the degree of aging of the precursor material composition (1) was 0.832.

Preparation Example 2

12 parts by weight of acetic acid were added to 80 parts by weight of a water-dispersible colloidal silicon liquid dispersion (Cataloid SN-30, particle diameter: approx. 17 nm, solid content concentration: 30% by weight, manufactured by Catalysts and Chemicals Industry Co., Ltd.) and stirred followed by the addition of 127 parts by weight of methyltrimethoxysilane to this liquid dispersion while cooling with ice water. After stirring this mixture for 1 hour at 30° C., the reaction solution was cooled with ice water after stirring for 8 hours at 60° C. and further mixing therein 2 parts by weight of a curing catalyst in the form of sodium acetate while cooling with ice water to obtain a precursor material composition (2) for forming the cured underlayer. Furthermore, the degree of aging of the precursor material composition (2) was 0.847.

Preparation Example 3

0.1 parts by weight of concentrated hydrochloric acid (12 M) were added to 100 parts by weight of a water-dispersible colloidal silicon liquid dispersion (Cataloid SN-30, particle diameter: approx. 17 nm, solid content concentration: 30% by weight, manufactured by Catalysts and Chemicals Industry Co., Ltd.) and stirred well. This liquid dispersion was then cooled to 10° C. followed by dropping in 161 parts by weight of methyltrimethoxysilane. The temperature of the reaction solution began to rise due to heat of the reaction immediately after adding the methyltrimethoxysilane, and rose to 60° C. within several minutes after the start of addition of the methyltrimethoxysilane. After reaching 60° C., the temperature of the reaction solution was gradually lowered while cooling in an ice bath. At the stage the temperature of the reaction solution reached 35° C., the reaction solution was stirred for 3 hours to maintain at this temperature, and after having mixed therein 0.8 parts by weight of a 45% by weight methanol solution of a curing catalyst in the form of choline and 5 parts by weight of a pH adjuster in the form of acetic acid, the mixture was stirred to uniformity to obtain a precursor material composition (3) for forming the cured underlayer. Furthermore, the degree of aging of the precursor material composition (3) was 0.808.

Preparation Example 4

12 parts by weight of acetic acid were added to 80 parts by weight of a water-dispersible colloidal silicon liquid dispersion (Cataloid SN-30, particle diameter: approx. 17 nm, solid content concentration: 30% by weight, manufactured by Catalysts and Chemicals Industry Co., Ltd.) and stirred followed by the addition of 127 parts by weight of methyltrimethoxysilane to this liquid dispersion while cooling with ice water. After stirring this mixture for 1 hour at 30° C., the reaction solution was cooled with ice water after stirring for 1 hour at 40° C. and further mixing therein 2 parts by weight of a curing catalyst in the form of sodium acetate while cooling with ice water to obtain a precursor material composition (4) for forming the cured underlayer. Furthermore, the degree of aging of the precursor material composition (4) was 0.787.

Preparation Example 5

12 parts by weight of acetic acid were added to 80 parts by weight of a water-dispersible colloidal silicon liquid dispersion (Cataloid SN-30, particle diameter: approx. 17 nm, solid content concentration: 30% by weight, manufactured by Catalysts and Chemicals Industry Co., Ltd.) and stirred followed by the addition of 127 parts by weight of methyltrimethoxysilane to this liquid dispersion while cooling with ice water. After stirring this mixture for 1 hour at 30° C., the reaction solution was cooled with ice water after stirring for 18 hours at 60° C. and further mixing therein 2 parts by weight of a curing catalyst in the form of sodium acetate while cooling with ice water to obtain a precursor material composition (5) for forming the cured underlayer. Furthermore, the degree of aging of the precursor material composition (5) was 0.872.

Preparation Example 6

56 g of tungsten acetate slurry (PCTR-2020 manufactured by Sumitomo Osaka Cement Co., Ltd., solid content concentration: 20% by weight) were diluted with 848 g of 2-propanol. The slurry was subjected to dispersion treatment using a bead mill. The particle diameter at 50% in the cumulative distribution and the particle diameter at 90% in the cumulative distribution as determined by measuring particle size distribution of the slurry subjected to dispersion treatment by laser diffraction were 44 nm and 75 nm, respectively.

Next, 0.1 part by weight of concentrated hydrochloric acid (12 M) were added to 100 parts by weight of a water-dispersible colloidal silicon liquid dispersion (Cataloid SN-30, particle diameter: approx. 17 nm, solid content concentration: 30% by weight, manufactured by Catalysts and Chemicals Industry Co., Ltd.) and stirred well. This liquid dispersion was then cooled to 10° C. followed by dropping in 161 parts by weight of methyltrimethoxysilane. The temperature of the reaction solution began to rise due to heat of the reaction immediately after adding the methyltrimethoxysilane, and rose to 60° C. within several minutes after the start of addition of the methyltrimethoxysilane. After reaching 60° C., the temperature of the reaction solution was gradually lowered while cooling in an ice bath. At the stage the temperature of the reaction solution reached 35° C., the reaction solution was stirred for 5 hours to maintain at this temperature, and after having mixed therein 0.8 parts by weight of a 45% by weight methanol solution of a curing catalyst in the form of choline and 5 parts by weight of a pH adjuster in the form of acetic acid, the mixture was stirred to uniformity to obtain a hydrolysis-condensation product of an organic silicon compound.

267 parts by weight of a solution of a partial condensate of an organic silicon compound were slowly mixed with 181 parts by weight of the titanium oxide slurry subjected to the aforementioned dispersion treatment by dropping followed by stirring well to obtain a precursor material solution (6) of the cured underlayer containing a hydrolysis-condensation product of an organic silicon compound as a main component thereof.

Furthermore, the degree of aging of the precursor material solution (6) was 0.815.

[Production of Polymer Substrate with Hard Coating Layer]

Example 1

A polycarbonate resin was charged into an injection press molding machine to obtain a transparent polycarbonate resin sheet of 550 mm square and having a thickness of 4 mm.

Using this polycarbonate resin sheet as a substrate, the aforementioned adhesive layer precursor material solution was coated on both sides thereof and dried followed by heat-curing for 1 hour at 120° C. to form an adhesive layer having a film thickness of about 8 μm on both sides of the polycarbonate substrate.

Continuing, the aforementioned cured underlayer precursor material composition (1) was dip-coated thereon and dried followed by heat-curing for 1 hour at 120° C. to laminate and form a cured underlayer having a film thickness of about 4 μm on both sides.

The polycarbonate resin substrate having an adhesive layer and cured underlayer formed on both sides thereof was placed in the capacitive coupling type of PE-CVD device shown in FIG. 1 on the side of the parallel plate electrode to which high-frequency electrical power is applied by tightly pressing against the electrode so that there were no gaps between the substrate and the electrode surface (reference number 30 in the drawing) followed by drawing a vacuum for 1 hour. The ultimate vacuum pressure was 0.03 Pa.

Next, argon gas (purity: 99.9% or more) was introduced into the system at 1200 sccm through a line equipped with a mass flow controller followed by applying high-frequency electrical power of 13.56 MHz and 1.0 KW between parallel plate electrodes having cooling lines to generate plasma between the parallel plate electrodes. High-frequency electrical power was applied for a total of 600 seconds while in this state to carry out plasma bombardment treatment on one side of the cured underlayer.

Furthermore, following this plasma bombardment treatment, the substrate was removed outside the device without laminating a silicon oxide layer obtained by PE-CVD, and the results of measuring infrared absorbance of the surface of the cured underlayer subjected to plasma bombardment treatment as well as the results of measuring with a scanning probe microscope are shown in Table 1.

Following the aforementioned plasma bombardment treatment, the introduction of argon gas was discontinued and a step was carried out for forming a silicon oxide layer by PE-CVD.

More specifically, 1,3,5,7-tetramethylcyclotetrasiloxane (purity: 99.99% or more, abbreviated as D4H) at 10 sccm and oxygen (purity: 99.9% or more) at 300 sccm were introduced into the system through separate lines equipped with mass flow controllers followed by the application of high-frequency electrical power of 13.56 MHz and 1.5 KW between parallel plate electrodes through a matching box to generate plasma in the space between the parallel plate electrodes.

After applying high-frequency electrical power of 1.5 KW for 60 seconds at a D4H flow rate of 10 sccm and oxygen flow rate of 300 sccm, the flow rate of the D4H was continuously increased to 95 sccm for 40 seconds (with "continuously" referring to increasing at a constant rate per unit time) after which high-frequency electrical power was continuously decreased to 1.0 KW.

Here, the average deposition rate until 30 seconds after the start of formation of the silicon oxide layer by PE-CVD was 0.8 nm/sec.

After applying high-frequency electrical power of 1.0 KW for a total of 720 seconds at a D4H flow rate of 95 sccm and oxygen flow rate of 1350 sccm, the D4H flow rate continuously decreased to 0 sccm over the course of 30 seconds while holding the high-frequency electrical power at 1.0 KW followed by discontinuing the application of high-frequency electrical power. Furthermore, the oxygen flow rate was fixed at 1350 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 6.6 μm. In addition, the maximum temperature of the substrate surface on the side laminated with the silicon oxide layer by PE-CVD was about 110° C. throughout the plasma bombardment treatment step and silicon oxide layer lamination step by PE-CVD.

The results of evaluating the performance of the polymer substrate with hard coating layer along with the physical properties of each layer are shown in Table 1. The results of evaluating the performance of the polymer substrates with hard coating layer obtained in each of the examples in the same manner as Example 1 along with the physical properties of each layer are also shown in Table 1. Furthermore, the physical property values of the cured underlayer shown in the table are the physical property values at the stage immediately prior to deposition and formation of the silicon oxide layer by PE-CVD after having carried out plasma bombardment treatment on that same layer.

Example 2

A polymer substrate with hard coating layer was formed in the same manner as Example 1 with the exception of using the cured underlayer precursor material composition (2) instead of the cured underlayer precursor material composition (1) used in Example 1.

Example 3

A polymer substrate with hard coating layer was formed in the same manner as Example 1 with the exception of using the cured underlayer precursor material composition (3) instead of the cured underlayer precursor material composition (1) used in Example 1.

Example 4

A polymer substrate with hard coating layer was formed in the same manner as Example 1 with the exception of using the cured underlayer precursor material composition (6) instead of the cured underlayer precursor material composition (1) used in Example 1.

Example 5

A polymer substrate with hard coating layer was formed in the same manner as Example 4 with the exception of changing the plasma bombardment treatment time in Example 4 to 120 seconds.

Example 6

A polymer substrate with hard coating layer was formed in the same manner as Example 4 with the exception of forming the silicon oxide layer obtained by PE-CVD in Example 4 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 95 sccm and the oxygen flow rate was continuously increased to 1700 sccm over the course of 40 seconds, and high-frequency electrical power was continuously decreased to 1.0 KW.

After applying high-frequency electrical power of 1.0 KW for a total of 840 seconds at a D4H flow rate of 95 sccm and oxygen flow rate of 1700 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 1700 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 8.3 μm. In addition, the maximum temperature of the substrate surface on the side laminated with the silicon oxide layer by PE-CVD was about 115° C. throughout the plasma bombardment treatment step and silicon oxide layer lamination step by PE-CVD.

Example 7

A polymer substrate with hard coating layer was formed in the same manner as Example 4 with the exception of forming the silicon oxide layer obtained by PE-CVD in Example 4 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 70 sccm and the oxygen flow rate was continuously increased to 1500 sccm over the course of 40 seconds, and high-frequency electrical power was continuously decreased to 1.0 KW.

After applying high-frequency electrical power of 1.0 KW for a total of 800 seconds at a D4H flow rate of 70 sccm and oxygen flow rate of 1500 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 1500 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 5.5 In addition, the maximum temperature of the substrate surface on the side laminated with the silicon oxide layer by PE-CVD was about 115° C. throughout the plasma bombardment treatment step and silicon oxide layer lamination step by PE-CVD.

Example 8

A polymer substrate with hard coating layer was formed in the same manner as Example 4 with the exception of forming the silicon oxide layer obtained by PE-CVD in Example 4 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 95 sccm and the oxygen flow rate was continuously increased to 1700 sccm over the course of 40 seconds, and high-frequency electrical power was continuously decreased to 1.0 KW.

After applying high-frequency electrical power of 1.0 KW for a total of 500 seconds at a D4H flow rate of 95 sccm and oxygen flow rate of 1700 sccm, D4H flow rate was continuously decreased to 70 sccm and oxygen flow rate to 1250 sccm over the course of 60 seconds while maintaining high-frequency electrical power at 1.0 KW.

After applying high-frequency electrical power of 1.0 KW for 160 seconds at a D4H flow rate of 70 sccm and oxygen flow rate of 1250 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 1250 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 6.5 μm. In addition, the maximum temperature of the substrate surface on the side laminated with the silicon oxide layer by PE-CVD was about 110° C. throughout the plasma bombardment treatment step and silicon oxide layer lamination step by PE-CVD.

Example 9

A polymer substrate with hard coating layer was formed in the same manner as Example 8 with the exception of forming the silicon oxide layer obtained by PE-CVD in Example 8 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 95 sccm and the oxygen flow rate was continuously increased to 1700 sccm over the course of 40 seconds, and high-frequency electrical power was continuously decreased to 1.1 KW.

After applying high-frequency electrical power of 1.1 KW for a total of 450 seconds at a D4H flow rate of 95 sccm and oxygen flow rate of 1700 sccm, D4H flow rate was continuously decreased to 70 sccm and oxygen flow rate to 1250 sccm over the course of 60 seconds while maintaining high-frequency electrical power at 1.1 KW.

After applying high-frequency electrical power of 1.1 KW for 160 seconds at a D4H flow rate of 70 sccm and oxygen flow rate of 1250 sccm, D4H flow rate was continuously decreased to 0 sccm over the course of 30 seconds while maintaining high-frequency electrical power at 1.1 KW followed by discontinuing the application of high-frequency electrical power. Furthermore, the oxygen flow rate was fixed at 1250 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 6.0 μm. In addition, the maximum temperature of the substrate surface on the side laminated with the silicon oxide layer by PE-CVD was about 115° C. throughout the plasma bombardment treatment step and silicon oxide layer lamination step by PE-CVD.

Example 10

A polymer substrate with hard coating layer was formed in the same manner as Example 8 with the exception of forming the silicon oxide layer obtained by PE-CVD in Example 8 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 95 sccm and the oxygen flow rate was continuously increased to 1700 sccm over the course of 40 seconds, and high-frequency electrical power was continuously decreased to 0.8 KW.

After applying high-frequency electrical power of 0.8 KW for a total of 500 seconds at a D4H flow rate of 95 sccm and oxygen flow rate of 1700 sccm, D4H flow rate was continuously decreased to 70 sccm and oxygen flow rate to 1250 sccm over the course of 60 seconds while maintaining high-frequency electrical power at 0.8 KW.

After applying high-frequency electrical power of 0.8 KW for 160 seconds at a D4H flow rate of 70 sccm and oxygen flow rate of 1250 sccm, D4H flow rate was continuously decreased to 0 sccm over the course of 30 seconds while maintaining high-frequency electrical power at 0.8 KW followed by discontinuing the application of high-frequency electrical power. Furthermore, the oxygen flow rate was fixed at 1250 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 6.6 μm. In addition, the maximum temperature of the substrate surface on the side laminated with the silicon oxide layer by PE-CVD was about 100° C. throughout the plasma bombardment treatment step and silicon oxide layer lamination step by PE-CVD.

Example 11

A polymer substrate with hard coating layer was formed in the same manner as Example 8 with the exception of forming the silicon oxide layer obtained by PE-CVD in Example 8 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 95 sccm and the oxygen flow rate was continuously increased to 1700 sccm over the course of 40 seconds, and high-frequency electrical power was continuously decreased to 1.1 KW.

After applying high-frequency electrical power of 1.1 KW for a total of 290 seconds at a D4H flow rate of 95 sccm and oxygen flow rate of 1700 sccm, D4H flow rate was continuously decreased to 70 sccm and oxygen flow rate to 1250 sccm over the course of 60 seconds while maintaining high-frequency electrical power at 1.1 KW.

After applying high-frequency electrical power of 1.1 KW for 160 seconds at a D4H flow rate of 70 sccm and oxygen flow rate of 1250 sccm, D4H flow rate was continuously decreased to 0 sccm over the course of 30 seconds while maintaining high-frequency electrical power at 1.1 KW followed by discontinuing the application of high-frequency electrical power. Furthermore, the oxygen flow rate was fixed at 1250 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 4.3 μm. In addition, the maximum temperature of the substrate surface on the side laminated with the silicon oxide layer by PE-CVD was about 105° C. throughout the plasma bombardment treatment step and silicon oxide layer lamination step by PE-CVD.

Reference Example 1

A polymer substrate with hard coating layer was produced in the same manner as Example 4 with the exception of changing the treatment time during plasma bombardment treatment used in Example 4 to 2000 seconds.

However, since the substrate surface temperature of this polymer substrate with hard coating layer during plasma bombardment treatment exceeded 150° C., considerable shape distortion attributable to heat distortion was observed and the appearance was poor, the substrate was judged to be unacceptable and was not evaluated for performance as a polymer substrate with hard coating layer.

Comparative Example 1

A polymer substrate with hard coating layer was attempted to be formed in the same manner as Example 1 with the exception of using the cured underlayer precursor material composition (4) instead of the cured underlayer precursor material composition (1) used in Example 1.

Furthermore, since cracks formed in a portion of the cured underlayer in this comparative example, only a portion of the parameters were evaluated for the resulting polymer substrate with hard coating layer.

Comparative Example 2

A polymer substrate with hard coating layer was formed in the same manner as Example 1 with the exception of using the cured underlayer precursor material composition (5) instead of the cured underlayer precursor material composition (1) used in Example 1.

Comparative Example 3

A polymer substrate with hard coating layer was formed in the same manner as Example 4 with the exception of formation of a silicon oxide layer by PE-CVD but not carrying out the plasma bombardment treatment carried out in Example 4.

Comparative Example 4

A polymer substrate with hard coating layer was formed in the same manner as Example 4 with the exception of carrying out the plasma bombardment treatment of Example 4 at high-frequency electrical power of 0.5 KW and changing the treatment time to 60 seconds.

Comparative Example 5

A polymer substrate with hard coating layer was formed in the same manner as Example 4 with the exception of forming the cured underlayer in Example 4 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 47 sccm and the oxygen flow rate was continuously increased to 670 sccm over the course of 40 seconds, and high-frequency electrical power was continuously decreased to 1.0 KW.

After applying high-frequency electrical power of 1.0 KW for a total of 1400 seconds at a D4H flow rate of 47 sccm and oxygen flow rate of 670 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 670 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 5.2 μm. In addition, the maximum temperature of the substrate surface on the side laminated with the silicon oxide layer by PE-CVD was about 125° C. throughout the plasma bombardment treatment step and silicon oxide layer lamination step by PE-CVD.

Comparative Example 6

A polymer substrate with hard coating layer was formed in the same manner as Example 4 with the exception of forming the cured underlayer in Example 4 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 47 sccm and the oxygen flow rate was continuously increased to 1330 sccm over the course of 40 seconds, and high-frequency electrical power was continuously decreased to 1.0 KW.

After applying high-frequency electrical power of 1.0 KW for a total of 1250 seconds at a D4H flow rate of 47 sccm and oxygen flow rate of 1330 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 1330 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 5.8 μm. In addition, the maximum temperature of the substrate surface on the side laminated with the silicon oxide layer by PE-CVD was about 120° C. throughout the plasma bombardment treatment step and silicon oxide layer lamination step by PE-CVD.

Comparative Example 7

A polymer substrate with hard coating layer was formed in the same manner as Example 4 with the exception of forming the cured underlayer in Example 4 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 47 sccm and the oxygen flow rate was continuously increased to 2000 sccm over the course of 40 seconds, and high-frequency electrical power was continuously decreased to 1.0 KW.

After applying high-frequency electrical power of 1.0 KW for a total of 1200 seconds at a D4H flow rate of 47 sccm and oxygen flow rate of 2000 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 2000 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 5.9 μm. In addition, the maximum temperature of the substrate surface on the side laminated with the silicon oxide layer by PE-CVD was about 110° C. throughout the plasma bombardment treatment step and silicon oxide layer lamination step by PE-CVD.

Comparative Example 8

A polymer substrate with hard coating layer was formed in the same manner as Example 4 with the exception of forming the cured underlayer in Example 4 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 70 sccm and the oxygen flow rate was continuously increased to 900 sccm over the course of 40 seconds, and high-frequency electrical power was continuously decreased to 1.0 KW.

After applying high-frequency electrical power of 1.0 KW for a total of 1050 seconds at a D4H flow rate of 70 sccm and oxygen flow rate of 900 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 900 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 5.6 μm. In addition, the maximum temperature of the substrate surface on the side laminated with the silicon oxide layer by PE-CVD was about 125° C. throughout the plasma bombardment treatment step and silicon oxide layer lamination step by PE-CVD.

Comparative Example 9

A polymer substrate with hard coating layer was formed in the same manner as Example 4 with the exception of forming the cured underlayer in Example 4 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 70 sccm and the oxygen flow rate was continuously increased to 3000 sccm over the course of 40 seconds, and high-frequency electrical power was continuously decreased to 1.0 KW.

After applying high-frequency electrical power of 1.0 KW for a total of 800 seconds at a D4H flow rate of 70 sccm and oxygen flow rate of 3000 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 3000 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 6.5 μm. In addition, the maximum temperature of the substrate surface on the side laminated with the silicon oxide layer by PE-CVD was about 95° C. throughout the plasma bombardment treatment step and silicon oxide layer lamination step by PE-CVD.

Comparative Example 10

A polymer substrate with hard coating layer was formed in the same manner as Example 4 with the exception of forming the cured underlayer in Example 4 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 95 sccm and the oxygen flow rate was continuously increased to 2700 sccm over the course of 40 seconds, and high-frequency electrical power was continuously decreased to 1.0 KW.

After applying high-frequency electrical power of 1.0 KW for a total of 550 seconds at a D4H flow rate of 95 sccm and oxygen flow rate of 2700 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 2700 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 6.5 μm. In addition, the maximum temperature of the substrate surface on the side laminated with the silicon oxide layer by PE-CVD was about 100° C. throughout the plasma bombardment treatment step and silicon oxide layer lamination step by PE-CVD.

Comparative Example 11

A polymer substrate with hard coating layer was formed in the same manner as Example 8 with the exception of forming the silicon oxide layer obtained by PE-CVD in Example 8 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 95 sccm and the oxygen flow rate was continuously increased to 1700 sccm over the course of 40 seconds, and high-frequency electrical power was continuously decreased to 0.6 KW.

After applying high-frequency electrical power of 0.6 KW for a total of 500 seconds at a D4H flow rate of 95 sccm and oxygen flow rate of 1700 sccm, D4H flow rate was continuously decreased to 70 sccm and oxygen flow rate to 1250 sccm over the course of 60 seconds while maintaining high-frequency electrical power at 0.6 KW.

After applying high-frequency electrical power of 0.6 KW for 160 seconds at a D4H flow rate of 70 sccm and oxygen flow rate of 1250 sccm, D4H flow rate was continuously decreased to 0 sccm over the course of 30 seconds while maintaining high-frequency electrical power at 0.6 KW followed by discontinuing the application of high-frequency electrical power. Furthermore, the oxygen flow rate was fixed at 1250 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 6.8 In addition, the maximum temperature of the substrate surface on the side laminated with the silicon oxide layer by PE-CVD was about 95° C. throughout the plasma bombardment treatment step and silicon oxide layer lamination step by PE-CVD.

Comparative Example 12

A polymer substrate with hard coating layer was formed in the same manner as Example 8 with the exception of forming the silicon oxide layer obtained by PE-CVD in Example 8 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 95 sccm and the oxygen flow rate was continuously increased to 1700 sccm over the course of 40 seconds, and high-frequency electrical power was continuously decreased to 1.3 KW.

After applying high-frequency electrical power of 1.3 KW for a total of 500 seconds at a D4H flow rate of 95 sccm and oxygen flow rate of 1700 sccm, D4H flow rate was continuously decreased to 70 sccm and oxygen flow rate to 1250 sccm over the course of 60 seconds while maintaining high-frequency electrical power at 1.3 KW.

After applying high-frequency electrical power of 1.3 KW for 160 seconds at a D4H flow rate of 70 sccm and oxygen flow rate of 1250 sccm, D4H flow rate was continuously decreased to 0 sccm over the course of 30 seconds while maintaining high-frequency electrical power at 1.3 KW followed by discontinuing the application of high-frequency electrical power. Furthermore, the oxygen flow rate was fixed at 1250 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 6.3 μm. In addition, the maximum temperature of the substrate surface on the side laminated with the silicon oxide layer by PE-CVD was about 135° C. throughout the plasma bombardment treatment step and silicon oxide layer lamination step by PE-CVD.

Comparative Example 13

A polymer substrate with hard coating layer was formed in the same manner as Example 8 with the exception of forming the silicon oxide layer obtained by PE-CVD in Example 8 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 95 scorn and the oxygen flow rate was continuously increased to 1700 sccm over the course of 40 seconds, and high-frequency electrical power was continuously decreased to 1.0 KW.

After applying high-frequency electrical power of 1.0 KW for a total of 110 seconds at a D4H flow rate of 95 sccm and oxygen flow rate of 1700 sccm, D4H flow rate was continuously decreased to 70 sccm and oxygen flow rate to 1250 sccm over the course of 60 seconds while maintaining high-frequency electrical power at 1.0 KW.

After applying high-frequency electrical power of 1.0 KW for 160 seconds at a D4H flow rate of 70 sccm and oxygen flow rate of 1250 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 1250 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 2.8 μm. In addition, the maximum temperature of the substrate surface on the side laminated with the silicon oxide layer by PE-CVD was about 90° C. throughout the plasma bombardment treatment step and silicon oxide layer lamination step by PE-CVD.

Comparative Example 14

A polymer substrate with hard coating layer was formed in the same manner as Example 8 with the exception of forming the silicon oxide layer obtained by PE-CVD in Example 8 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 95 sccm and the oxygen flow rate was continuously increased to 1700 sccm over the course of 40 seconds, and high-frequency electrical power was continuously decreased to 1.0 KW.

After applying high-frequency electrical power of 1.0 KW for a total of 900 seconds at a D4H flow rate of 95 sccm and oxygen flow rate of 1700 sccm, D4H flow rate was continuously decreased to 70 sccm and oxygen flow rate to 1250 sccm over the course of 60 seconds while maintaining high-frequency electrical power at 1.0 KW.

After applying high-frequency electrical power of 1.0 KW for 160 seconds at a D4H flow rate of 70 sccm and oxygen flow rate of 1250 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 1250 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 9.6 μm. In addition, the maximum temperature of the substrate surface on the side laminated with the silicon oxide layer by PE-CVD was about 140° C. throughout the plasma bombardment treatment step and silicon oxide layer lamination step by PE-CVD.

Comparative Example 15

A polymer substrate with hard coating layer was formed in the same manner as Example 1 with the exception of forming the silicon oxide layer obtained by PE-CVD in Example 1 according to the procedure described below.

Namely, after applying high-frequency electrical power of 1.5 KW for 30 seconds at a D4H flow rate of 20 sccm and oxygen flow rate of 600 sccm, the flow rate of D4H was continuously increased to 95 sccm and the oxygen flow rate was continuously increased to 1700 sccm over the course of 40 seconds, and high-frequency electrical power was continuously decreased to 1.0 KW.

Here, the average deposition rate from the start of formation of the silicon oxide layer by PE-CVD to 30 seconds after the start of formation was 1.7 nm/sec.

After applying high-frequency electrical power of 1.0 KW for a total of 720 seconds at a D4H flow rate of 95 sccm and oxygen flow rate of 1350 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 1350 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 6.6 μm. In addition, the maximum temperature of the substrate surface on the side laminated with the silicon oxide layer by PE-CVD was about 110° C. throughout the plasma bombardment treatment step and silicon oxide layer lamination step by PE-CVD.

Comparative Example 16

A polymer substrate with hard coating layer was formed in the same manner as Example 4 with the exception of forming the cured underlayer in Example 4 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 95 sccm and the oxygen flow rate was continuously increased to 2700 sccm over the course of 40 seconds, and high-frequency electrical power was continuously decreased to 1.0 KW.

After applying high-frequency electrical power of 1.0 KW for a total of 370 seconds at a D4H flow rate of 95 sccm and oxygen flow rate of 2700 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 2700 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 4.4 μm. In addition, the maximum temperature of the substrate surface on the side laminated with the silicon oxide layer by PE-CVD was about 90° C. throughout the plasma bombardment treatment step and silicon oxide layer lamination step by PE-CVD.

Comparative Example 17

The results of evaluating the performance of the polymer substrate with hard coating layer described in Example 1 of the aforementioned Patent Document 1 and the physical properties of each layer thereof are shown in Table 1.

Furthermore, Patent Document 1 was filed by the present applicant, and the contents of Table 1 were described based on that data.

Comparative Example 18

The results of evaluating the performance of the polymer substrate with hard coating layer described in Example 2 of the aforementioned Patent Document 1 and the physical properties of each layer thereof are shown in Table 1. Furthermore, Patent Document 1 was filed by the present applicant, and the contents of Table 1 were described based on that data.

Comparative Example 19

Two underlayers were formed on a polycarbonate resin (Panlite L1250Z, Teijin Ltd.) injection press-molded sheet (550×550×4 mm) in accordance with the method described in Example 1 of the aforementioned Patent Document 3 followed by laminating a coating composed of silicon, oxygen, carbon and hydrogen atoms by carrying out plasma polymerization in accordance with the subsequently described method to obtain a laminate. The results of evaluating the polymer substrate with hard coating layer and the physical properties of each layer thereof are shown in Table 1.

Furthermore, since plasma bombardment treatment was not carried out in Example 1 of the aforementioned Patent Document 3, the physical properties of the cured underlayer are those prior to carrying out plasma polymerization.

TABLE 1

| | Properties of Cured Underlayer | | | Properties of Silicon Oxide Layer obtained by PE-CVD | | | | | | | |
|---|---|---|---|---|---|---|---|---|---|---|---|
| | | DFM Measurement | Infrared absorbance peak intensity | Film | Initial average | Critical compres- | Nanoindentation measurement | | DFM measurement | Infrared absorbance peak intensity | |
| Param-eter | Degree of aging | Surface roughness (Ra) (nm) | ratio $\alpha_{1065}/\alpha_{1020}$ | thick-ness (μm) | deposition rate (nm/sec) | sion ratio (—) | Max. indentation depth (nm) | Indentation hardness (GPa) | Surface roughness (Ra) (nm) | ratio $\alpha_{930}/\alpha_{1020}$ | $\alpha_{2380}/\alpha_{1020}$ |
| Ex. 1 | 0.832 | 2.6 | 0.83 | 6.6 | 0.8 | 0.974 | 145 | 3.6 | 2.2 | 0.27 | 0.013 |
| Ex. 2 | 0.847 | 4.1 | 0.86 | 6.6 | 0.8 | 0.975 | 147 | 3.4 | 2.4 | 0.28 | 0.013 |
| Ex. 3 | 0.808 | 1.1 | 0.76 | 6.6 | 0.8 | 0.973 | 144 | 3.6 | 2.0 | 0.26 | 0.013 |
| Ex. 4 | 0.815 | 1.4 | 0.81 | 6.6 | 0.8 | 0.973 | 145 | 3.5 | 2.1 | 0.27 | 0.013 |
| Ex. 5 | 0.815 | 0.9 | 0.77 | 6.6 | 0.8 | 0.974 | 145 | 3.6 | 2.1 | 0.27 | 0.013 |
| Ex. 6 | 0.815 | 1.4 | 0.81 | 8.3 | 0.8 | 0.970 | 149 | 3.1 | 3.0 | 0.29 | 0.017 |
| Ex. 7 | 0.815 | 1.4 | 0.81 | 5.5 | 0.8 | 0.975 | 140 | 4.4 | 2.3 | 0.24 | 0.003 |
| Ex. 8 | 0.815 | 1.4 | 0.81 | 6.5 | 0.8 | 0.971 | 137 | 4.8 | 2.1 | 0.23 | 0.006 |
| Ex. 9 | 0.815 | 1.4 | 0.81 | 6.0 | 0.8 | 0.973 | 135 | 5.0 | 2.1 | 0.22 | 0.004 |
| Ex. 10 | 0.815 | 1.4 | 0.81 | 6.6 | 0.8 | 0.970 | 146 | 4.1 | 2.4 | 0.26 | 0.012 |
| Ex. 11 | 0.815 | 1.4 | 0.81 | 4.3 | 0.8 | 0.973 | 134 | 5.1 | 1.9 | 0.22 | 0.004 |
| Ref. Ex. 1 | 0.815 | 3.4 | 0.82 | — | — | — | — | — | — | — | — |
| Comp. Ex. 1 | 0.787 | 0.6 | 0.73 | 6.6 | 0.8 | 0.976 | 145 | 3.6 | 2.0 | 0.27 | 0.013 |
| Comp. Ex. 2 | 0.872 | 29.7 | 0.90 | 6.6 | 0.8 | 0.982 | 146 | 3.4 | 2.2 | 0.27 | 0.013 |
| Comp. Ex. 3 | 0.815 | 0.4 | 0.69 | 6.6 | 0.8 | 0.979 | 143 | 3.7 | 2.0 | 0.27 | 0.013 |
| Comp. Ex. 4 | 0.815 | 0.6 | 0.72 | 6.6 | 0.8 | 0.977 | 144 | 3.5 | 2.1 | 0.27 | 0.013 |
| Comp. Ex. 5 | 0.815 | 1.4 | 0.81 | 5.2 | 0.8 | 0.983 | 120 | 5.7 | 1.7 | 0.20 | 0.000 |
| Comp. Ex. 6 | 0.815 | 1.4 | 0.81 | 5.8 | 0.8 | 0.982 | 122 | 5.5 | 2.0 | 0.21 | 0.000 |
| Comp. Ex. 7 | 0.815 | 1.4 | 0.81 | 5.9 | 0.8 | 0.980 | 126 | 5.3 | 2.6 | 0.22 | 0.000 |
| Comp. Ex. 8 | 0.815 | 1.4 | 0.81 | 5.6 | 0.8 | 0.978 | 130 | 5.1 | 1.9 | 0.24 | 0.001 |
| Comp. Ex. 9 | 0.815 | 1.4 | 0.81 | 6.5 | 0.8 | 0.971 | 168 | 3.2 | 5.0 | 0.32 | 0.008 |
| Comp. Ex. 10 | 0.815 | 1.4 | 0.81 | 6.5 | 0.8 | 0.968 | 184 | 2.6 | 5.9 | 0.31 | 0.023 |
| Comp. Ex. 11 | 0.815 | 1.4 | 0.81 | 6.8 | 0.8 | 0.970 | 177 | 2.9 | 4.2 | 0.30 | 0.022 |
| Comp. Ex. 12 | 0.815 | 1.4 | 0.81 | 6.3 | 0.8 | 0.978 | 132 | 5.4 | 2.0 | 0.21 | 0.000 |
| Comp. Ex. 13 | 0.815 | 1.4 | 0.81 | 2.8 | 0.8 | 0.971 | 143 | 4.1 | 1.9 | 0.24 | 0.007 |
| Comp. Ex. 14 | 0.815 | 1.4 | 0.81 | 9.6 | 0.8 | 0.972 | 135 | 4.9 | 2.5 | 0.23 | 0.006 |
| Comp. Ex. 15 | 0.832 | 1.4 | 0.81 | 6.6 | 1.7 | 0.977 | 147 | 3.2 | 2.5 | 0.28 | 0.015 |
| Comp. Ex. 16 | 0.815 | 1.4 | 0.81 | 4.4 | 0.8 | 0.967 | 185 | 2.5 | 5.4 | 0.31 | 0.024 |
| Comp. Ex. 17 | 0.834 | 0.8 | 0.72 | 5.0 | 1.4 | 0.977 | 149 | 3.1 | 4.3 | 0.29 | 0.018 |

TABLE 1-continued

| | | | | | | | | | | | |
|---|---|---|---|---|---|---|---|---|---|---|---|
| Comp. Ex. 18 | 0.834 | 0.8 | 0.72 | 7.0 | 1.4 | 0.977 | 148 | 3.2 | 4.5 | 0.29 | 0.017 |
| Comp. Ex. 19 | 0.788 | 0.6 | 0.81 | 2.5 | — | 0.979 | 212 | 1.2 | 10.2 | 0.18 | 0.056 |

Performance Evaluation of Hard Coating Resin Laminate
Initial Results (Before each test)

| Parameter | Appearance | Adhesion | Total Light Transmittance (%) | Haze Value (%) |
|---|---|---|---|---|
| Example 1 | A | A (100) | 89.7 | 0.4 |
| Example 2 | A | A (100) | 89.7 | 0.4 |
| Example 3 | A | A (100) | 89.8 | 0.4 |
| Example 4 | A | A (100) | 89.5 | 0.6 |
| Example 5 | A | A (100) | 89.4 | 0.6 |
| Example 6 | A | A (100) | 89.4 | 0.5 |
| Example 7 | A | A (100) | 89.5 | 0.6 |
| Example 8 | A | A (100) | 89.3 | 0.6 |
| Example 9 | A | A (100) | 89.5 | 0.6 |
| Example 10 | A | A (100) | 89.4 | 0.6 |
| Example 11 | A | A (100) | 89.4 | 0.6 |
| Reference Example 1 | D*[1] | — | — | 0.6 |
| Comparative Example 1 | D*[2] | A (100) | 89.8 | — |
| Comparative Example 2 | A | D (80) | 89.8 | 0.4 |
| Comparative Example 3 | A | D (20) | 89.6 | 0.6 |
| Comparative Example 4 | A | A (100) | 89.4 | 0.6 |
| Comparative Example 5 | A | A (100) | 89.4 | 0.5 |
| Comparative Example 6 | A | A (100) | 89.4 | 0.6 |
| Comparative Example 7 | A | A (100) | 89.4 | 0.6 |
| Comparative Example 8 | A | A (100) | 89.5 | 0.5 |
| Comparative Example 9 | A | A (100) | 89.3 | 0.6 |
| Comparative Example 10 | A | A (100) | 89.5 | 0.7 |
| Comparative Example 11 | A | A (100) | 89.4 | 0.6 |
| Comparative Example 12 | A | A (100) | 89.4 | 0.6 |
| Comparative Example 13 | A | A (100) | 89.5 | 0.5 |
| Comparative Example 14 | A | A (100) | 89.3 | 0.7 |
| Comparative Example 15 | A | A (100) | 89.6 | 0.4 |
| Comparative Example 16 | A | A (100) | 89.5 | 0.6 |
| Comparative Example 17 | A | A (100) | 89.7 | 0.4 |
| Comparative Example 18 | A | A (100) | 89.7 | 0.4 |
| Comparative Example 19 | A | A (100) | 88.8 | 0.5 |

Performance Evaluation of Hard Coating Resin Laminate

| | Taber Adhesion Resist. 1 | Taber Adhesion Resist. 2 | Boiling water resistance | | | Water resistance | | | Heat resistance | | |
|---|---|---|---|---|---|---|---|---|---|---|---|
| | Change in haze | Change in haze | | Adhesion change | | | Adhesion change | | | Adhesion change | |
| Parameter | value ΔH (1000r) (%) | value ΔH (1000r) (%) | Change in appearance | Initial result | Elapsed result | Change in appearance | Initial result | Elapsed result | Change in appearance | Initial result | Elapsed result |
| Ex. 1 | A (0.5) | A (0.4) | A | A (100) | A (100) | A | A (100) | A (100) | A | A (100) | A (100) |
| Ex. 2 | A (0.2) | A (0.2) | A | A (100) | A (100) | A | A (100) | A (100) | A | A (100) | A (100) |
| Ex. 3 | A (0.4) | A (0.4) | A | A (100) | A (100) | A | A (100) | A (100) | A | A (100) | A (100) |
| Ex. 4 | A (0.2) | A (0.2) | A | A (100) | A (100) | A | A (100) | A (100) | A | A (100) | A (100) |

TABLE 1-continued

| | | | | | | | | | | | |
|---|---|---|---|---|---|---|---|---|---|---|---|
| Ex. 5 | A (0.4) | A (0.4) | A | A (100) | A (100) | A | A (100) | A (100) | A | A (100) | A (100) |
| Ex. 6 | A (0.3) | A (0.3) | A | A (100) | A (100) | A | A (100) | A (100) | A | A (100) | A (100) |
| Ex. 7 | A (0.5) | A (0.5) | A | A (100) | A (100) | A | A (100) | A (100) | A | A (100) | A (100) |
| Ex. 8 | A (0.3) | A (0.3) | A | A (100) | A (100) | A | A (100) | A (100) | A | A (100) | A (100) |
| Ex. 9 | A (1.1) | A (1.0) | A | A (100) | A (100) | A | A (100) | A (100) | A | A (100) | A (100) |
| Ex. 10 | A (0.2) | A (0.2) | A | A (100) | A (100) | A | A (100) | A (100) | A | A (100) | A (100) |
| Ex. 11 | A (1.8) | A (1.7) | A | A (100) | A (100) | A | A (100) | A (100) | A | A (100) | A (100) |
| Ref. Ex. 1 | — | — | — | — | — | — | — | — | — | — | — |
| Comp. Ex. 1 | — | — | — | A (100) | D (60) | — | A (100) | D (30) | ^ | A (100) | A (100) |
| Comp. Ex. 2 | A (0.9) | A (0.8) | D | D (0) | D (0) | D | D (0) | D (0) | A | D (90) | D (0) |
| Comp. Ex. 3 | A (0.8) | A (0.8) | D | D (0) | D (0) | D | D (0) | D (0) | A | D (50) | D (0) |
| Comp. Ex. 4 | A (0.5) | A (0.5) | A | D (80) | D (0) | C | D (0) | D (0) | A | A (100) | D (50) |
| Comp. Ex. 5 | A (0.7) | A (0.7) | A | D (60) | D (0) | C | D (0) | D (0) | C | D (50) | D (20) |
| Comp. Ex. 6 | A (0.4) | A (0.4) | A | D (60) | D (0) | C | D (0) | D (0) | C | D (60) | D (20) |
| Comp. Ex. 7 | A (0.2) | A (0.2) | A | A (100) | D (0) | C | D (60) | D (0) | C | D (90) | D (50) |
| Comp. Ex. 8 | A (0.5) | A (0.5) | A | D (90) | D (0) | C | D (20) | D (0) | C | D (90) | D (40) |
| Comp. Ex. 9 | A (0.9) | A (0.9) | A | A (100) | A (100) | A | A (100) | A (100) | B | A (100) | A (100) |
| Comp. Ex. 10 | A (1.1) | A (1.0) | A | A (100) | A (100) | A | A (100) | A (100) | B | A (100) | A (100) |
| Comp. Ex. 11 | A (0.8) | A (0.8) | A | A (100) | A (100) | A | A (100) | A (100) | B | A (100) | A (100) |
| Comp. Ex. 12 | A (0.6) | A (0.6) | A | A (100) | D (20) | A | A (100) | D (20) | A | A (100) | A (100) |
| Comp. Ex. 13 | D (2.9) | D (2.7) | A | A (100) | A (100) | A | A (100) | A (100) | A | A (100) | A (100) |
| Comp. Ex. 14 | A (0.2) | A (0.2) | A | D (30) | D (0) | C | D (20) | D (0) | A | A (100) | A (100) |
| Comp. Ex. 15 | A (0.5) | A (0.5) | A | A (100) | D (70) | A | A (100) | D (50) | A | A (100) | A (100) |
| Comp. Ex. 16 | D (3.4) | D (3.3) | A | A (100) | A (100) | A | A (100) | A (100) | B | A (100) | A (100) |
| Comp. Ex. 17 | A (1.8) | A (1.8) | A | A (100) | D (70) | A | A (100) | D (0) | A | A (100) | A (100) |
| Comp. Ex. 18 | A (1.6) | A (1.6) | A | A (100) | D (0) | C | A (100) | D (0) | A | A (100) | A (100) |
| Comp. Ex. 19 | D (2.81) | D (2.7) | A | A (100) | D (0) | A | A (100) | A (100) | A | A (100) | A (100) |

| | Performance Evaluation of Hard Coating Resin Laminate | | | | |
|---|---|---|---|---|---|
| | | Accelerated weather resistance | | | |
| | | Adhesion change | | Color change ΔE | Change in haze value ΔH (%) |
| Parameter | Change in appearance | Initial result | Elapsed result | | | Overall evaluation |
| Ex. 1 | A | A (100) | A (100) | 0.8 | 0.4 | A |
| Ex. 2 | A | A (100) | A (100) | 0.7 | 0.4 | A |
| Ex. 3 | A | A (100) | A (100) | 0.8 | 0.4 | A |
| Ex. 4 | A | A (100) | A (100) | 0.5 | 0.3 | A |
| Ex. 5 | A | A (100) | A (100) | 0.6 | 0.4 | A |
| Ex. 6 | A | A (100) | A (100) | 0.6 | 0.5 | A |
| Ex. 7 | A | A (100) | A (100) | 0.4 | 0.3 | A |
| Ex. 8 | A | A (100) | A (100) | 0.5 | 0.3 | A |
| Ex. 9 | A | A (100) | A (100) | 0.4 | 0.4 | A |
| Ex. 10 | A | A (100) | A (100) | 0.7 | 0.6 | A |
| Ex. 11 | A | A (100) | A (100) | 0.5 | 0.5 | A |
| Ref. Ex. 1 | — | — | — | — | — | D |
| Comp. Ex. 1 | — | A (100) | A (100) | — | — | D |
| Comp. Ex. 2 | D | D (0) | D (0) | — | — | D |
| Comp. Ex. 3 | D | D (0) | D (0) | — | — | D |
| Comp. Ex. 4 | C | D (80) | D (0) | — | — | D |

TABLE 1-continued

| | | | | | | |
|---|---|---|---|---|---|---|
| Comp. Ex. 5 | C | D (40) | D (0) | — | — | D |
| Comp. Ex. 6 | C | D (30) | D (0) | — | — | D |
| Comp. Ex. 7 | C | D (90) | D (0) | — | — | D |
| Comp. Ex. 8 | C | D (70) | D (0) | — | — | D |
| Comp. Ex. 9 | A | A (100) | A (100) | 1.1 | 0.9 | D |
| Comp. Ex. 10 | A | A (100) | A (100) | 1.5 | 1.7 | D |
| Comp. Ex. 11 | A | A (100) | A (100) | 1.3 | 1.4 | D |
| Comp. Ex. 12 | A | D (95) | D (0) | 0.5 | 0.4 | D |
| Comp. Ex. 13 | A | A (100) | A (100) | 0.8 | 0.7 | D |
| Comp. Ex. 14 | C | D (40) | D (0) | — | — | D |
| Comp. Ex. 15 | A | D (95) | D (0) | 0.4 | 0.3 | D |
| Comp. Ex. 16 | A | A (100) | A (100) | 1.6 | 1.9 | D |
| Comp. Ex. 17 | A | A (100) | D (80) | 1.5 | 1.8 | D |
| Comp. Ex. 18 | A | A (100) | D (50) | 1.3 | 1.2 | D |
| Comp. Ex. 19 | D | D (0) | D (0) | — | — | D |

*[1]Substrate heat distortion
*[2]Crack formation in a portion of cured underlayer Changes in appearance were evaluated in Table 1 above by evaluating as "A" in the case of the absence of peeling or cracks, as "B" in the case of the formation of cracks but the absence of peeling, as "C" in the case of the occurrence of partial peeling, and "D" in the case of cracks throughout the surface.

In addition, in evaluations other than changes in appearance in Table 1 above, the cases of acceptable were evaluated as "A" while cases of unacceptable were evaluated as "D".

<Evaluation of Examples and Comparative Examples>

Based on the aforementioned Table 1, preferable results were determined to be obtained when the thickness of the cured underlayer is 0.1 µm to 20 µm, the film thickness of the silicon oxide layer is 3.5 µm to 9.0 µm, the maximum indentation depth of the silicon oxide layer is 150 nm or less and the critical compression ratio K of the silicon oxide layer as determined in a 3-point bending test is 0.975 or less. In contrast, preferable results were not observed if any of these parameters were not satisfied. More specifically, the following findings were obtained based on the results shown in Table 1.

(1) Examples 1 to 4

Examples 1 to 4 employ the same conditions for forming the silicon oxide layer by PE-CVD, satisfy the essential configuration requirements, and demonstrate differences in the degree of aging of the cured underlayer, DFM surface roughness and infrared absorption peak intensity ratio ($\alpha_{1065}/\alpha_{1020}$) (the composition of the cured underlayer was also somewhat different in Example 4), while also demonstrating some differences in critical compression ratio of the silicon oxide layer obtained by PE-CVD. However, since the values for each of these parameters are within the preferable ranges of the present application, favorable results were obtained for Taber abrasion resistance, boiling water performance, water resistance performance and heat resistance performance. In addition, favorable results were also obtained for accelerated weather resistance, and in Example 4 in particular, color difference ($\Delta E$) of the polymer substrate with hard coating layer primarily caused by ultraviolet degradation of the polymer substrate and adhesive layer was relatively inhibited as compared with Examples 1 to 3 as a result of having added an inorganic ultraviolet absorber in the form of titanium oxide to the cured underlayer.

(2) Example 5

Example 5 satisfies the essential configuration requirements, and although Example 5 was produced in the same manner as Example 4 with the exception of having a relatively short plasma bombardment treatment time for the cured underlayer, it differs with respect to DFM surface roughness of the cured underlayer and infrared absorption peak intensity ratio ($\alpha_{1065}/\alpha_{1020}$), while also demonstrating somewhat of a difference in the critical compression ratio of the silicon oxide layer obtained by PE-CVD. However, since the values for each of these parameters are within the preferable ranges of the present application, favorable results were obtained for Taber abrasion resistance, boiling water performance, water resistance performance and heat resistance performance, and favorable results were also obtained for accelerated weather resistance.

(3) Example 6

Although Example 6 satisfies the essential configuration requirements and the film thickness of the silicon oxide layer obtained by PE-CVD is close to the upper limit of the preferable range of the present application, since it satisfies the parameters of the preferable ranges of the present application with respect to the cured underlayer and silicon oxide layer obtained by PE-CVD, favorable results were obtained for Taber abrasion resistance, boiling water performance, water resistance performance and heat resistance performance, and favorable results were also obtained for accelerated weather resistance.

(4) Example 11

Although Example 11 satisfies the essential configuration requirements and the film thickness of the silicon oxide layer obtained by PE-CVD is close to the lower limit of the preferable range of the present application, since it satisfies the parameters of the preferable ranges of the present application with respect to the cured underlayer and silicon oxide layer obtained by PE-CVD, favorable results were obtained for Taber abrasion resistance, boiling water performance, water resistance performance and heat resistance performance, and favorable results were also obtained for accelerated weather resistance.

(5) Examples 7 to 10

Although Examples 7 to 10 satisfy the essential configuration requirements, demonstrate the same composition of the cured underlayer, degree of aging and plasma bombardment treatment conditions, and degree of aging, DFM surface roughness and infrared absorption peak intensity ratio ($\alpha_{1065}/\alpha_{1020}$) are all within the preferable ranges of the present application, production conditions (deposition conditions) of the silicon oxide layer by PE-CVD are different, while the parameters of critical compression ratio, maximum nanoindentation depth, indentation hardness, DFM surface roughness and infrared peak intensity ratios ($\alpha_{930}/\alpha_{1020}$) and ($\alpha_{1280}/\alpha_{1020}$) are also different. However, since the values for each of these parameters are within the preferable ranges of the present application, favorable results were obtained for Taber abrasion resistance, boiling water performance, water resistance performance and heat resistance performance, and favorable results were also obtained for accelerated weather resistance.

(6) Reference Example 1

Although the degree of aging of the cured underlayer, DFM surface roughness and infrared absorption peak intensity ratio ($\alpha_{1065}/\alpha_{1020}$) were within the preferable ranges of the present application, the considerable increase in plasma bombardment treatment time led to a violet temperature rise and heat distortion of the substrate thereby making stable deposition of the silicon oxide layer by PE-CVD difficult. Although decreases in performance of the polymer substrate with hard coating layer attributable to the increase in plasma bombardment treatment time were not observed, from the viewpoint of stable production, this reference example indicated that it is necessary to carry out plasma bombardment treatment within a range that does not lead to heat distortion.

(7) Comparison of Examples 1 to 4 with Comparative Examples 1 and 2

Despite Examples 1 to 4 and Comparative Examples 1 and 2 employing the same plasma bombardment treatment conditions for the cured underlayer and the same conditions for forming the silicon oxide layer by PE-CVD, their boiling water performance, water resistance performance and accelerated weather resistance differ, with favorable results being obtained in Examples 1 to 4 and inadequate results being obtained in Comparative Examples 1 and 2. Here, although critical compression ratio is within the preferable range of the present application in Examples 1 to 4, it is outside that range in Comparative Examples 1 and 2, thereby preventing the essential configuration requirements from being satisfied. In addition, although the degree of aging, DFM surface roughness and infrared absorption peak intensity ratio ($\alpha_{1065}/\alpha_{1020}$) are within the preferable ranges of the present application, they are outside these ranges in Comparative Examples 1 and 2.

(8) Comparison of Example 1 with Comparative Example 15

Despite Example 1 and Comparative Example 15 having the same degree of aging of the cured underlayer, the same plasma bombardment treatment conditions and the same conditions for forming the silicon oxide layer by PE-CVD, their boiling water performance, water resistance performance and accelerated weather resistance differ, with favorable results being obtained in Example 1 and inadequate results being obtained in Comparative Example 15. Here, although critical compression ratio is within the preferable range of the present application in Example 1, it is outside that range in Comparative Example 15, thereby preventing the essential configuration requirements from being satisfied. In addition, although the initial deposition rate of the silicon oxide layer obtained by PE-CVD is within the preferable range of the present application in Example 1, it is outside that range in Comparative Example 15.

(9) Comparison of Examples 4 and 5 with Comparative Examples 3 and 4

Despite Examples 4 and 5 and Comparative Examples 3 and 4 having the same degree of aging of the cured underlayer and employing the same conditions for forming the silicon oxide layer by PE-CVD, their boiling water performance, water resistance performance and accelerated weather resistance differ, with favorable results being obtained in Examples 4 and 5 and inadequate results being obtained in Comparative Examples 3 and 4. Here, although critical compression ratio is within the preferable range of the present application in Examples 4 and 5, it is outside that range in Comparative Examples 3 and 4, thereby preventing the essential configuration requirements from being satisfied. In addition, although DFM surface roughness of the cured underlayer and infrared absorption peak intensity ratio ($\alpha_{1065}/\alpha_{1020}$) are within the preferable ranges of the present application in Examples 4 and 5, they are outside those ranges in Comparative Examples 3 and 4. These differences are attributable to differences in plasma bombardment treatment conditions of the cured underlayer.

(10) Comparison of Example 4 with Comparative Examples 5 to 8 and 12

Despite Example 4 and Comparative Examples 5 to 8 and 12 having the same degree of aging of the cured underlayer, plasma bombardment treatment conditions, DFM surface roughness of the cured underlayer and infrared absorption peak intensity ratios ($\alpha_{1065}/\alpha_{1020}$), their boiling water performance, water resistance performance and accelerated weather resistance differ, with favorable results being obtained for Example 4 and inadequate results being obtained for Comparative Examples 5 to 8 and 12. Here, although the critical compression ratio is within the preferable range of the present application in Example 4, it is outside that range in Comparative Examples 5 to 8 and 12, thereby preventing the essential configuration requirements from being satisfied. In addition, although the infrared absorption peak intensity ratio ($\alpha_{1280}/\alpha_{1020}$) is within the preferable range of the present application in Example 4, it is outside that range in Comparative Examples 5 to 8 and 12. These differences are attributable to differences in deposition conditions of the silicon oxide layer obtained by PE-CVD.

(11) Comparison of Example 4 with Comparative Examples 9 to 11 and 16

Despite Example 4 and Comparative Examples 9 to 11 and 16 having the same degree of aging of the cured underlayer, plasma bombardment treatment conditions, DFM surface roughness of the cured underlayer and infrared absorption peak intensity ratio ($\alpha_{1065}/\alpha_{1020}$), their heat resistance performance differs, with favorable results being obtained for Example 4 and inadequate results being obtained for Comparative Examples 9 to 11 and 16. Here, although critical compression ratio is within the preferable range of the present application in Example 4, it is outside this range in Comparative Examples 9 to 11 and 16, thereby preventing the essential configuration requirements from being satisfied. In addition, although maximum nanoindentation depth is within the preferable range of the present application in Example 4, it is outside this range in Comparative Examples 9 to 11 and 16, thereby preventing the essential configuration requirements from being satisfied. In addition, although indentation hardness of the silicon oxide layer obtained by PE-CVD, DFM hardness and infrared absorption peak intensity ratios ($\alpha_{930}/\alpha_{1280}$) and ($\alpha_{1280}/\alpha_{1020}$) are within the preferable ranges of the present application in Example 4, DFM surface hardness and the infrared absorption peak intensity ratio ($\alpha_{930}/\alpha_{1020}$) are outside the preferable ranges in Comparative Example 9, indentation hardness, DFM surface hardness and infrared absorption peak intensity ratios ($\alpha_{930}/\alpha_{1020}$) and ($\alpha_{1280}/\alpha_{1020}$) are outside the preferable ranges in Comparative Examples 10 and 16, and indentation hardness and infrared absorption peak intensity ratio ($\alpha_{1280}/\alpha_{1020}$) are outside the preferable ranges in Comparative Example 11. Furthermore, these differences are attributable to differences in the deposition conditions of the silicon oxide layer obtained by PE-CVD. Furthermore, although Comparative Examples 9 to 11 demonstrated higher values for color difference ($\Delta E$) and change in haze value ($\Delta H$) in the accelerated weather resistance test in comparison with the examples, these higher values are attributable to differences in gas permeability to oxygen and/or water vapor of the silicon oxide layer obtained by PE-CVD. As an actual example thereof, although the results of measuring water vapor permeability of the polymer substrates with hard coating layer of Examples 7 and 8 (using samples produced to have a thickness of the polymer substrate of 2 mm as required during device measurement) using the Parmatran-W manufactured by Mocon Inc. under conditions of 40° C. and 100% RH yielded values of 0.028 g/(m²·day) and 0.030 g/(m²·day), respectively, the polymer substrates with hard coating layer of Comparative Examples 9, 10 and 11 (using samples produced to have a thickness of the polymer substrate of 2 mm as required during device measurement) yielded values of 0.041 g/(m²·day), 0.053 g/(m²·day) and 0.048 g/(m²·day), respectively. Namely, due to the relatively high gas permeability in Comparative Examples 9 to 11, the progression of photooxidative degradation of the polymer substrate and/or adhesive layer was relatively rapid.

(12) Comparison of Comparative Examples 17 and 18 with Examples 1 and 2 of Patent Document 1

Although Comparative Examples 17 and 18 correspond to Examples 1 and 2 of Patent Document 1, they were somewhat inadequate with respect to boiling water performance, water resistance performance and accelerated weather resistance. Furthermore, although the degree of aging and surface roughness of the cured underlayer of Comparative Examples 17 and 18 are within the preferable ranges of the present application, infrared absorption peak intensity ratio ($\alpha_{1365}/\alpha_{1020}$) and critical compression ratio of the silicon oxide layer obtained by PE-CVD do not satisfy the essential configuration requirements, and initial deposition rate is also outside the preferable range of the present application.

(13) Comparison of Example 11 with Comparative Example 16

Although Example 11 and Comparative Example 16 are nearly the same with respect to the film thickness of the silicon oxide layer obtained by PE-CVD, results for Taber abrasion resistance were favorable for Example 11 and inadequate for Comparative Example 16. This difference is related to the maximum nanoindentation depth and indentation hardness of the silicon oxide layer obtained by PE-CVD, with Example 11 being within the preferable range of the present application and Comparative Example 16 being outside that range, thereby preventing it from satisfying the essential configuration requirements.

(14) Comparison of Comparative Example 13 with Example 8

Although the polymer substrates of Comparative Example 13 and Example 8 were produced under similar conditions, differing from Example 8, the Taber abrasion resistance of Comparative Example 13 was inadequate. This is attributable to the film thickness of the silicon oxide layer obtained by PE-CVD being below the preferable range of the present application, thereby preventing from satisfying the essential configuration requirements.

(15) Comparison of Comparative Example 14 and Example 8

Although the polymer substrates of Comparative Example 14 and Example 8 were produced under similar conditions, differing from Example 8, the boiling water performance, water resistance performance and accelerated weather resistance of Comparative Example 14 were inadequate. This is attributable to the film thickness of the silicon oxide layer obtained by PE-CVD exceeding the preferable range of the present application, thereby preventing from satisfying the essential configuration requirements.

INDUSTRIAL APPLICABILITY

The polymer substrate with hard coating layer of the present invention has superior surface abrasion resistance comparable to that of inorganic glass and is also provided with a high level of environmental resistance enabling it to be used for long periods of time even in harsh usage environments, and can be used in, for example, automobile window materials, construction members and surface protective plates of solar batteries, thereby making it extremely useful.

BRIEF DESCRIPTION OF THE REFERENCE SYMBOLS

1 Vacuum vessel
2 Power supply
3 Matching box
4 Exhaust port
5 Vacuum pump
6A Cooling medium
7 Reaction gas
10 Cathode electrode
14 Shielding component
20 Anode electrode
30,31 Treated substrates
40,41 Gas introducing head
40A,41A Blowout holes
40B,41B Inlets
50 Polymer substrate
60 Adhesive layer
70 Cured underlayer
80 Silicon oxide layer obtained by PE-CVD
81 Cut line (separation starting line)
90 3-point bending tester (side where indentation load applied)

90A,90B End fulcrum points
100 3-point bending tester (side containing fulcrum points)
100A Central fulcrum point
110 Direction of application of indentation load
120 Blade for making cut
130 Bent center

What is claimed is:

1. A polymer substrate with hard coating layer, comprising a polymer substrate having a thickness of 1 mm to 20 mm and a hard coating layer on the surface thereof; wherein, the hard coating layer comprises:
   a cured underlayer laminated on the surface of the polymer substrate, containing as a main component thereof a hydrolysis-condensation product of an organic silicon compound, and having a thickness of 0.1 μm to 20 μm, and
   a silicon oxide layer that makes direct contact with the cured underlayer on the opposite side from the polymer substrate, is formed by PE-CVD using an organic silicon compound as raw material, and satisfies all of the following requirements (a) to (c):
   (a) film thickness of the silicon oxide layer is within the range of 3.5 μm to 9.0 μm,
   (b) maximum indentation depth of the surface of the silicon oxide layer as determined by measuring nanoindentation under conditions of a maximum load of 1 mN is 150 nm or less, and
   (c) the value of critical compression ratio K of the silicon oxide layer, as defined by formula (1) in a 3-point bending test of the polymer substrate with hard coating layer that imparts indentation displacement in which the surface laminated with the silicon oxide layer becomes concave, is 0.975 or less:

$$K=(R-D/2)/R-(0.00215\times d)$$

$$R=((G/2)^2+(\delta L)^2)/(2\times \delta L) \quad \text{Formula (1)}$$

(wherein,
D represents the total thickness (mm) of the polymer substrate with hard coating layer,
d represents the film thickness (μm) of the silicon oxide layer,
G represents the distance (mm) between two end fulcrum points in a 3-point bending tester,
$\delta L$, represents indentation displacement (mm), measured when the silicon oxide layer begins to separate from a cut line (separation starting line) drawn in advance at the location of the central fulcrum point where a weight is applied in a 3-point bending test, and
R represents the bend radius (mm) of the polymer substrate with hard coating layer, measured when the silicon oxide layer begins to separate from a cut line (separation starting line) drawn in advance at the location of the central fulcrum point where a weight is applied in a 3-point bending test).

2. The polymer substrate with hard coating layer according to claim 1, wherein the ratio of infrared absorbance of the silicon oxide layer at a wave number of 930 $cm^{-1}$ to that at a wave number of 1020 $cm^{-1}$ ($\alpha_{930}/\alpha_{1020}$) is 0.30 or less.

3. The polymer substrate with hard coating layer according to claim 2, wherein the ratio of infrared absorbance of the silicon oxide layer at a wave number of 1280 $cm^{-1}$ to that at a wave number of 1020 $cm^{-1}$ ($\alpha_{1280}/\alpha_{1020}$) is within the range of 0.002 to 0.020.

4. The polymer substrate with hard coating layer according to claim 2, wherein indentation hardness of the surface of the silicon oxide layer as determined by measuring nanoindentation under conditions of a maximum load of 1 mN is 3 GPa or more.

5. The polymer substrate with hard coating layer according to claim 2, wherein surface roughness (Ra) of the silicon oxide layer when measured using the dynamic force mode (DFM) of a scanning probe microscope under conditions of observing by 5.0 μm square is 5.0 nm or less.

6. The polymer substrate with hard coating layer according to claim 2, wherein an adhesive layer containing an acrylic resin composition as a main component thereof and having a film thickness of 0.1 μm to 20 μm is interposed between the polymer substrate and the cured underlayer.

7. The polymer substrate with hard coating layer according to claim 1, wherein the ratio of infrared absorbance of the silicon oxide layer at a wave number of 1280 $cm^{-1}$ to that at a wave number of 1020 $cm^{-1}$ ($\alpha_{1280}/\alpha_{1020}$) is within the range of 0.002 to 0.020.

8. The polymer substrate with hard coating layer according to claim 7, wherein indentation hardness of the surface of the silicon oxide layer as determined by measuring nanoindentation under conditions of a maximum load of 1 mN is 3 GPa or more.

9. The polymer substrate with hard coating layer according to claim 7, wherein surface roughness (Ra) of the silicon oxide layer when measured using the dynamic force mode (DFM) of a scanning probe microscope under conditions of observing by 5.0 μm square is 5.0 nm or less.

10. The polymer substrate with hard coating layer according to claim 7, wherein an adhesive layer containing an acrylic resin composition as a main component thereof and having a film thickness of 0.1 μm to 20 μm is interposed between the polymer substrate and the cured underlayer.

11. The polymer substrate with hard coating layer according to claim 1, wherein indentation hardness of the surface of the silicon oxide layer as determined by measuring nanoindentation under conditions of a maximum load of 1 mN is 3 GPa or more.

12. The polymer substrate with hard coating layer according to claim 11, wherein surface roughness (Ra) of the silicon oxide layer when measured using the dynamic force mode (DFM) of a scanning probe microscope under conditions of observing by 5.0 μm square is 5.0 μm or less.

13. The polymer substrate with hard coating layer according to claim 11, wherein an adhesive layer containing an acrylic resin composition as a main component thereof and having a film thickness of 0.1 μm to 20 μm is interposed between the polymer substrate and the cured underlayer.

14. The polymer substrate with hard coating layer according to claim 1, wherein surface roughness (Ra) of the silicon oxide layer when measured using the dynamic force mode (DFM) of a scanning probe microscope under conditions of observing by 5.0 μm square is 5.0 nm or less.

15. The polymer substrate with hard coating layer according to claim 1, wherein an adhesive layer containing an acrylic resin composition as a main component thereof and having a film thickness of 0.1 μm to 20 μm is interposed between the polymer substrate and the cured underlayer.

16. A method for producing the polymer substrate with hard coating layer according to claim 1, comprising: forming the cured underlayer by coating a precursor material composition, in which the degree of aging (Ag) as represented by the following formula has a value within the range of 0.80 to 0.85, on the polymer substrate followed by drying and heat curing:

$$Ag=\{([X]+2\times[Y]+3\times[Z])/[S]\}/3$$

(wherein, with respect to the chemical shifts of silicon atoms of a hydrolysis-condensation product of the organic silicon compound, which is measured when a silicon atom of tetramethylsilane is assigned a value of 0 ppm after measuring the silicon nuclear magnetic resonance spectrum ($^{29}$Si-NMR) using heavy water($D_2O$) for the solvent under conditions consisting of an observation frequency of 79 MHz, observation pulse of 6.0 μs, repetition time of 30 seconds, and broadening factor of 5 Hz, the integration value of all peaks within the range of −45.0 ppm to −70.0 ppm is defined as [S], and, within that peak integration value, the peak integration value within the range of −45.0 ppm to −52.5 ppm is defined as [X], the peak integration value within the range of −52.5 ppm to −61.0 ppm is defined as [Y], and the peak integration value within the range of −61.0 ppm to −70.0 ppm is defined as [Z].

17. A method for producing the polymer substrate with hard coating layer according to claim 1, comprising: adjusting the surface of the cured underlayer so that surface roughness (Ra) in the case of having measured with the dynamic force mode (DFM) of a scanning probe microscope under conditions of observing by 5 μm square is within the range of 0.7 nm to 10.0 nm, prior to laminating the silicon oxide layer by PE-CVD.

18. A method for producing the polymer substrate with hard coating layer according to claim 1, wherein the silicon oxide layer is formed at an average deposition rate (nm/sec) between the start of deposition and 30 seconds thereafter of deposition of 1 nm/sec or less.

19. A method for producing the polymer substrate with hard coating layer according to claim 1, comprising: adjusting the surface of the cured underlayer so that the ratio of infrared absorbance at a wave number 1065 cm$^{-1}$ to that at a wave number of 1020 cm$^{-1}$ ($\alpha_{1065}/\alpha_{1020}$) is within the range of 0.75 to 0.87, prior to laminating the silicon oxide layer by PE-CVD.

20. The method for producing a polymer substrate with hard coating layer according to claim 19, wherein adjustment of the surface of the cured underlayer is carried out by plasma excitation or by colliding ionized inert gas with the surface of the cured underlayer.

* * * * *